(12) United States Patent
Rajashekhar et al.

(10) Patent No.: US 12,035,535 B2
(45) Date of Patent: Jul. 9, 2024

(54) THREE-DIMENSIONAL NOR ARRAY INCLUDING VERTICAL WORD LINES AND DISCRETE MEMORY ELEMENTS AND METHODS OF MANUFACTURE

(71) Applicant: SANDISK TECHNOLOGIES LLC, Addison, TX (US)

(72) Inventors: Adarsh Rajashekhar, Santa Clara, CA (US); Raghuveer S. Makala, Campbell, CA (US); Rahul Sharangpani, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 659 days.

(21) Appl. No.: 17/237,447

(22) Filed: Apr. 22, 2021

(65) Prior Publication Data
US 2021/0242241 A1    Aug. 5, 2021

Related U.S. Application Data

(63) Continuation-in-part of application No. 16/728,825, filed on Dec. 27, 2019, now Pat. No. 11,114,534.

(51) Int. Cl.
*H10B 51/20*    (2023.01)
*H01L 29/76*    (2006.01)
(Continued)

(52) U.S. Cl.
CPC ......... *H10B 51/20* (2023.02); *H01L 29/7606* (2013.01); *H10B 41/27* (2023.02);
(Continued)

(58) Field of Classification Search
None
See application file for complete search history.

(56) References Cited

U.S. PATENT DOCUMENTS

| | | | |
|---|---|---|---|
| 5,915,167 A | 6/1999 | Leedy | |
| 8,349,681 B2 | 1/2013 | Alsmeier et al. | |
| (Continued) | | | |

FOREIGN PATENT DOCUMENTS

| | | |
|---|---|---|
| JP | 0883913 A | 3/1996 |
| KR | 20150144818 A | 12/2015 |
| (Continued) | | |

OTHER PUBLICATIONS

Endoh, T. et al., "Novel Ultra High Density Memory with a Stacked-Surrounding Gate Transistor (S-SGT) Structured Cell," IEDM Proc. (2001) 33-36.
(Continued)

*Primary Examiner* — Sarah K Salerno
(74) *Attorney, Agent, or Firm* — THE MARBURY LAW GROUP PLLC

(57) ABSTRACT

A three-dimensional memory device includes an alternating stack of source layers and drain layers located over a substrate, a memory opening vertically extending through the alternating stack, a vertical word line located in the memory opening and vertically extending through each of the source layers and the drain layers of the alternating stack, discrete semiconductor channels contacting horizontal surfaces of a respective vertically neighboring pair of a source layer of the source layers and a drain layer of the drain layers, and a vertical stack of discrete memory material portions laterally surrounding the vertical word line.

6 Claims, 77 Drawing Sheets

(51) Int. Cl.
  H10B 41/27     (2023.01)
  H10B 43/27     (2023.01)
  *H01L 29/16*       (2006.01)
  *H01L 29/161*      (2006.01)
  *H01L 29/20*       (2006.01)
  *H01L 29/24*       (2006.01)

(52) U.S. Cl.
  CPC .............. *H10B 43/27* (2023.02); *H01L 29/16* (2013.01); *H01L 29/1606* (2013.01); *H01L 29/161* (2013.01); *H01L 29/2003* (2013.01); *H01L 29/24* (2013.01)

(56) References Cited

U.S. PATENT DOCUMENTS

| | | |
|---|---|---|
| 8,658,499 B2 | 2/2014 | Makala et al. |
| 8,847,302 B2 | 9/2014 | Alsmeier et al. |
| 9,252,151 B2 | 2/2016 | Chien et al. |
| 9,356,031 B2 | 5/2016 | Lee et al. |
| 9,397,093 B2 | 7/2016 | Makala et al. |
| 9,419,012 B1 | 8/2016 | Shimabukuro et al. |
| 9,449,982 B2 | 9/2016 | Lu et al. |
| 9,576,975 B2 | 2/2017 | Zhang et al. |
| 9,627,399 B2 | 4/2017 | Kanakamedala et al. |
| 9,646,975 B2 | 5/2017 | Peri et al. |
| 9,691,884 B2 | 6/2017 | Makala et al. |
| 9,842,907 B2 | 12/2017 | Makala et al. |
| 9,875,929 B1 | 1/2018 | Shukla et al. |
| 9,941,299 B1 | 4/2018 | Chen et al. |
| 9,960,180 B1 | 5/2018 | Zhou et al. |
| 9,991,277 B1 | 6/2018 | Tsutsumi et al. |
| 10,115,732 B2 | 10/2018 | Yu et al. |
| 10,192,784 B1 | 1/2019 | Cui et al. |
| 10,256,247 B1 | 4/2019 | Kanakamedala et al. |
| 10,276,583 B2 | 4/2019 | Sharangpani et al. |
| 10,290,648 B1 | 5/2019 | Zhou et al. |
| 10,319,680 B1 | 6/2019 | Sel et al. |
| 10,381,366 B1 | 8/2019 | Takahashi et al. |
| 10,700,090 B1 | 6/2020 | Cui et al. |
| 10,700,093 B1 | 6/2020 | Kalitsov et al. |
| 10,811,431 B1 | 10/2020 | Makala et al. |
| 10,833,101 B2 | 11/2020 | Shimomura et al. |
| 10,868,042 B1 | 12/2020 | Zhang et al. |
| 10,879,269 B1 | 12/2020 | Zhang et al. |
| 10,916,287 B2 | 2/2021 | Zhang et al. |
| 10,923,502 B2 | 2/2021 | Sato |
| 10,937,809 B1 | 3/2021 | Sharangpani et al. |
| 10,957,711 B2 | 3/2021 | Prasad et al. |
| 10,978,482 B2 | 4/2021 | Alsmeier et al. |
| 2007/0029607 A1 | 2/2007 | Kouznetzov |
| 2013/0292630 A1 | 11/2013 | Sasago et al. |
| 2015/0117090 A1 | 4/2015 | Kim et al. |
| 2015/0294978 A1 | 10/2015 | Lu et al. |
| 2017/0025431 A1 | 1/2017 | Kanakamedala et al. |
| 2017/0062523 A1 | 3/2017 | Sekino et al. |
| 2017/0098660 A1 | 4/2017 | Ramaswamy et al. |
| 2017/0243879 A1 | 8/2017 | Yu et al. |
| 2018/0033646 A1 | 2/2018 | Sharangpani et al. |
| 2018/0151588 A1 | 5/2018 | Tsutsumi et al. |
| 2019/0067327 A1 | 2/2019 | Herner et al. |
| 2019/0067375 A1 | 2/2019 | Karda et al. |
| 2019/0252405 A1 | 8/2019 | Tsutsumi et al. |
| 2019/0259772 A1 | 8/2019 | Takahashi et al. |
| 2019/0288192 A1 | 9/2019 | Takahashi et al. |
| 2019/0333930 A1 | 10/2019 | Boruhkov |
| 2020/0006375 A1 | 1/2020 | Zhou et al. |
| 2021/0050359 A1 | 2/2021 | Kai et al. |
| 2021/0050360 A1 | 2/2021 | Kai et al. |

FOREIGN PATENT DOCUMENTS

| | | |
|---|---|---|
| KR | 20180030967 A | 3/2018 |
| KR | 20190135540 A | 12/2019 |

OTHER PUBLICATIONS

Fichtner, S. et al., "AlScN: A III-V semiconductor based ferroelectric," J. Appl. Phys., vol. 125, 114103 (2019); https://doi.org/10.1063/1.5084945.

Mo, F. et al., "Reliability characteristics of metal/ferroelectric-HfO2/IGZO/metal capacitor for non-volatile memory application," Applied Physics Express 13, 074005 (2020), https://doi.org/10.35848/1882-0786/ab9a92.

Mulaosmanovic, H. et al., "Evidence of single domain switching in hafnium oxide based FeFETs: Enabler for multi-level FeFET memory cells," *2015 IEEE International Electron Devices Meeting (IEDM)*, 2015, pp. 26.8.1-26.8.3, doi: 10.1109/IEDM.2015.7409777.

Sharma, A.A. et al., "High Speed Memory Operation in Channel-Last, Back-gated Ferroelectric Transistors," *2020 IEEE International Electron Devices Meeting (IEDM)*, 2020, pp. 18.5.1-18.5.4, doi: 10.1109/IEDM13553.2020.9371940.

U.S. Appl. No. 16/412,764, filed May 15, 2019, SanDisk Technologies LLC.

U.S. Appl. No. 16/530,256, filed Aug. 2, 2019, SanDisk Technologies LLC.

U.S. Appl. No. 16/539,103, filed Aug. 13, 2019, SanDisk Technologies LLC.

U.S. Appl. No. 16/539,124, filed Aug. 13, 2019, SanDisk Technologies LLC.

U.S. Appl. No. 16/568,668, filed Sep. 12, 2019, SanDisk Technologies LLC.

U.S. Appl. No. 16/577,176, filed Sep. 20, 2019, SanDisk Technologies LLC.

U.S. Appl. No. 16/582,262, filed Sep. 25, 2019, SanDisk Technologies LLC.

U.S. Appl. No. 16/694,340, filed Nov. 25, 2019, SanDisk Technologies LLC.

U.S. Appl. No. 16/728,825, filed Dec. 27, 2019, SanDisk Technologies LLC.

U.S. Appl. No. 16/798,643, filed Feb. 24, 2020, SanDisk Technologies LLC.

U.S. Appl. No. 16/798,686, filed Feb. 24, 2020, SanDisk Technologies LLC.

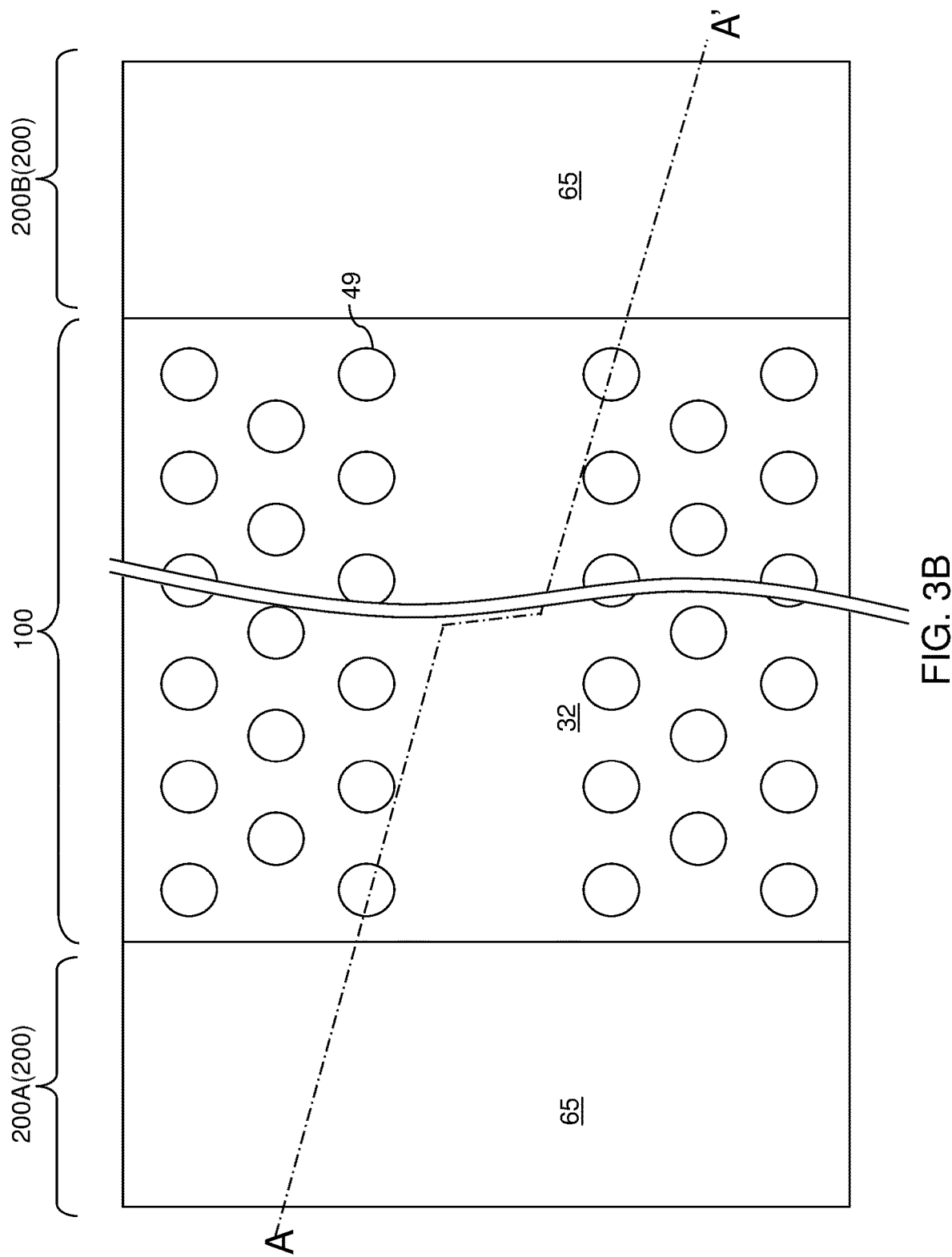

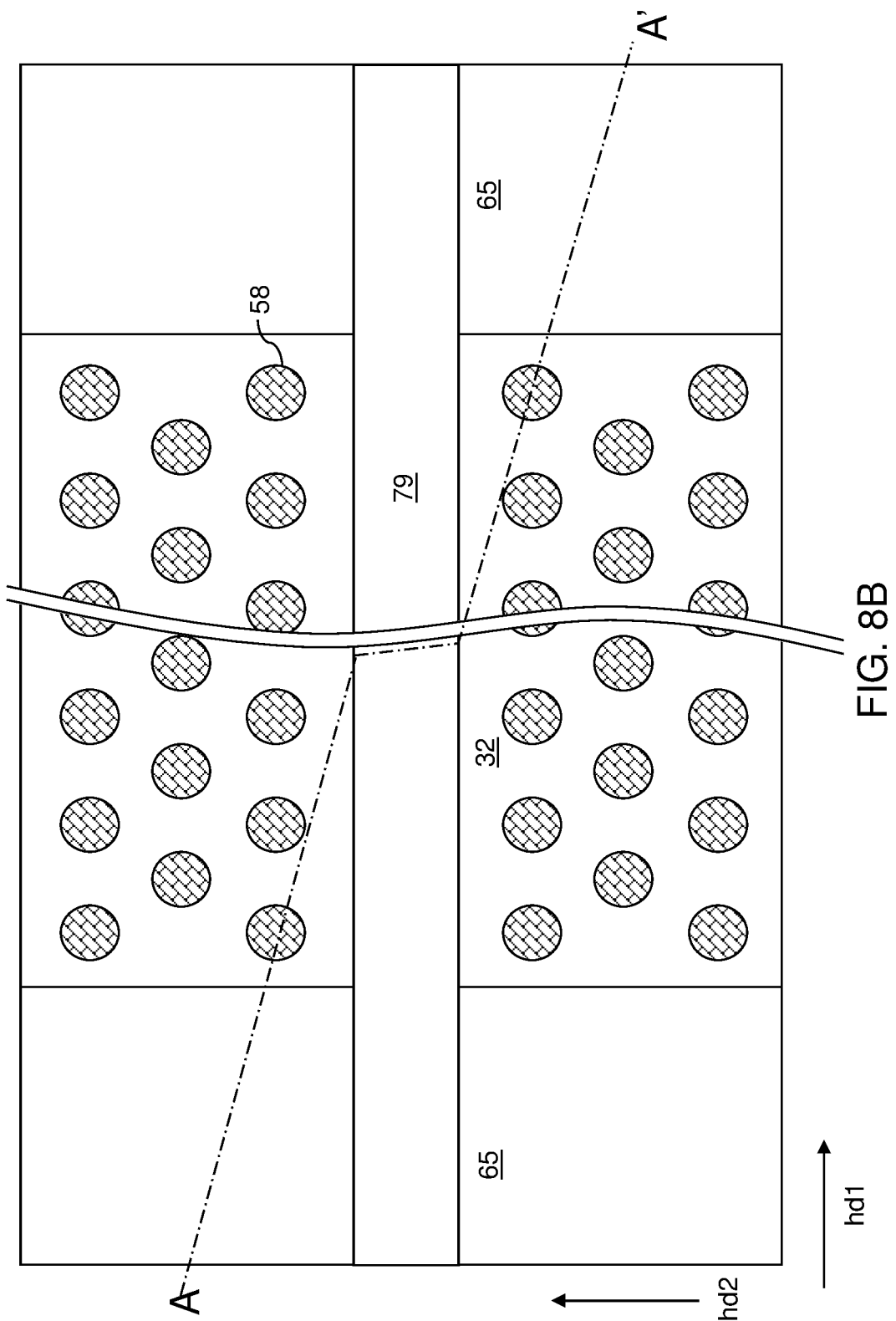

THREE-DIMENSIONAL NOR ARRAY INCLUDING VERTICAL WORD LINES AND DISCRETE MEMORY ELEMENTS AND METHODS OF MANUFACTURE

FIELD

The present disclosure relates generally to the field of semiconductor devices, and particularly to a three-dimensional memory device containing a NOR array containing vertical word lines and ferroelectric memory elements and methods of manufacturing the same.

BACKGROUND

A NOR memory device includes memory cells that are connected in parallel. The memory cells are connected directly to a source and drain without going through adjacent memory cells for a source and/or drain connection. Thus, the NOR memory cells may be accessed directly without going through adjacent memory cells. Thus, a NOR memory device may provide a faster access speed compared to a NAND memory device, and may be used in a storage class memory (SCM) device.

SUMMARY

According to an aspect of the present disclosure, a three-dimensional memory device includes an alternating stack of source layers and drain layers located over a substrate, a memory opening vertically extending through the alternating stack, a vertical word line located in the memory opening and vertically extending through each of the source layers and the drain layers of the alternating stack, discrete semiconductor channels contacting horizontal surfaces of a respective vertically neighboring pair of a source layer of the source layers and a drain layer of the drain layers, and a vertical stack of discrete memory material portions laterally surrounding the vertical word line.

According to another aspect of the present disclosure, a method of forming a three-dimensional memory device is provided, which comprises: forming a vertical repetition of unit layer stacks over a substrate, wherein each of the unit layer stacks comprises a source-level material layer, a sacrificial channel-level spacer layer, a drain-level material layer, and an inter-transistor-level insulating layer, wherein the source-level material layers are formed as, or are subsequently replaced with, source layers comprising at least one source-side conductive material, and the drain-level material layers are formed as, or are subsequently replaced with, drain layers comprising at least one drain-side conductive material; forming memory openings vertically extending through the vertical repetition; forming a vertical stack of annular recess cavities around each of the memory openings by laterally recessing the sacrificial channel-level spacer layers relative to the source-level material layers, the drain-level material layers, and the inter-transistor-level insulating layers; forming at least one semiconductor oxide spacer over the source-level material layers and the drain-level material layers; forming a vertical stack of memory material portions in the vertical stacks of annular recess cavities; forming a vertical word line in each of the memory openings; forming a backside trench through the vertical repetition; and replacing each of the sacrificial channel-level spacer layers with a respective semiconductor channel layer through the backside trench.

According to an aspect of the present disclosure, a three-dimensional memory device includes an alternating stack of source layers and drain layers located over a substrate, memory openings vertically extending through the alternating stack, vertical word lines located in each one of the memory openings and vertically extending through each of the source layers and the drain layers of the alternating stack, vertical stacks of discrete semiconductor channels located in each one of the memory openings and contacting horizontal surfaces of a respective vertically neighboring pair of a source layer of the source layers and a drain layer of the drain layers, and vertical stacks of discrete memory material portions located in each one of the memory openings and laterally surrounding a respective one of the vertical word lines. Each memory material portion is laterally spaced from a respective one of the semiconductor channels by a respective gate dielectric layer.

According to another aspect of the present disclosure, a method of forming a three-dimensional memory device comprises forming a vertical repetition of a unit layer stack that comprises a doped semiconductor source layer, a channel-level spacer layer, a doped semiconductor drain layer, and an inter-transistor-level insulating layer over a substrate; forming memory openings vertically extending through the vertical repetition; forming a vertical stack of channel cavities around each of the memory openings by laterally recessing the channel-level spacer layers relative to the doped semiconductor source layers, the doped semiconductor drain layers, and the inter-transistor-level insulating layers; forming semiconductor oxide spacers by oxidizing surface portions of at least the doped semiconductor source layers and the doped semiconductor drain layers; forming a semiconductor channel and a memory material portion within each of the channel cavities; and forming a vertical word line in each of the memory openings.

BRIEF DESCRIPTION OF THE DRAWINGS

FIG. 3B is a top-down view of the first exemplary structure of FIG. 3A. The vertical plane A-A' is the plane of the cross-section for FIG. 3A.

FIG. 8B is a top-down view of the first exemplary structure of FIG. 8A. The vertical plane A-A' is the plane of the cross-section for FIG. 8A.

DETAILED DESCRIPTION

Figure 1:
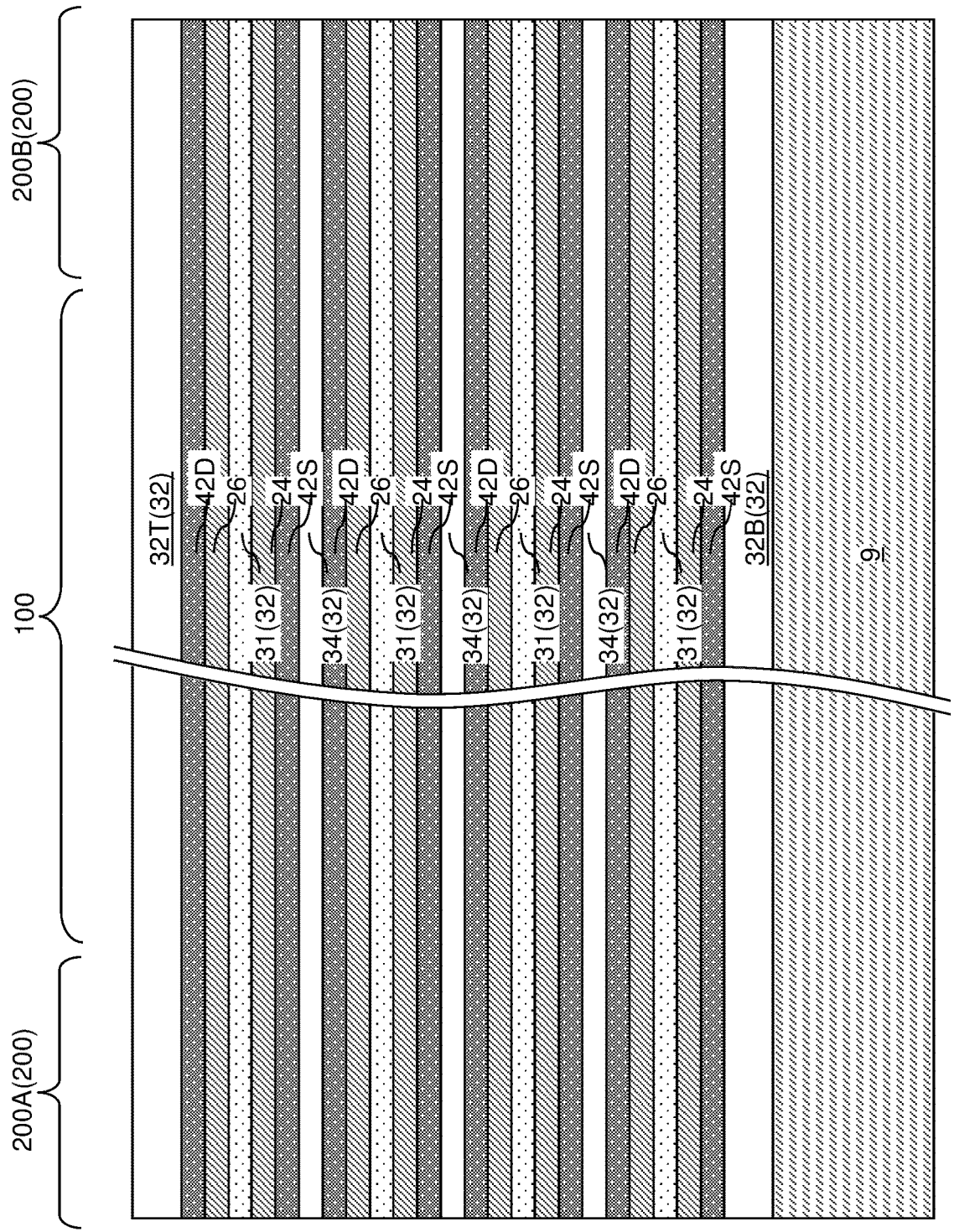
FIG. 1 is a schematic vertical cross-sectional view of a first exemplary structure after formation of a vertical repetition of a unit layer stack including a source sacrificial material layer, a doped semiconductor source layer, a channel-level spacer layer, a doped semiconductor drain layer, a drain sacrificial material layer, and an inter-transistor-level insulating layer over a substrate according to a first embodiment of the present disclosure.

As discussed above, the embodiments of the present disclosure are directed to a three-dimensional memory device containing a NOR array containing vertical word lines and discrete channels and memory material portions, and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element or the possibility of multiple elements irrespective of whether the elements are separated by the term "and" or by the term "or".

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or of one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be formed by forming a bottommost insulating layer 32B over a substrate 9, and by forming multiple instances of a unit layer stack including a source sacrificial material layer 42S, a doped semiconductor source layer 24, a channel-level spacer layer 31, a doped semiconductor drain layer 26, a drain sacrificial material layer 42D, and an inter-transistor-level insulating layer 34 (which is also referred to as a second insulating layer) over the bottommost insulating layer 32B. The source sacrificial material layer 42S can contact a surface of the doped semiconductor source layer 24, and can be vertically spaced from the channel-level spacer layer 31 within each unit layer stack. The drain sacrificial material layer 42D can contact the doped semiconductor drain layer 26, and can be vertically spaced from the channel-level spacer layer 31.

As used herein, a "unit layer stack" refers to a layer stack of multiple layers that functions as a unit of repetition within a structure in which multiple instances of the layer stack is repeated. A topmost insulating layer 32T may be formed in lieu of the inter-transistor-level insulating layer 34 for the topmost instance of the unit layer stack (42S, 24, 31, 26, 42D, 34). The total number of repetitions of the unit layer stack (42S, 24, 31, 26, 42D, 34) can be the same as the total number of levels of vertical field effect transistors to be subsequently formed, which can be the same as the total number of levels of memory elements to be subsequently formed. As used herein, a "level" refers to a volume of a device located between a horizontal plane including a top surface of an element of the device and a horizontal plane including a bottom surface of the element of the device.

Therefore, a channel-level spacer layer 31 is an insulating layer 32 that is formed between a horizontal plane including a top surface of a semiconductor channel to be subsequently formed and a horizontal plane including a bottom surface of the semiconductor channel is to be subsequently formed. An inter-transistor-level insulating layer 34 is an insulating layer 32 that is formed between a horizontal plane including a top surface of an inter-transistor gap to be subsequently formed and a horizontal plane including a bottom surface of the inter-transistor gap is to be subsequently formed. The number of repetitions of the unit layer stack in the multiple instances of the unit layer stack may be in a range from 2 to 1,024, such as from 8 to 128, although lesser and greater numbers of repetitions can also be employed.

While the present disclosure is described employing an embodiment in which the unit layer stack includes a layer stack in which the source sacrificial material layer 42S, the doped semiconductor source layer 24, the channel-level spacer layer 31, the doped semiconductor drain layer 26, the drain sacrificial material layer 42D, and the inter-transistor-level insulating layer 34 are arranged from bottom to top, an embodiment is expressly contemplated herein in which the layer stack is arranged from top to bottom in reverse order from that shown in FIG. 1. Generally, the positions of source elements (42S, 24) can be exchanged with the positions of the drain elements (42D, 26) because source regions and drain regions can be symmetric in field effect transistors.

In one embodiment, the inter-transistor-level insulating layers 34, the channel-level spacer layers 31, the bottommost insulating layer 32B, and the topmost insulating layers 32T are collectively referred to as insulating layers 32, in case layers 31 and/or 34 comprise insulating materials. Each of the insulating layers 32 includes a respective insulating material such as a doped silicate glass, undoped silicate glass (e.g., silicon oxide), a metal oxide (e.g., aluminum oxide) or organosilicate glass. The thickness of each channel-level spacer layer 31 can be in a range from 20 nm to 80 nm, and the thickness of each inter-transistor-level insulating layers 34 can be in a range from 10 nm to 60 nm, although lesser and greater thicknesses can also be employed.

According to an embodiment of the present disclosure, the channel-level spacer layers 31 include a first insulating material and the inter-transistor-level insulating layers 34 include a different second insulating material that can provide a lower etch rate in an isotropic etch process than the first insulating material. For example, the channel-level spacer layers 31 can include borosilicate glass or porous or non-porous organosilicate glass, and the inter-transistor-level insulating layers 34 can include undoped silicate glass (i.e., silicon oxide). In this case, the etch rate of the material of the channel-level spacer layers 31 in 100:1 diluted hydrofluoric acid can be at least 10 times, such as 100 or more times, greater than the etch rate of the material of the inter-transistor-level insulating layers 34 in 100:1 diluted hydrofluoric acid. In another embodiment, the inter-transistor-level insulating layers 34 can comprise a semiconductor oxide material (such as undoped silicate glass formed by decomposition of tetraethylorthosilicate) and the channel-level spacer layers 31 can comprise a metal oxide (such as aluminum oxide) which has a higher etch rate in an aluminum oxide selective etchant than silicon oxide.

The doped semiconductor source layers 24 and the doped semiconductor drain layers 26 include a doped semiconductor material such as doped polysilicon or doped amorphous silicon that can be subsequently annealed to form doped polysilicon. The conductivity type of the doped semiconductor source layers 24 and the doped semiconductor drain layers 26 is herein referred to as a first conductivity type, which can be p-type or n-type.

As used herein, a "semiconducting material" refers to a material having electrical conductivity in the range from $1.0 \times 10^5$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^5$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The atomic concentration of dopants of the first conductivity type in the doped semiconductor source layers 24 and the doped semiconductor drain layers 26 can be in a range from $5.0 \times 10^{19}/cm^3$ to $2.0 \times 10^{21}/cm^3$, although lesser and greater atomic concentrations can also be employed. The thickness of each doped semiconductor source layer 24 can be in a range from 5 nm to 50 nm, such as from 10 nm to 30 nm, and the thickness of each and the thickness of each doped semiconductor drain layer 26 can be in a range from 5 nm to 50 nm, such as from 10 nm to 30 nm, although lesser and greater thicknesses can also be employed.

The source sacrificial material layers 42S and the drain sacrificial material layers 42D include a material that can be removed selective to the materials of the insulating layers 32, the doped semiconductor source layers 24, and the doped semiconductor drain layers 26. For example, if the insulating layers 32 include a doped silicate glass, undoped silicate glass, or organosilicate glass, then the source sacrificial material layers 42S and the drain sacrificial material layers 42D can include silicon nitride, undoped amorphous silicon, or a silicon-germanium alloy. The thickness of each source sacrificial material layer 42S can be in a range from 10 nm to 50 nm, such as from 20 nm to 30 nm, and the thickness of each and the thickness of each drain sacrificial material layer 42D can be in a range from 10 nm to 50 nm, such as from 20 nm to 30 nm, although lesser and greater thicknesses can also be employed.

The multiple instances of the unit layer stack can include a first alternating stack of doped semiconductor source layers 24 and doped semiconductor drain layers 26 that are interlaced with a second alternating stack of a channel-level spacer layer 31 and an inter-transistor-level insulating layer 34. Each contiguous combination of a doped semiconductor source layer 24 and a metallic source layer that subsequently replaces a source sacrificial material layer 42S constitutes a source layer that functions as a source region for a respective two-dimensional array of vertical field effect transistors, and each contiguous combination of a doped semiconductor drain layer 26 and a metallic drain layer that subsequently replaces a drain sacrificial material layer 42D constitutes a drain layer that functions as a drain region for a respective two-dimensional array of vertical field effect transistors.

Insulating layers (31, 34) are formed between each vertically neighboring pair of a respective doped semiconductor source layer 24 of the doped semiconductor source layers 24 and a respective doped semiconductor drain layer 26 of the doped semiconductor drain layers 26. The channel-level spacer layers 31 are formed between a respective vertically neighboring pair of a doped semiconductor source layer 24 and a doped semiconductor drain layer 26.

In one embodiment, each of the source-level sacrificial material layers 42S is formed underneath a respective one of the doped semiconductor source layers 24, and each of drain-level sacrificial material layers 42D is formed over a respective one of the doped semiconductor drain layers 26. The first exemplary structure can include at least one memory array region 100 in which a three-dimensional array of memory elements is to be subsequently formed, and staircase regions (200A, 200B) in which stepped surfaces of the multiple instances of the unit layer stack (42S, 24, 31, 26, 42D, 34) are to be subsequently formed. The staircase regions may include a source side staircase region 200A and a drain side staircase region 200B.

Figure 2:
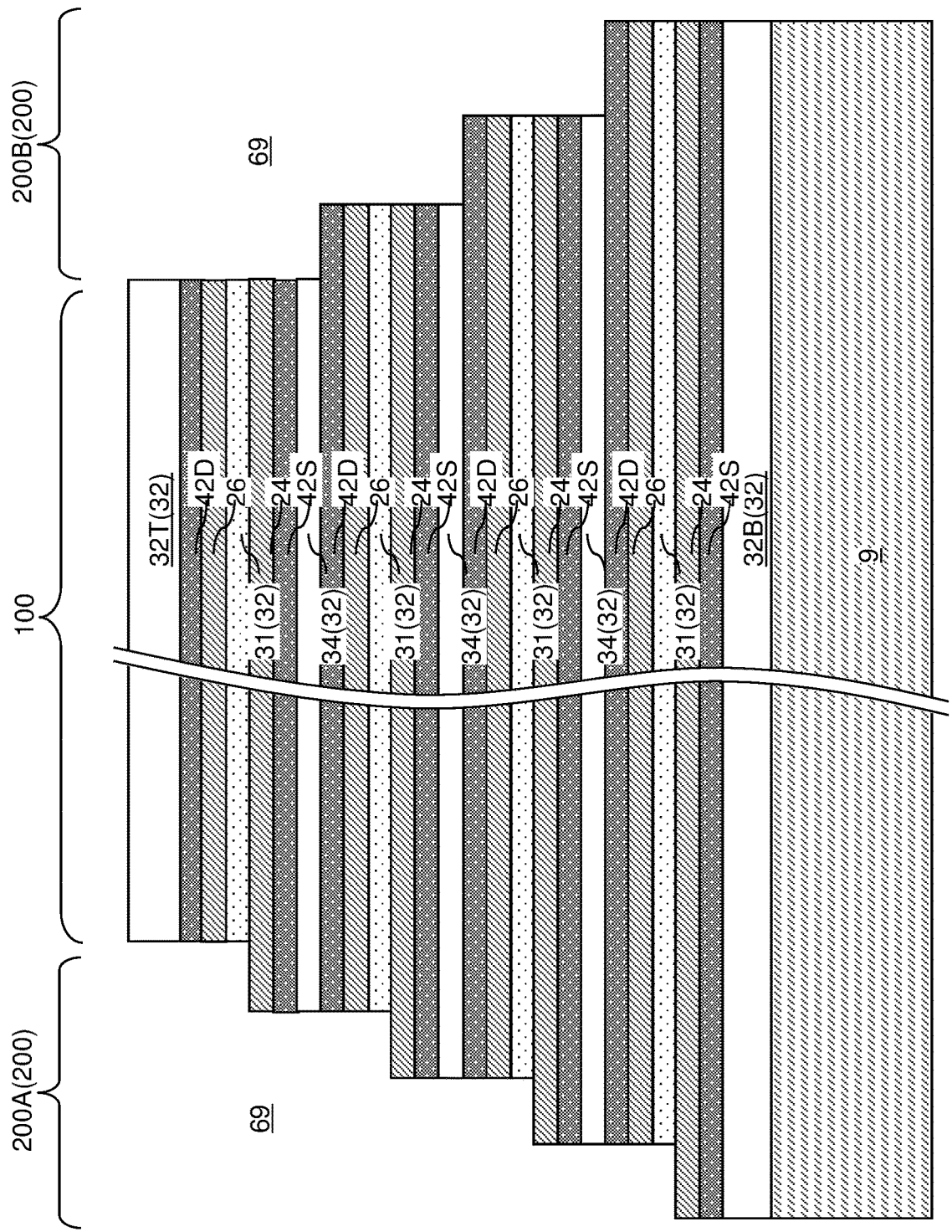
FIG. 2 is a schematic vertical cross-sectional view of the first exemplary structure after formation of stepped surfaces according to the first embodiment of the present disclosure.

Referring to FIG. 2, the multiple instances of the unit layer stack (42S, 24, 31, 26, 42D, 34) can be patterned for form stepped surfaces in the staircase regions (200A, 200B). For example, a trimmable mask layer (not shown) can be formed over the first exemplary structure, and can be patterned to cover each memory array region 100 and proximal portions of the staircase regions (200A, 200B) such that the edges of the trimmable mask layer are formed at location at which outermost vertical steps of stepped surfaces are to be subsequently formed. An anisotropic etch process can be performed to etch through one unit layer stack (42S, 24, 31, 26, 42D, 34) within areas that are not covered by the trimmable mask layer. The trimmable mask layer can be isotropically trimmed so that edges of the trimmable mask layer are formed at which second outermost vertical steps of the stepped surfaces are to be subsequently formed. An anisotropic etch process can be performed to etch through one unit layer stack (42S, 24, 31, 26, 42D, 34) within areas that are not covered by the trimmable mask layer. The isotropic trimming process for the trimmable mask layer and the anisotropic etch process can be repeatedly performed to form stepped surfaces within each of the staircase regions (200A, 200B).

In one embodiment, stepped surfaces in a pair of staircase regions (200A, 200B) located on each side of a memory array region 100 can be vertically offset such that one type of surfaces are physically exposed in one of the staircase regions (200A, 200B) and another type of surfaces are physically exposed in another of the staircase regions (200A, 200B). For example, horizontal surfaces of doped semiconductor source layers 24 can be physically exposed in the source side staircase region 200A adjacent to one side of the memory array region 100, and horizontal surfaces of drain-level sacrificial material layers 42D can be physically exposed in the drain side staircase region 200B adjacent to the opposite side of the memory array region 100. The vertical offset between the horizontal steps in each pair of staircase regions (200A, 200B) located on opposite sides of the same memory array region 100 can be the same as the thickness of one half of the unit layer stack (42S, 24, 31, 26, 42D, 34), such as the sum of the thickness of a source sacrificial material layer 42S, the thickness of a doped semiconductor source layer 24, and the thickness of a channel-level spacer layer 31, or the sum of the thickness of a doped semiconductor drain layer 26, the thickness of a drain sacrificial material layer 42D, and the thickness of an inter-transistor-level insulating layer 34. In this case, an etch mask layer (not shown) such as a patterned photoresist layer can cover the memory array region 100 and one of the staircase regions (e.g., 200A), and vertically recess the other staircase region (e.g., 200B) by the thickness of one half of the unit layer stack (42S, 24, 31, 26, 42D, 34).

Stepped cavities 69 having stepped bottom surfaces can be formed in the staircase regions (200A, 200B). The lateral extent of each type of layer within the multiple instances of the unit layer stack (42S, 24, 31, 26, 42D, 34) can decrease with a vertical distance from the substrate 9 upon patterning the stepped surfaces on the multiple instances of the unit layer stack (42S, 24, 31, 26, 42D, 34). As a consequence, the doped semiconductor source layers 24 in the alternating stack of doped semiconductor source layers 24 and the doped semiconductor drain layers 26 have different lateral extents that decrease with a vertical distance from the substrate 9. Likewise, the doped semiconductor drain layers 26 in the alternating stack of doped semiconductor source layers 24 and the doped semiconductor drain layers 26 have different lateral extents that decrease with a vertical distance from the substrate 9. The trimmable mask layer can be removed after forming the topmost vertical steps.

Figure 3A:
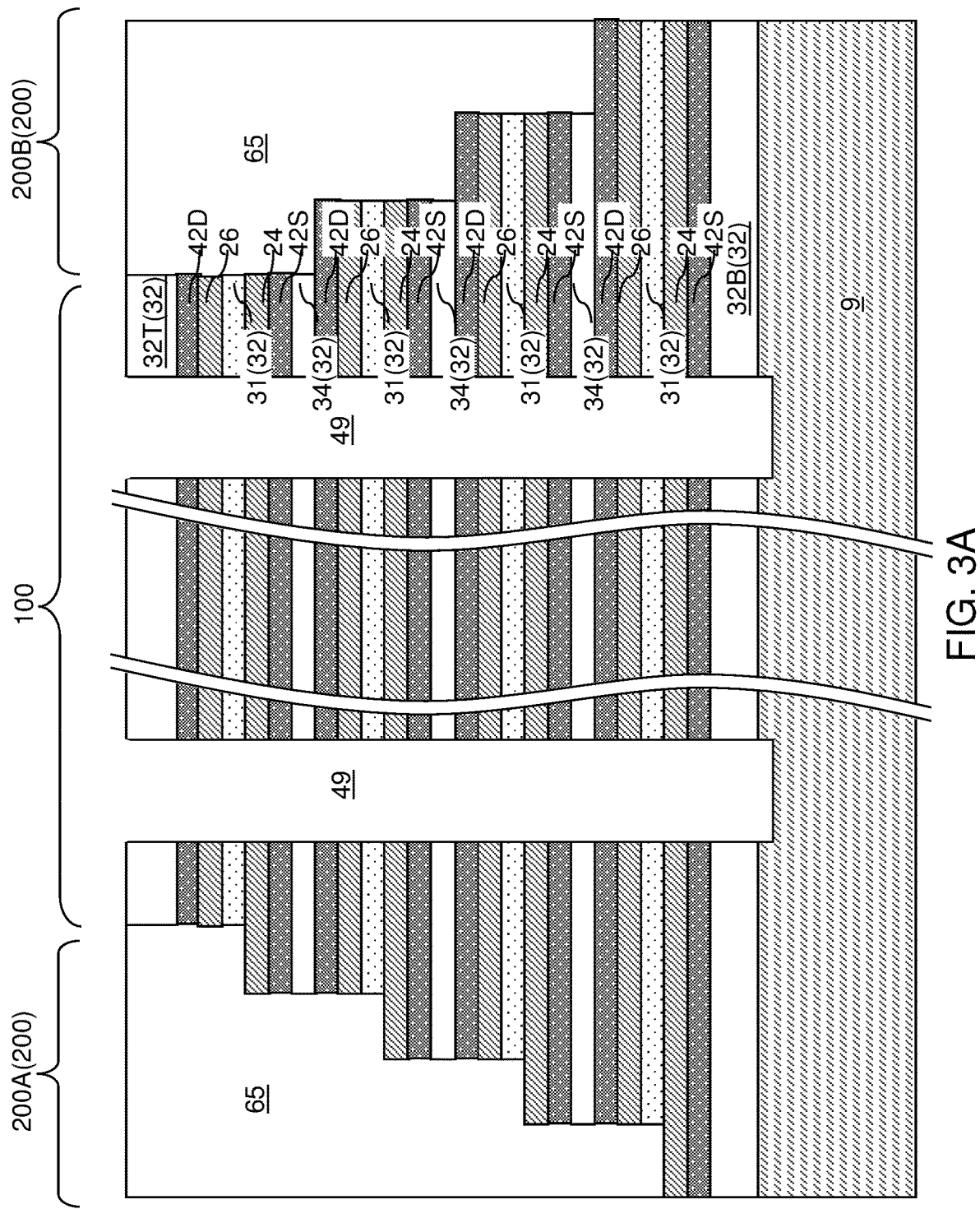
FIG. 3A is a schematic vertical cross-sectional view of the first exemplary structure after formation of retro-stepped dielectric material portions and an array of memory openings according to the first embodiment of the present disclosure.

Referring to FIGS. 3A and 3B, a retro-stepped dielectric material portion 65 (i.e., an insulating fill material portion) can be formed in each stepped cavity 69 by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). Each remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

A lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and an optional second set of openings formed over the staircase regions (200A, 200B). The pattern in the lithographic material stack can be transferred through the topmost insulating layer 32T or the retro-stepped dielectric material portion 65, the multiple instances of the unit layer stack (42S, 24, 31, 26, 42D, 34), and the bottommost insulating layer 32B by at least one anisotropic etch that employs the patterned lithographic material stack as an etch mask. Portions of the multiple instances of the unit layer stack (42S, 24, 31, 26, 42D, 34) located in the memory array region 100 and underlying the first set of openings in the patterned lithographic material stack are etched to form memory openings 49. As used herein, a "memory opening" refers to a structure in which memory stack elements, such as a memory stack structure, is subsequently formed. The memory openings 49 are formed through the topmost insulating layer 32T and the entirety of the multiple instances of the unit layer stack (42S, 24, 31, 26, 42D, 34) in the memory array region 100. Unmasked regions of the multiple instances of the unit layer stack (42S, 24, 31, 26, 42D, 34) and the retro-stepped dielectric material portions 65 located in the staircase regions (200A, 200B) that underlie the second set of openings in the patterned lithographic material stack can be etched to form optional support openings (not shown).

The memory openings 49 extend through the entirety of the multiple instances of the unit layer stack (42S, 24, 31, 26, 42D, 34). The chemistry of the anisotropic etch process employed to etch through the materials of the multiple instances of the unit layer stack (42S, 24, 31, 26, 42D, 34) can alternate to optimize etching of the respective materials in the multiple instances of the unit layer stack (42S, 24, 31, 26, 42D, 34). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 can extend from the top surface of the multiple instances of the unit layer stack (42S, 24, 31, 26, 42D, 34) to at least the horizontal plane including the topmost surface of the substrate 9. Each of the memory openings 49 may include a sidewall (or a plurality of sidewalls) that extends substantially perpendicular to the topmost surface of the substrate 9. A two-dimensional array of memory openings 49 can be formed in the memory array region 100 through the multiple instances of the unit layer stack (42S, 24, 31, 26, 42D, 34). Thus, the two-dimensional array of memory openings 49 can be formed through the alternating stack of the doped semiconductor source layers 24 and the doped semiconductor drain layers 26. In one embodiment, the two-dimensional array of memory openings 49 can be formed as clusters of periodic two-dimensional arrays such as hexagonal arrays.

Figure 4:
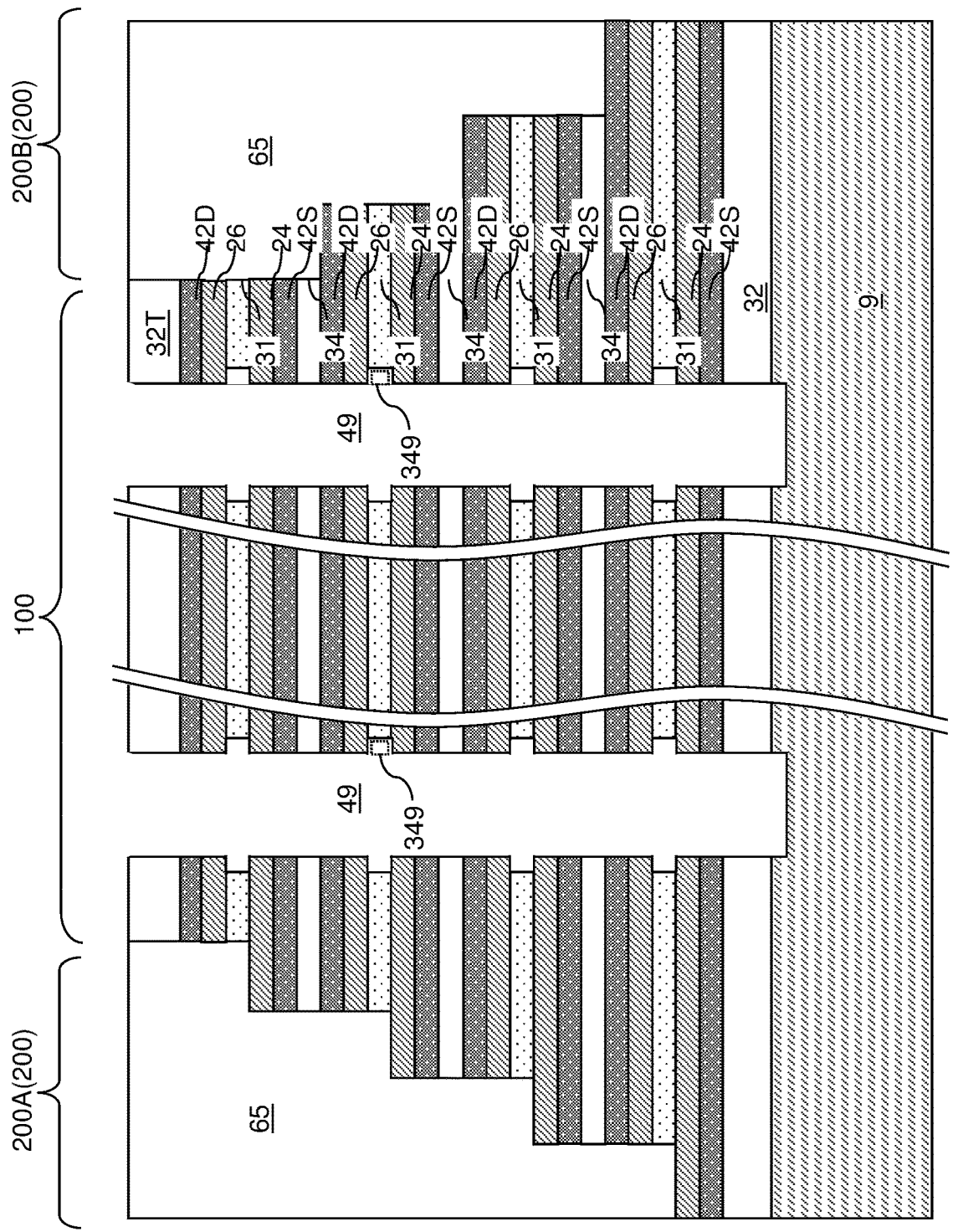
FIG. 4 is a schematic vertical cross-sectional view of the first exemplary structure after formation of channel cavities at each level of the channel-level insulating layers according to the first embodiment of the present disclosure.
Figure 5A:
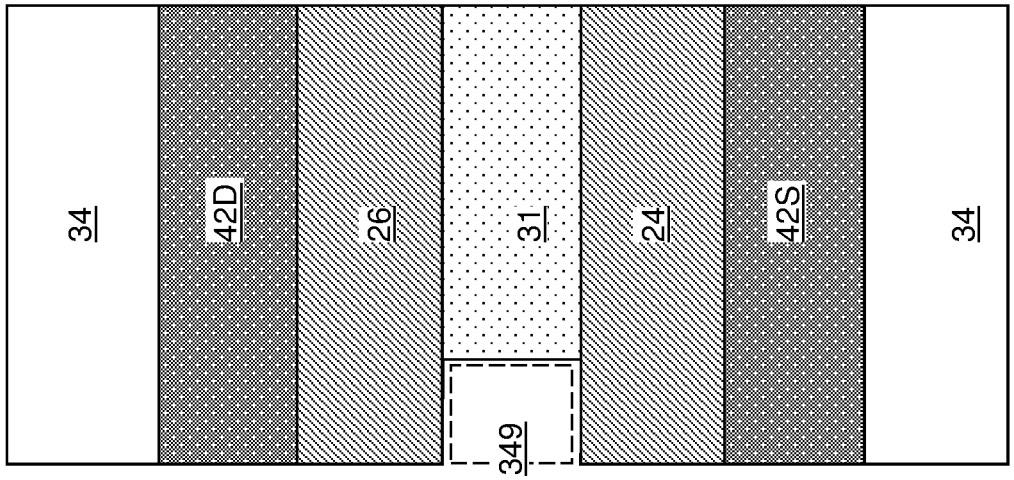
FIG. 5A is a schematic vertical cross-sectional view of a region around a channel cavity within the first exemplary structure of FIG. 4.
Figure 5A:
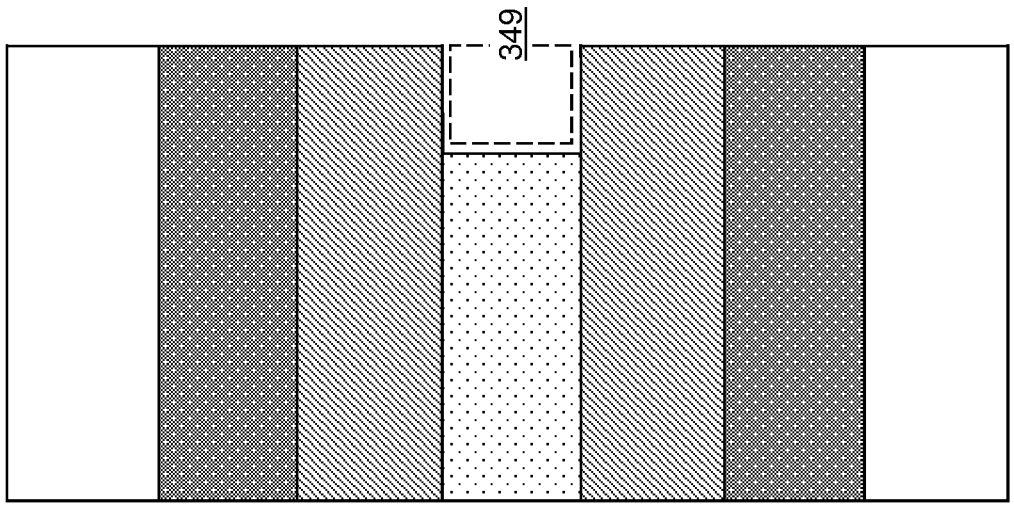

Referring to FIGS. 4 and 5A, channel cavities (i.e., recesses) 349 can be formed at each level of the channel-level spacer layers 31 by laterally recessing the channel-level spacer layers 31 relative to the inter-transistor-level insulating layers 34, the doped semiconductor source layers 24, the doped semiconductor drain layers 26, the source sacrificial material layers 42S, and the drain sacrificial material layers 42D. The memory openings 49 are laterally expanded at each level of the channel-level spacer layers 31 by the volumes of the channel cavities 349. As discussed above, the first insulating material of the channel-level spacer layers 31 provides a greater etch rate than the second insulating material of the inter-transistor-level insulating layers 34 in an isotropic etch process. The isotropic etch process can be a wet etch process employing 100:1 dilute hydrofluoric acid if the channel-level spacer layers 31 comprises a doped silicate glass or an aluminum oxide selective etch medium if the channel-level spacer layers 31 comprise aluminum oxide. The channel cavities 349 can have a respective tubular shape. A vertical stack of channel cavities 349 can be formed around each of the memory openings 49. The height of each channel cavity 349 can be the same as the height of the channel-level spacer layer 31 that is formed at the same level as the respective channel cavity 349. The lateral recess distance for each of the channel cavities 349 can be in a range from 5 nm to 100 nm, such as from 10 nm to 50 nm, although lesser and greater lateral recess distances can also be employed.

Figure 5B:
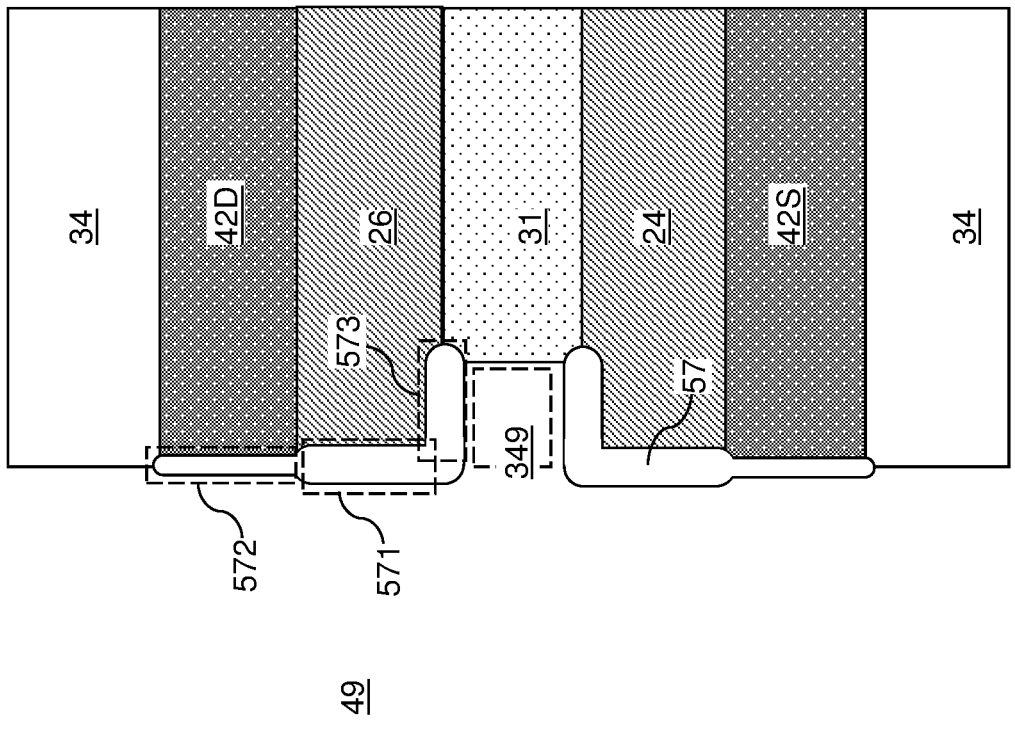
FIG. 5B is a schematic vertical cross-sectional view of the region around the channel cavity after formation of semiconductor oxide spacers according to the first embodiment of the present disclosure.
Figure 5B:
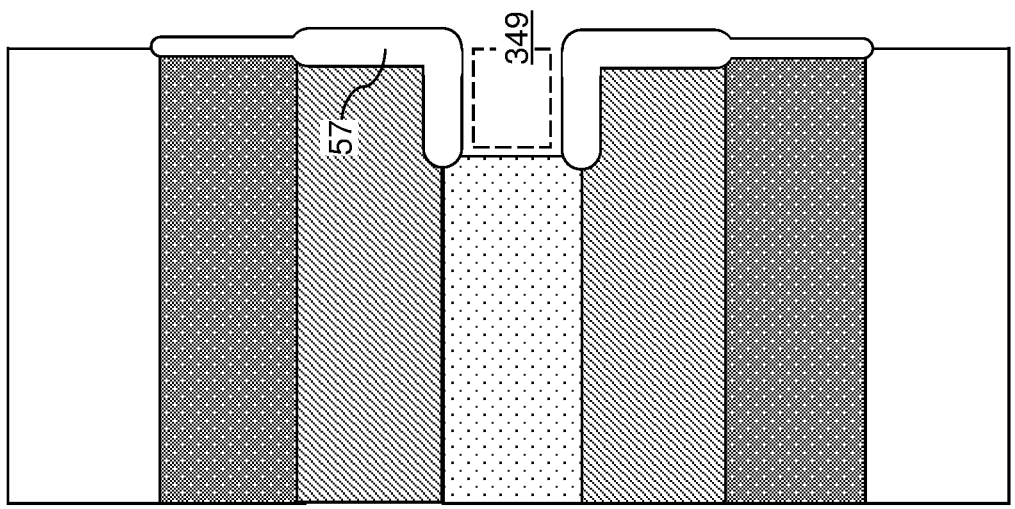

Referring to FIG. 5B, an oxidation process can be performed to oxidize oxidizable surface portions of material layers in the vertical repetition of the unit layer stack (42S, 24, 31, 26, 42D, 34). The material layers containing oxidizable surface portions include at least the doped semiconductor source layers 24 and the doped semiconductor drain layers 26. In case the source sacrificial material layers 42S and the drain sacrificial material layers 42D include a material such as silicon nitride, undoped amorphous silicon, or a silicon-germanium alloy, the material layers containing oxidizable surface portions also include the source sacrificial material layers 42S and the drain sacrificial material layers 42D.

Semiconductor oxide spacers 57 can be formed by oxidation of at least surface portions of the doped semiconductor source layers 24 and the doped semiconductor drain layers 26 located around each memory opening 49. In one embodiment, the source sacrificial material layers 42S and the drain sacrificial material layers 42D include an oxidizable material such as silicon nitride, undoped amorphous silicon, or a silicon-germanium alloy, and the semiconductor oxide spacers 57 can be formed by oxidizing surface portions of the source sacrificial material layers 42S and the drain sacrificial material layers 42D in addition to the surface portions of the doped semiconductor source layers 24 and the doped semiconductor drain layers 26.

In one embodiment, each of the semiconductor oxide spacers 57 can comprise a vertically extending portion (571, 572) that contacts a vertical stack of a doped semiconductor source layer and a source sacrificial material layer 42S or a vertical stack of a doped semiconductor drain layer 26 and a drain sacrificial material layer 42D. Each vertically extending portion (571, 572) of the semiconductor oxide spacers 57 can comprise a first vertically extending segment 571 formed by oxidation of a surface portion of a respective one of the doped semiconductor source layers 24 and the doped semiconductor drain layers 26, and a second vertically extending segment 572 formed by oxidation of a surface portion of a respective one of the source sacrificial material layers 42S and the drain sacrificial material layers 42D and having a thickness that is different from a thickness of the first vertically extending segment.

In one embodiment, each of the semiconductor oxide spacers 57 can comprise a laterally extending portion 573 that is adjoined to the vertically extending portion (571, 572) of the semiconductor oxide spacer 57. The first vertically extending segment 571 of each semiconductor oxide spacer 57 adjoins the laterally extending portion 573 of the semiconductor oxide spacer 57, and contacts a sidewall of the doped semiconductor source layer 24 or the doped semiconductor drain layer 26. The second vertically extending segment 572 of each semiconductor oxide spacer 57 is spaced from the laterally extending portion 573 of the semiconductor oxide spacer 57 by the first vertically extending segment 571 of the semiconductor oxide spacer 57, and contacts a sidewall of the source sacrificial material layers 42S and the drain sacrificial material layers 42D.

The thickness of each portion of the semiconductor oxide spacers 57 depends on the oxidation rate of the material from which the respective portion is derived. The first vertically extending segment 571 and the laterally extending portion 573 of each semiconductor oxide spacer 57 are derived from a same semiconductor material (e.g., polysilicon), which is the semiconductor material of a doped semiconductor source layer 24 or a doped semiconductor drain layer 26. As such, the first vertically extending segment 571 of each semiconductor oxide spacer 57 can have a lateral thickness that is the same as a vertical thickness of the laterally extending portion 573 of the semiconductor oxide spacer 57. The thickness of the first vertically extending segment of each semiconductor oxide spacer 57 can be in a range from 3 nm to 12 nm, such as from 4 nm to 8 nm, although lesser and greater thicknesses can also be employed.

In one embodiment, the source sacrificial material layers 42S and the drain sacrificial material layers 42D can include a material having a lower oxidation rate than the material of the doped semiconductor source layers 24 and the doped semiconductor drain layers 26. For example, the source sacrificial material layers 42S and the drain sacrificial material layers 42D can include silicon nitride, and the second vertically extending segment 572 of each semiconductor oxide spacer 57 can have a lesser thickness than the first vertically extending segment 571 of the semiconductor oxide spacer 57. In one embodiment, the ratio of the thickness of the first vertically extending segment 571 to the thickness of the second vertically extending segment 572 may be in a range from 1.5 to 10, although lesser and greater ratios may also be employed.

In another embodiment, the source sacrificial material layers 42S and the drain sacrificial material layers 42D can include a material having a comparable rate as, or a higher oxidation rate than the material of the doped semiconductor source layers 24 and the doped semiconductor drain layers 26. For example, the source sacrificial material layers 42S and the drain sacrificial material layers 42D can include undoped amorphous silicon or a silicon-germanium alloy, and the second vertically extending segment 572 of each semiconductor oxide spacer 57 can have a same thickness as, or a greater thickness than, the first vertically extending segment 571 of the semiconductor oxide spacer 57. In one embodiment, the ratio of the thickness of the first vertically extending segment 571 to the thickness of the second vertically extending segment 572 may be in a range from 0.25 to 0.99, such as from 0.5 to 0.95, although lesser and greater ratios may also be employed.

A first subset of the semiconductor oxide spacers 57 can contact a respective doped semiconductor source layer 24 and a respective source sacrificial material layer 42S. A second subset of the semiconductor oxide spacers 57 can contact a respective doped semiconductor drain layer 26 and a respective drain sacrificial material layer 42D.

Each laterally extending portion 573 of the semiconductor oxide spacers 57 can have a respective annular shape. Each first vertically extending segment 571 of the semiconductor oxide spacers 57 can have a respective tubular shape. Each second vertically extending segment 572 can have a respective tubular shape. The sidewall of each doped semiconductor source layer 24 can be laterally offset from a sidewall of an underlying source sacrificial material layer 42S, and the sidewall of each doped semiconductor drain layer 26 can be laterally offset from a sidewall of an overlying drain sacrificial material layers 42D. Each sidewall of the layers within the vertical repetition of the unit layer stack (42S, 24, 31, 26, 42D, 34) can have a cylindrical shape.

Figure 5C:
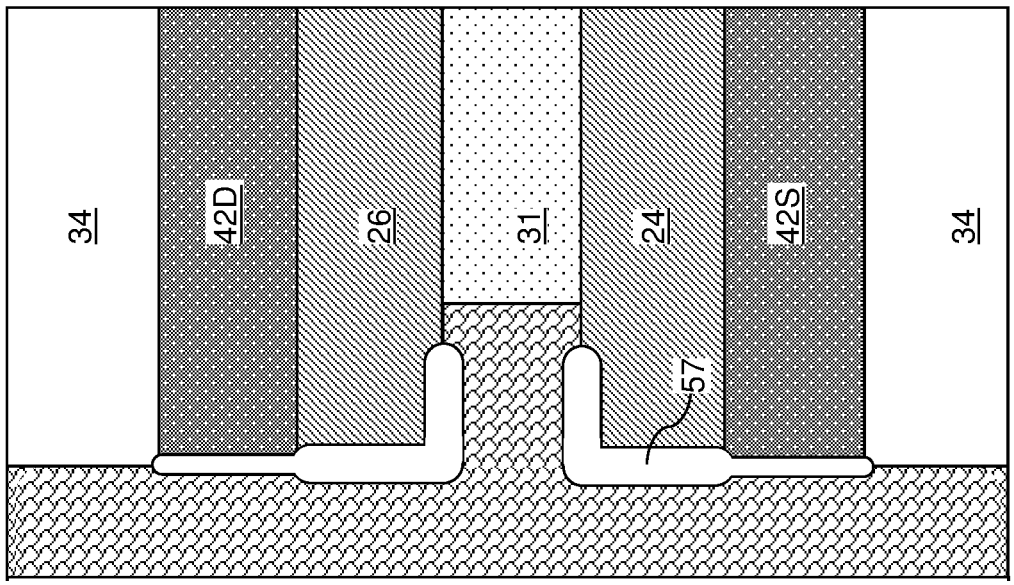
FIG. 5C is a schematic vertical cross-sectional view of the region around the channel cavity after deposition of a semiconductor channel material layer according to the first embodiment of the present disclosure.
Figure 5C:
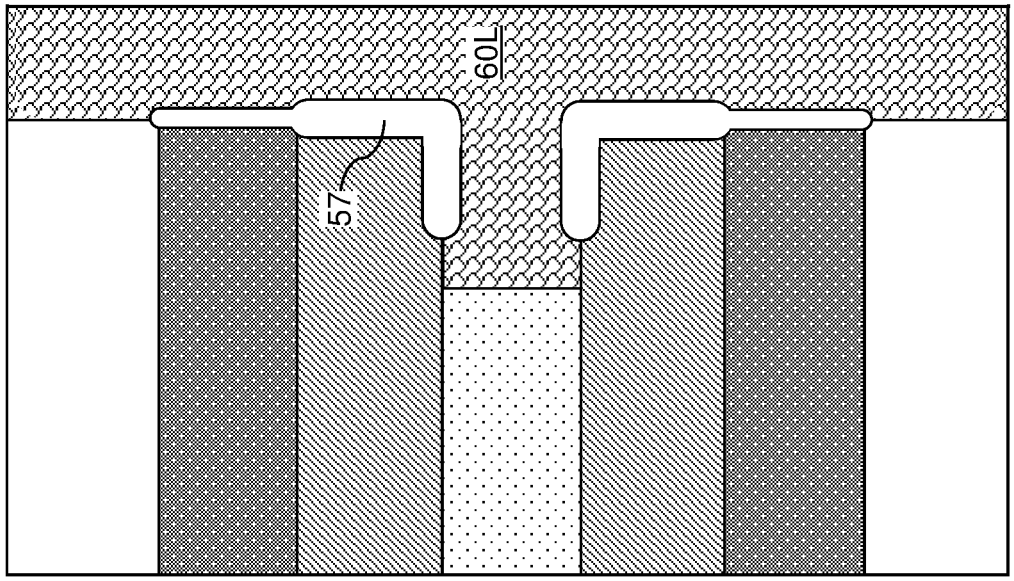

Referring to FIG. 5C, the cylindrical sidewalls of the channel-level spacer layers 31 can be laterally recessed to expand the volume of each channel cavity 349. An isotropic etch process that etches the material of the channel-level spacer layers 31 selective to the material of the semiconductor oxide spacers 57 can be performed. For example, dilute hydrofluoric acid having 100:1 dilution or a higher dilution or an aluminum oxide selective etch can be employed to laterally recess the sidewalls of the channel-level spacer layers 31 selective to the materials of the semiconductor oxide spacers 57 and the inter-transistor-level insulating layers 34.

A semiconductor channel material layer 60L can be deposited in the channel cavities 349 and over the semiconductor oxide spacers 57 and sidewalls of the inter-transistor-level insulating layers 34 by a conformal deposition process such as a chemical vapor deposition process. The continuous semiconductor channel layer 60L includes a semiconductor material having a doping of a second conductivity type, which is the opposite of the first conductivity type. For example, if the first conductivity type is n-type, the second conductivity type is p-type, and vice versa. The semiconductor material in the continuous semiconductor channel layer 60L can include silicon (e.g., polysilicon or amorphous silicon), a silicon-germanium alloy, or a compound semiconductor material. The atomic concentration of dopants of the second conductivity type in the continuous semiconductor channel layer 60L can be in a range from $1.0 \times 10^{14}/cm^3$ to $3.0 \times 10^{17}/cm^3$, although lesser and greater atomic concentrations can also be employed. The thickness of the continuous semiconductor channel layer 60L can be in a range from 1 nm to 30 nm, such as from 3 nm to 10 nm, although lesser and greater thicknesses can also be employed. Each memory opening 49 can include a respective memory cavity 49', which is an unfilled void within the memory opening 49.

Figure 5D:
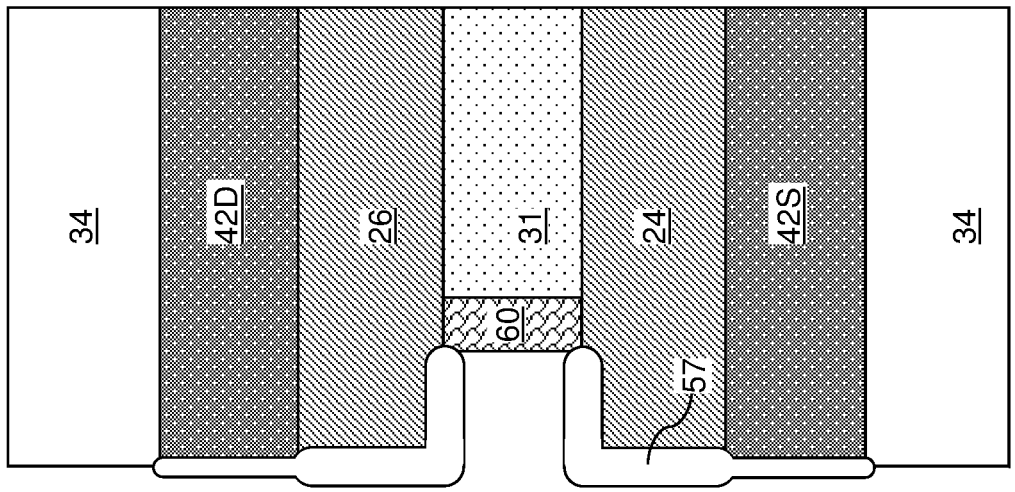
FIG. 5D is a schematic vertical cross-sectional view of the region around the channel cavity after formation of semiconductor channels according to the first embodiment of the present disclosure.
Figure 5D:
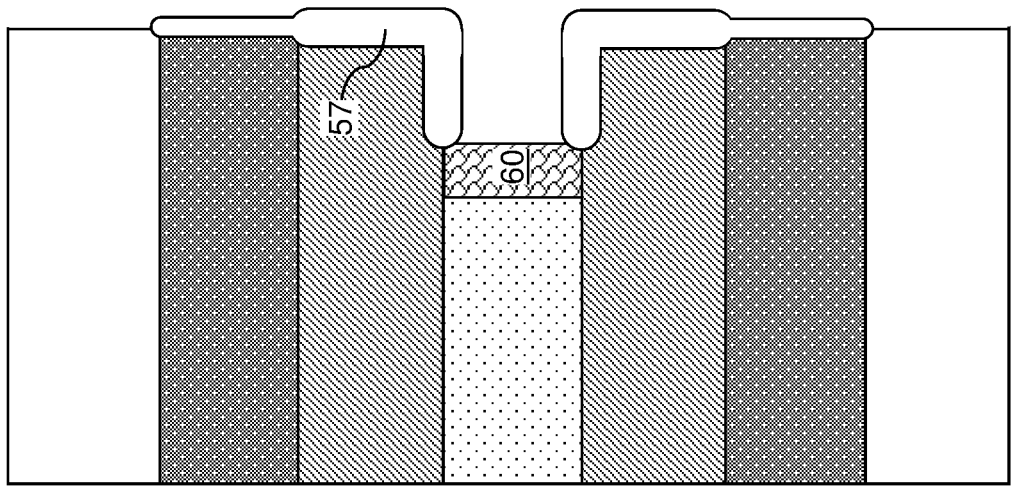

Referring to FIG. 5D, portions of the semiconductor channel material layer 60L located outside the channel cavities 349 can be removed by performing an anisotropic etch process. Further, a controlled isotropic etch process can be performed to laterally recess remaining portions of the semiconductor channel material layer 60L that are present in the channel cavities 349. The lateral recessing of the material of the semiconductor channel material layer 60L in the channel cavities 349 can be performed by a wet etch process that employs hot trimethyl-2 hydroxyethyl ammonium hydroxide ("hot TMY") or tetramethyl ammonium hydroxide (TMAH). Alternatively, the lateral recessing of the material of the semiconductor channel material layer 60L in the channel cavities 349 can be performed by a dry etch process that employs an etch gas such as gaseous hydrogen chloride with a suitable carrier gas (such as hydrogen, nitrogen, argon, and/or helium). The lateral recess distance of the isotropic etch process can be controlled such that each remaining portion of the semiconductor channel material layer 60L has a target thickness, which can be in a range from 4 nm to 40 nm, such as from 6 nm to 20 nm, although lesser and greater thicknesses can also be employed. Each remaining portion of the semiconductor channel material layer 60L comprises a semiconductor channel 60. A vertical stack of semiconductor channels 60 is formed around each memory opening 49. Each vertical stack of semiconductor channels 60 is formed as a set of discrete semiconductor channels 60 located in a respective channel cavity 349 and vertically spaced apart from each other, i.e., without direct contact with each other. Each semiconductor channel 60 can have a tubular shape with an outer diameter that is greater than the height. For example, each semiconductor channel 60 can have an inner cylindrical sidewall, an outer cylindrical sidewall, a top annular surface, a bottom annular surface, and a pair of concave annular surfaces that contact a respective one of the semiconductor oxide spacers 57.

Each of the discrete semiconductor channels 60 contacts a cylindrical sidewall of a respective one of the channel-level spacer layers 31. The insulating layers (31, 34) in the multiple instances of the unit layer stack include channel-level spacer layers 31 in contact with a sidewall of a respective one of the semiconductor channels 60, and inter-transistor-level insulating layers 34 that do not contact any of the semiconductor channels 60. Sidewalls of the channel-level spacer layers 31 are laterally recessed outward relative to sidewalls of the inter-transistor-level insulating layers 34 and relative to sidewalls of the doped semiconductor source layers 24 and the doped semiconductor drain layers 26 around each memory opening 49. Each of the channel-level spacer layers 31 can be in direct contact with horizontal surfaces of a respective one of the doped semiconductor source layers 24 and a respective one of the doped semiconductor drain layers 26.

Each of the semiconductor channels 60 is formed on horizontal surfaces of a respective vertically neighboring pair of a doped semiconductor source layer 24 and a doped semiconductor drain layer 26 prior to formation of the memory films and the vertical word lines. A vertical stack of semiconductor channels 60 is formed in each of the memory openings 49. Each of the semiconductor channels 60 is connected to a respective vertically neighboring pair of a doped semiconductor source layer 24 and a doped semiconductor drain layer 26.

In one embodiment, an entirety of an outer sidewall of each semiconductor channel 60 contacts a cylindrical sidewall of a respective channel-level spacer layer 31 located between a respective vertically neighboring pair of a doped semiconductor source layer 24 and a doped semiconductor drain layer 26. Each semiconductor channel 60 can contact horizontal surfaces of a respective vertically neighboring pair of a doped semiconductor source layer 24 and a doped semiconductor drain layer 26. As discussed above, the doped semiconductor source layer 24 may underlie or overlie the doped semiconductor drain layer 26 within each unit layer stack (42S, 24, 31, 26, 42D, 34). In one embodiment, the outer sidewall includes an upper periphery contacting a horizontal surface of one of the doped semiconductor source layer 24 and the doped semiconductor drain layer 26 in the respective vertically neighboring pair, and includes a lower periphery contacting a horizontal surface of another of the doped semiconductor source layer 24 and the doped semiconductor drain layer 26 in the respective vertically neighboring pair.

Figure 5E:
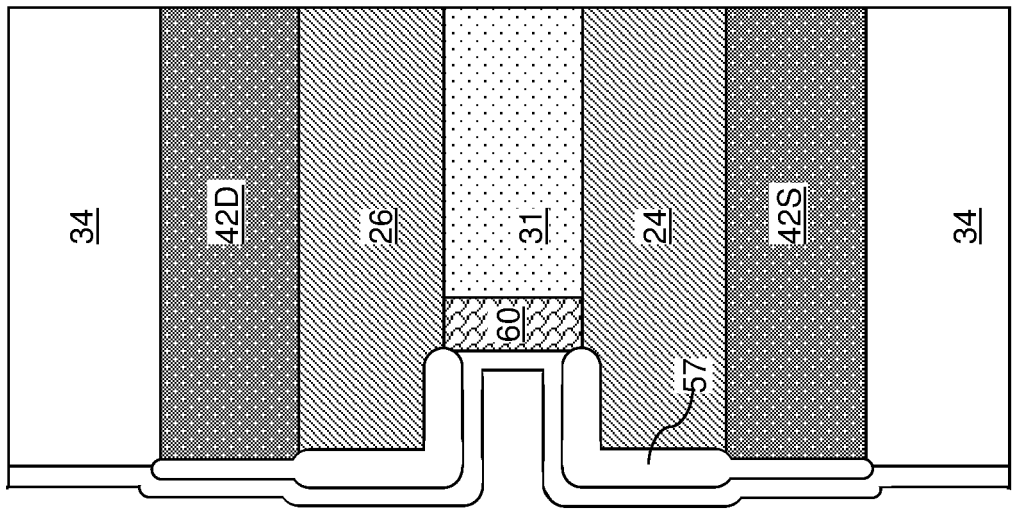
FIG. 5E is a schematic vertical cross-sectional view of the region around the channel cavity after formation of a gate dielectric layer according to the first embodiment of the present disclosure.
Figure 5E:
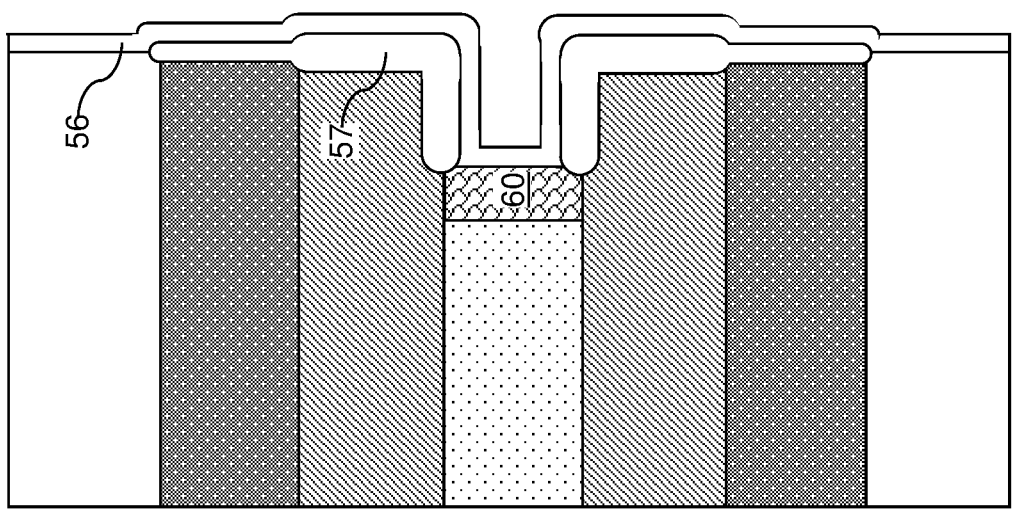

Referring to FIG. 5E, a gate dielectric layer 56 can be formed as a continuous material layer that covers, and contacts, all physically exposed surfaces around each memory opening 49. In one embodiment, the gate dielectric layer 56 can comprise a tunneling dielectric layer. In this case, the gate dielectric layer 56 includes a tunneling dielectric material such as a silicon oxide layer or an ONO stack (i.e., a stack of a silicon oxide layer, a silicon nitride layer, and a silicon oxide layer). The thickness of the gate dielectric layer 56 can be in a range from 1 nm to 6 nm, such as from 1.5 nm to 3 nm. The gate dielectric layer 56 can vertically extend continuously through each level of the material layers within the vertical repetition of the unit layer stack (42S, 24, 31, 26, 42D, 34).

Figure 5F:
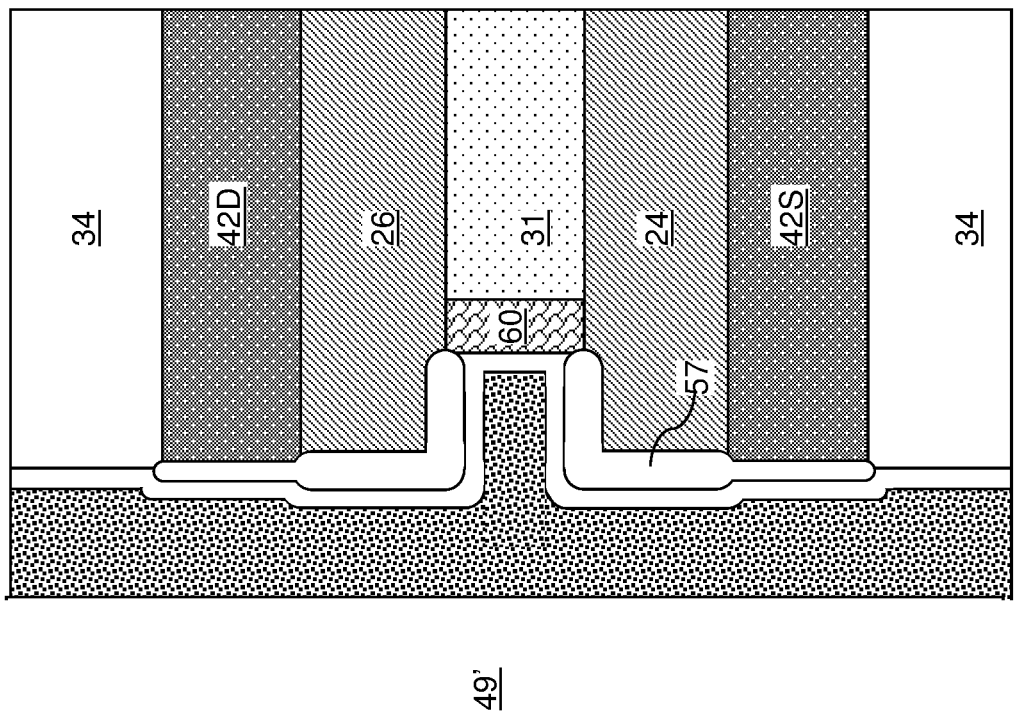
FIG. 5F is a schematic vertical cross-sectional view of the region around the channel cavity after deposition of a memory material layer according to the first embodiment of the present disclosure.
Figure 5F:
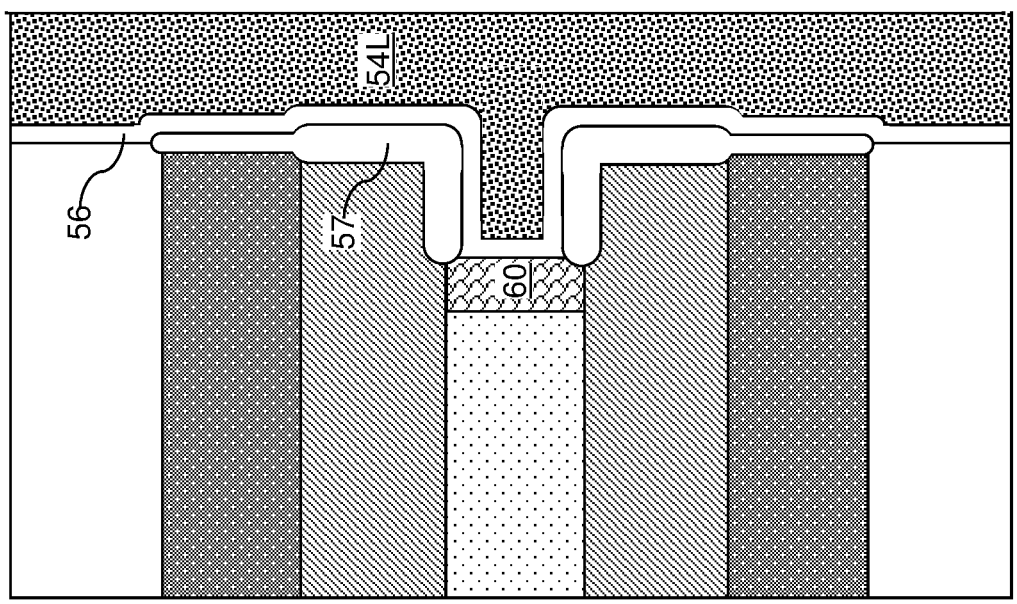

Referring to FIG. 5F, a memory material layer 54L can be deposited at a peripheral portion of each memory opening 49. The memory material layer 54L includes a material that can form a memory element when divided into discrete material portions. In one embodiment, the memory material layer 54L includes a charge trapping material such as silicon nitride. In another embodiment, the memory material layer 54L includes a conductive floating gate material such as a metallic material or a heavily doped semiconductor material. The thickness of the memory material layer 54L can be selected such that the entirety of each remaining volume of the channel cavities 349 can be filled with the memory material layer 54L.

Figure 5G:
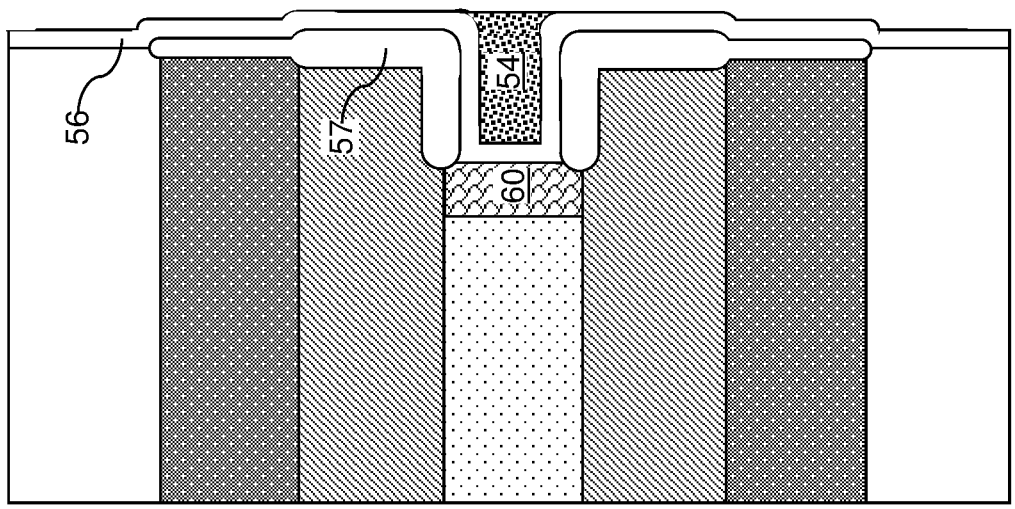
FIG. 5G is a schematic vertical cross-sectional view of the region around the channel cavity after formation of memory material portions according to the first embodiment of the present disclosure.
Figure 5G:
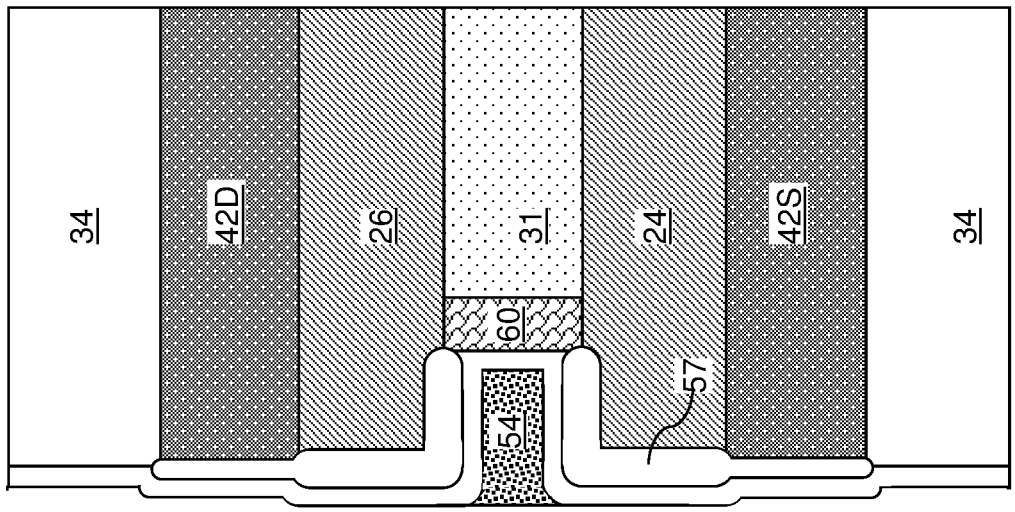

Referring to FIG. 5G, an etch process can be performed to remove portions of the memory material layer 54L that are located outside the channel cavities 349. The etch process may include an isotropic etch process (such as a wet etch process or a chemical dry etch), and/or may include an anisotropic etch process. For example, if the memory material layer 54L includes silicon nitride, a wet etch process including hot phosphoric acid may be employed to laterally recess the memory material layer 54L. Alternatively, a reactive ion etch process can be employed to remove portions of the memory material layer 54L that are located outside the channel cavities 349. Generally, the etch chemistry of the etch process can be selected depending on the material of the memory material layer 54L. Each remaining portion of the memory material layer 54L that remains in the channel cavities 349 comprises a memory material portion 54.

A vertical stack of discrete, vertically separated memory material portions 54 can be formed in each memory opening 49. Each memory material portion 54 can be located in each one of the memory openings 49, and can be laterally spaced from a respective one of the semiconductor channels 60 by a respective gate dielectric layer 56. In one embodiment, the memory material portions 54 comprise charge trapping material portions. In another embodiment, the memory material portions 54 comprise floating gate structures.

Figure 5H:
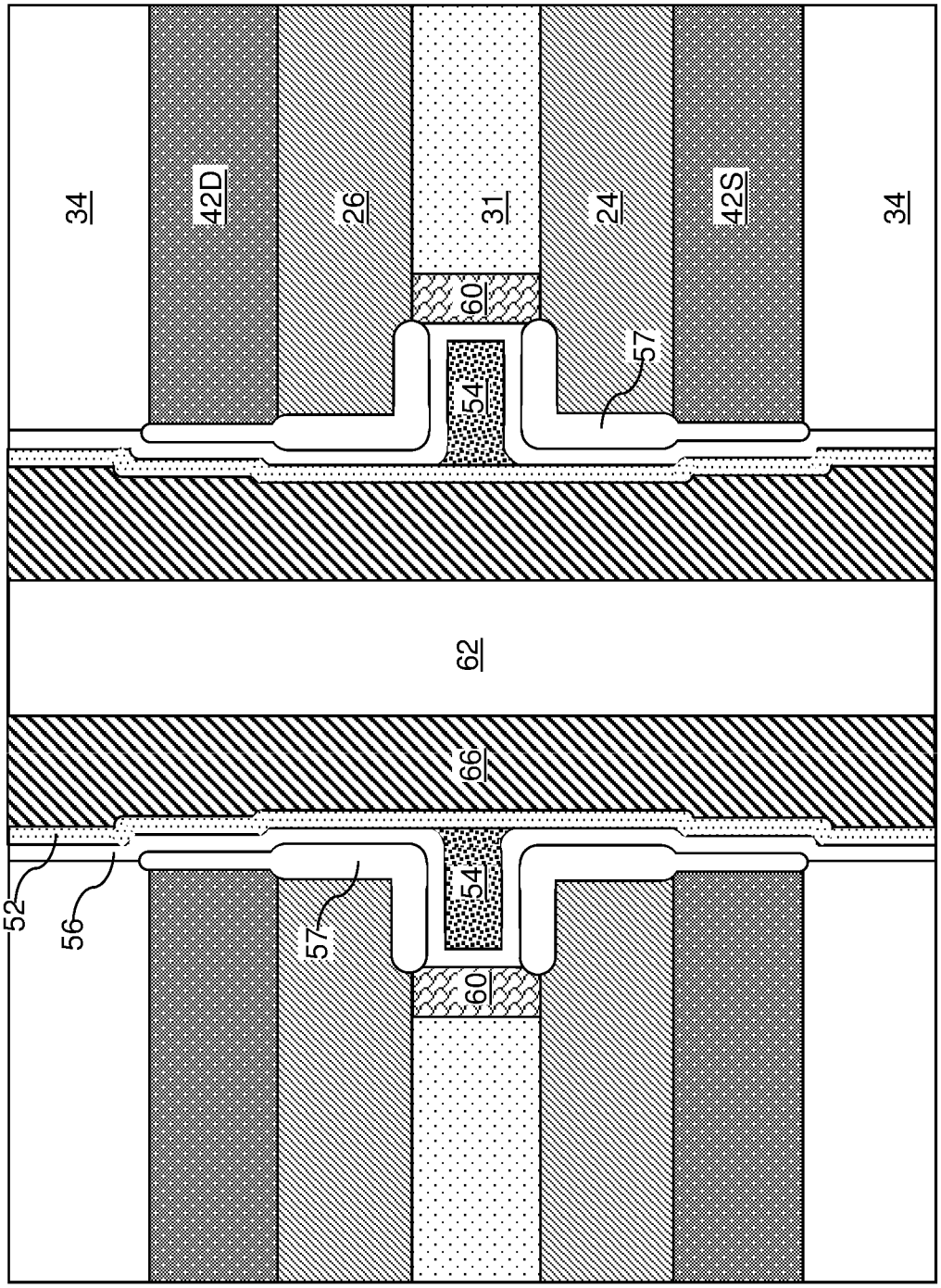
FIG. 5H is a schematic vertical cross-sectional view of the region around the channel cavity after formation of vertical word lines and dielectric cores according to the first embodiment of the present disclosure.

Referring to FIG. 5H, a blocking dielectric layer 52 can be formed on each of the memory material portions 54. The blocking dielectric layer 52 includes a blocking dielectric material such as silicon oxide, a dielectric metal oxide (such as aluminum oxide), or a combination thereof. The blocking dielectric layer 52 can be formed by a conformal deposition process such as a low pressure chemical vapor deposition process. The thickness of the blocking dielectric layer 52 can be in a range from 4 nm to 20 nm, such as from 6 nm to 10 nm, although lesser and greater thicknesses can also be employed. The blocking dielectric layer 52 can function as a control gate dielectric.

At least one gate electrode material is deposited on the blocking dielectric layer 52. For example, a layer stack of a metallic nitride liner (e.g., barrier layer) including a conductive metallic nitride (such as TiN, TaN, or WN) and a metal fill layer including a metal (such as W, Co, Mo, Ru, Cu, or an alloy thereof) can be sequentially deposited as the at least one gate electrode material. Additionally or alternatively, a heavily doped semiconductor material may be employed as one of the at least one gate electrode material. Each portion of the at least one gate electrode material deposited in the memory openings 49 comprises a vertical word line 66. The vertical word line extends perpendicular to the top surface of the substrate 9.

Each portion of each vertical word line 66 located at the same vertical device level as each discrete semiconductor channel 60 functions as a gate electrode (e.g., control gate electrode) of a memory cell 300. Each memory cell 300 comprises a vertical memory field effect transistor containing a source region (portion of the doped semiconductor source layer 24 contacting the semiconductor channel), a drain region (i.e., portion of the doped semiconductor drain layer 26 contacting the semiconductor channel), a semiconductor channel 60 located between and contacting the source and drain regions, a gate dielectric 56, a memory material portion (e.g., charge storage dielectric, a floating gate or a ferroelectric material, as will be described in more detail below) (54, 154) and a gate electrode (e.g., control gate electrode) which comprises a portion of the vertical word line 66 in each transistor.

In case the memory openings 49 are not completely filled with the at least one gate electrode material, a dielectric fill material can be deposited in the remaining unfilled volumes of the memory openings 49. Each portion of the deposited dielectric fill material comprises a dielectric core 62. The dielectric core 62 includes a dielectric fill material such as silicon oxide. In one embodiment, the dielectric cores 62 can include a dielectric material that has a higher etch rate than the topmost insulating layer 32T in an etch process. For example, the dielectric cores 62 can include borosilicate glass, organosilicate glass, or phosphosilicate glass, and the topmost insulating layer 32T can include densified undoped silicate glass. In this case, the material of the dielectric cores 62 can be subsequently recessed relative to the material of the topmost insulating layer 32T.

Generally, a gate dielectric layer 56 can be formed on each of the semiconductor channels 60. Each of the memory material portions 54 is formed on a respective gate dielectric layer 56. Each vertical word line 66 can be formed on a respective blocking dielectric layer 52 in a respective memory opening 49.

Figure 5I:
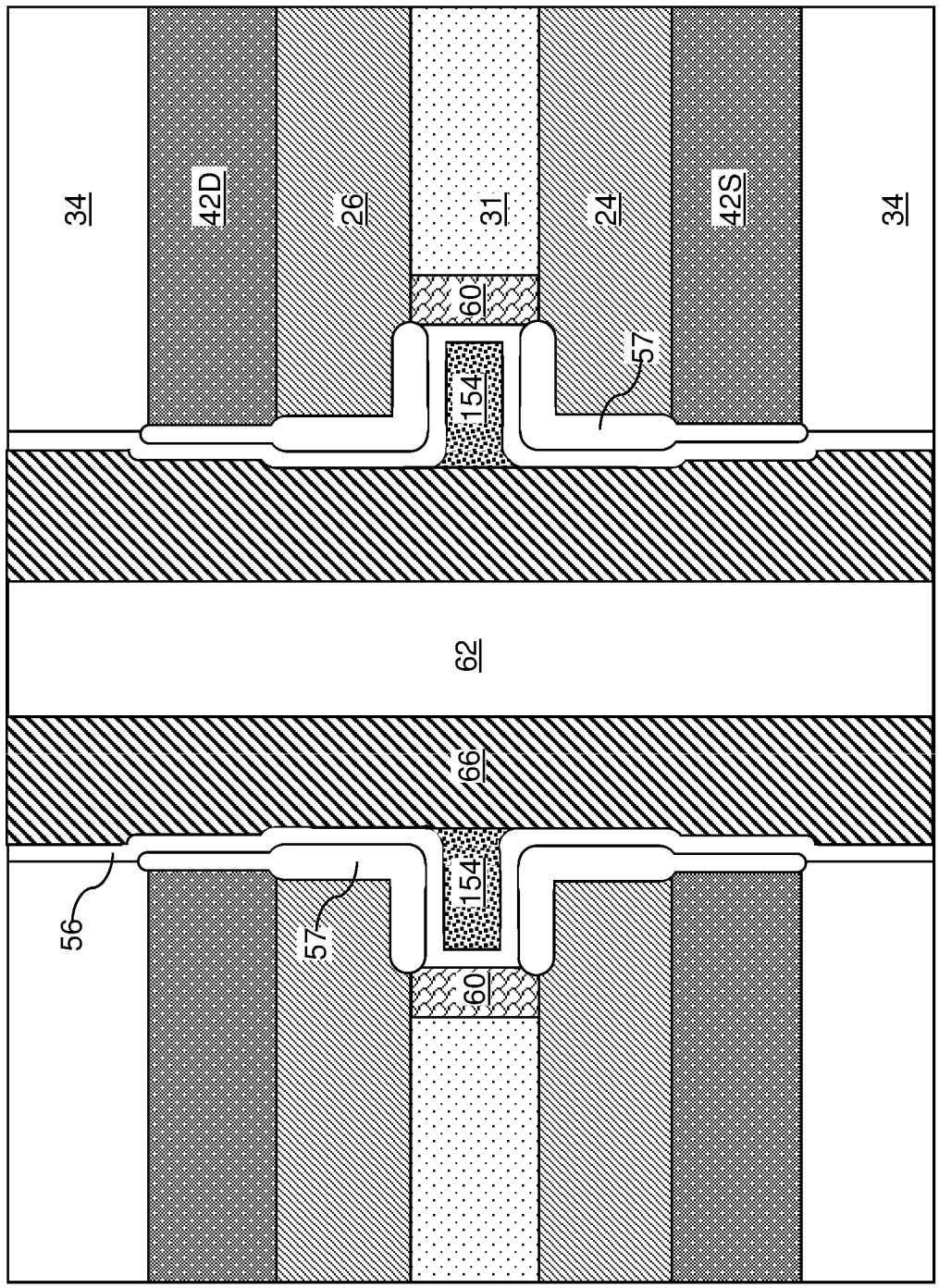
FIG. 5I is a schematic vertical cross-sectional view of a region around a channel cavity of an alternative embodiment of the first exemplary structure.

Referring to FIG. 5I, an alternative embodiment of the first exemplary structure is illustrated, which can be derived from the first exemplary structure illustrated in FIG. 5H by employing a vertical stack of discrete memory material portions 154 that are ferroelectric material portions in lieu of the combination of a blocking dielectric layer 52 and a vertical stack of discrete memory material portions 54 that comprise charge trapping material portions or floating gate structures. As used herein, a "ferroelectric material" refers to a crystalline material that exhibits spontaneous electrical polarization in the absence of an external electric field. In one embodiment, the ferroelectric material portions 154 comprise hafnium oxide including at least one dopant selected from Al, Zr, Si, Y, La, Gd, etc., and having a ferroelectric non-centrosymmetric orthorhombic phase. Alternatively, other ferroelectric materials, such as barium titanate, bismuth ferrite, lead titanate, lead zirconate titanate, rare earth doped Wurtzite phase III-nitride semiconductor materials, etc., may be used. The ferroelectric material portions can be formed by depositing a ferroelectric material layer at a periphery of each memory opening 49, and etching back portions of the ferroelectric material layer that are located outside the channel cavities 349 by an etch process, which may include an isotropic etch process and/or an anisotropic etch process.

Figure 6:
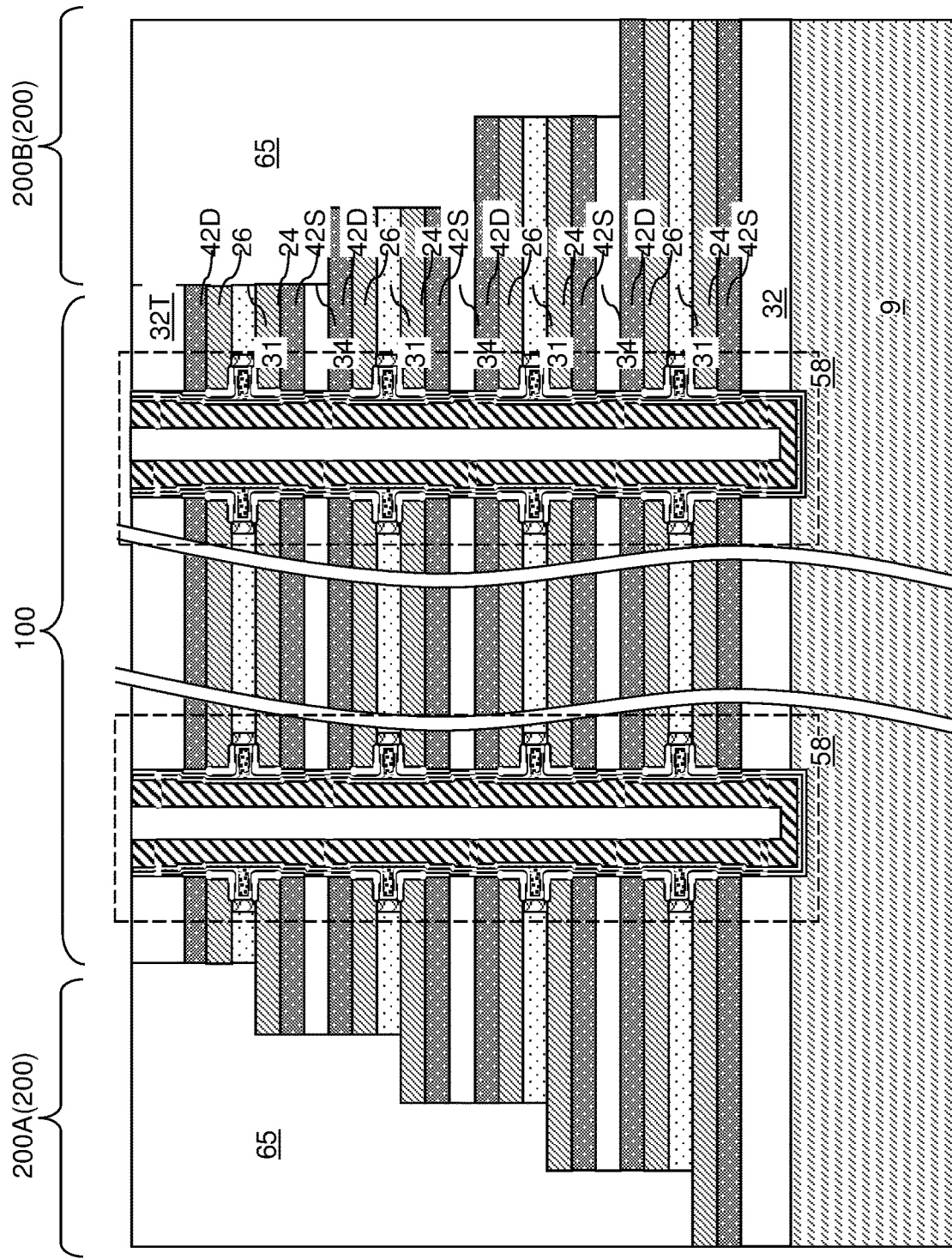
FIG. 6 is a schematic vertical cross-sectional view of the first exemplary structure after formation of memory opening fill structures according to the first embodiment of the present disclosure.

Referring to FIG. 6, excess portions of various material layers that are located above the horizontal plane including the top surface of the topmost insulating layer 32T can be removed by a planarization process. The planarization process can include a chemical mechanical planarization (CMP) process and/or a recess etch process. The various material layers containing respective material portions located above the horizontal plane including the top surface of the topmost insulating layer 32T can include, for example, the gate dielectric layer 56, the blocking dielectric layer 52 (if present), the layer of the at least one gate electrode material that includes the vertical word lines 66 (i.e., the portions located in the memory openings 49), and the dielectric fill material of the dielectric cores 62.

A memory opening fill structures 58 can be formed in each memory opening 49. Each memory opening fill structure 58 can include a vertical stack of discrete semiconductor channels 60, a gate dielectric layer 56, a vertical stack of discrete memory material portions (54 or 154), a blocking dielectric layer 52 (if present), a vertical word line 66, and an optional dielectric core 62. An array of memory opening fill structures 58 is formed within an array of memory openings 49, which vertically extends through the vertical repetition of the unit layer stack (42S, 24, 31, 26, 42D, 34). Each vertical word line 66 is located in a respective memory opening 49, and vertically extends through each of the doped semiconductor source layers 24 and the doped semiconductor drain layers 26. In case support openings (not shown) are formed in the staircase regions (200A, 200B), material portions that are collaterally deposited in the support openings during formation of the memory opening fill structures 58 form support pillar structures (not shown) that fill a respective one of the support openings. The support pillar structures can be employed to provide structural support to the first exemplary structure during subsequent replacement of the sacrificial source material layers 42S and the sacrificial drain material layers 42D with respective conductive material layers in subsequent processing steps.

Figure 7:
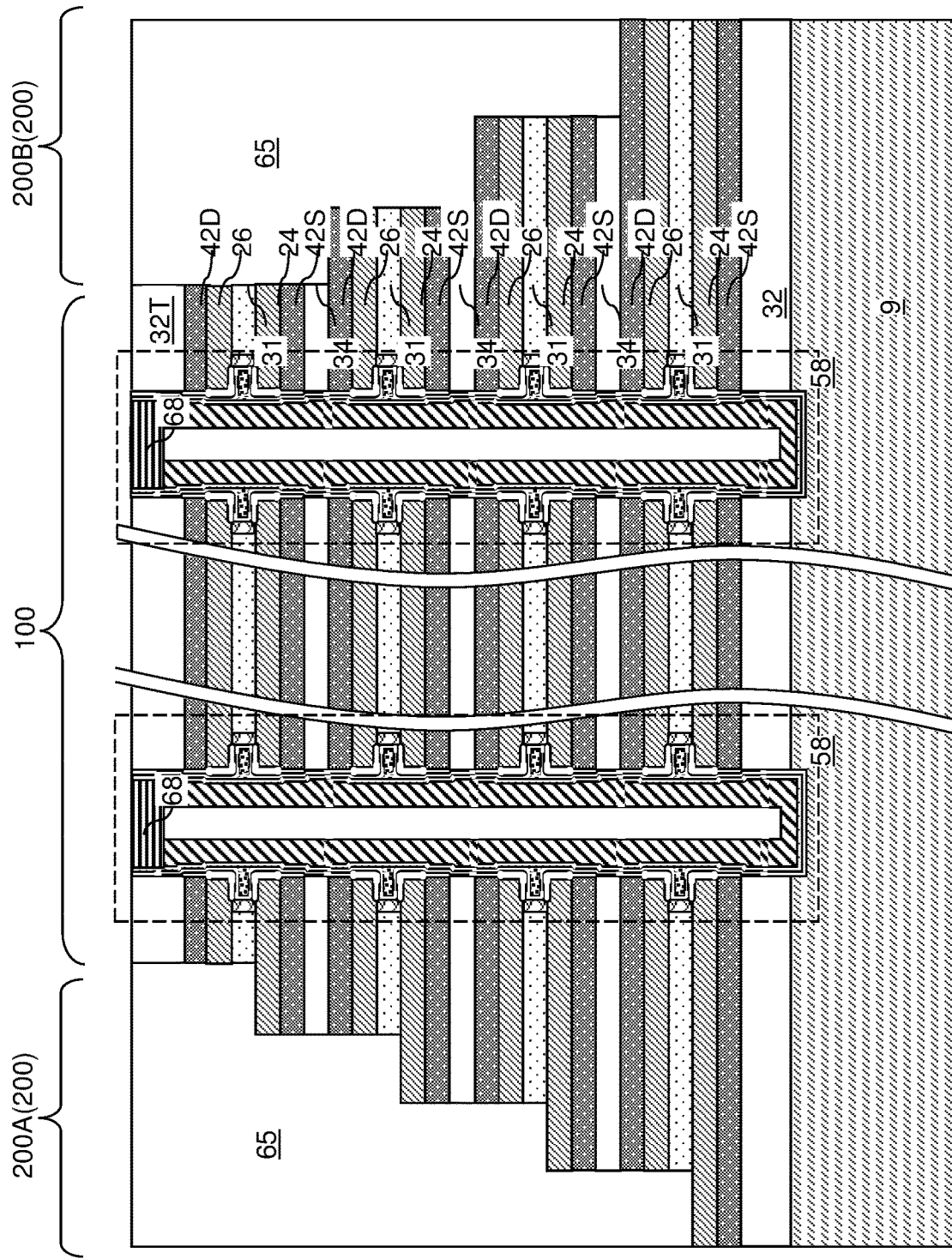
FIG. 7 is a schematic vertical cross-sectional view of the first exemplary structure after formation of contact pad structures according to the first embodiment of the present disclosure.

Referring to FIG. 7, top portions of the dielectric cores 62 can be vertically recessed to form cavity regions. A conductive material such as a metallic material can be deposited in the cavity regions. Excess portions of the conductive material can be removed from above the horizontal plane including the top surface of the topmost insulating layer 32T. Each remaining portion of the conductive material constitutes a contact pad structure 68. In one embodiment, the contact pad structures 68 can include a layer stack of a metallic nitride liner (TaN, TiN, or WN) and a conductive fill material such as a metallic material (such as W, Ru, Co, or Mo), a doped semiconductor material, and/or a metal silicide material. Each contact pad structure 68 contacts a top end of a respective vertical word line 66. Optionally, the contact pad structure 68 may be omitted.

Figure 8A:
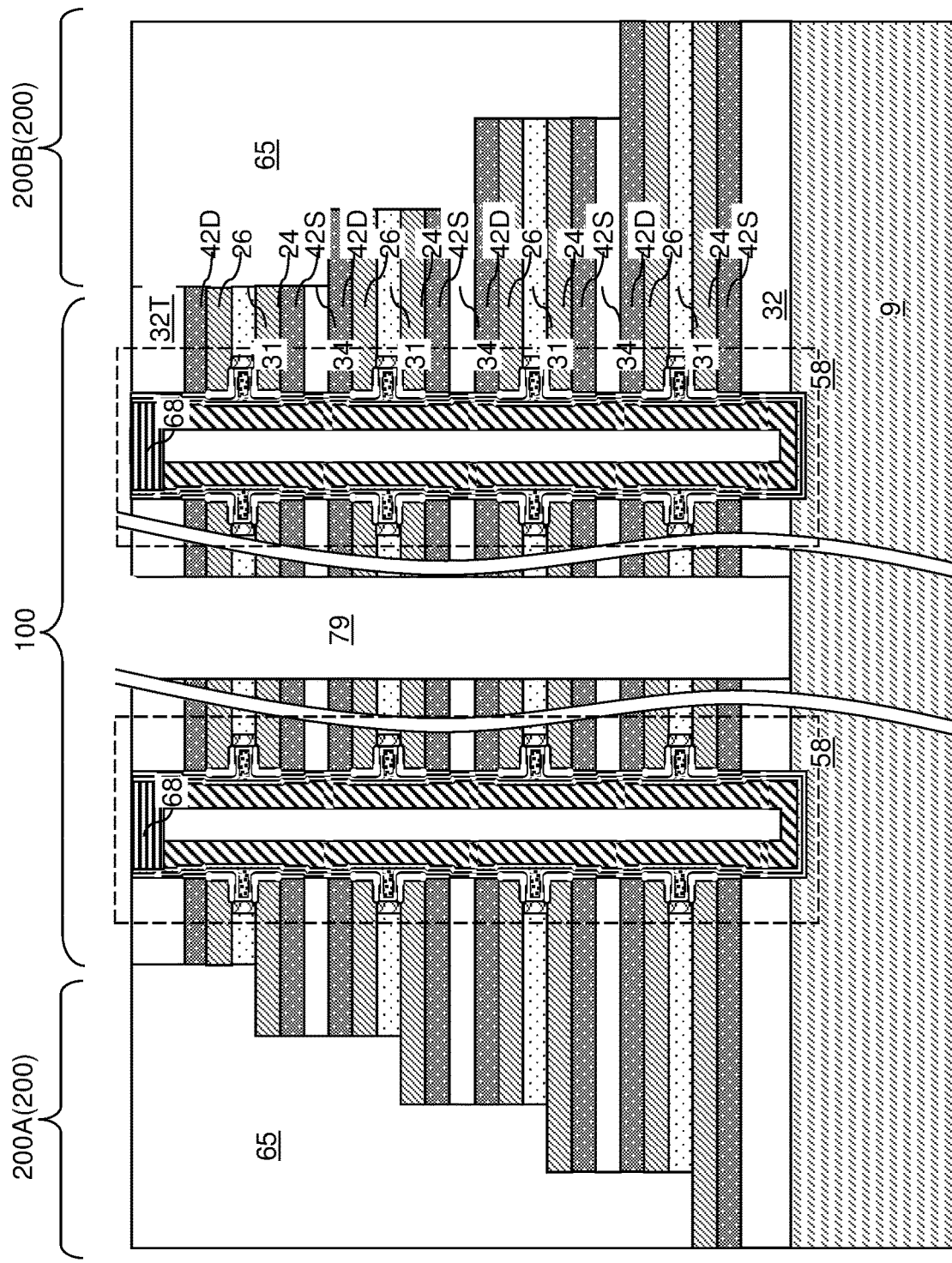
FIG. 8A is a schematic vertical cross-sectional view of the first exemplary structure after formation of a backside trench according to the first embodiment of the present disclosure.

Referring to FIGS. 8A and 8B, a photoresist layer (not shown) can be applied over the topmost insulating layer 32T, and can be lithographically patterned to form openings in areas between clusters of memory opening fill structures 58 and support pillar structures (if present). The pattern in the photoresist layer can be transferred through the topmost insulating layer 32T and the multiple instances of the unit layer stack (42S, 24, 31, 26, 42D, 34) employing an anisotropic etch to form backside trenches 79, which can vertically extend from the top surface of the topmost insulating layer 32T to the top surface of the substrate 9, and can laterally extend through the memory array region 100 and the staircase regions (200A, 200B).

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 58 can be arranged in rows that extend along the first horizontal direction hd1. Each backside trench 79 can have a uniform width that is invariant along the lengthwise direction (i.e., along the first horizontal direction hd1). Multiple rows of memory opening fill structures 58 can be located between a neighboring pair of backside trenches 79. The photoresist layer can be removed, for example, by ashing.

Figure 9:
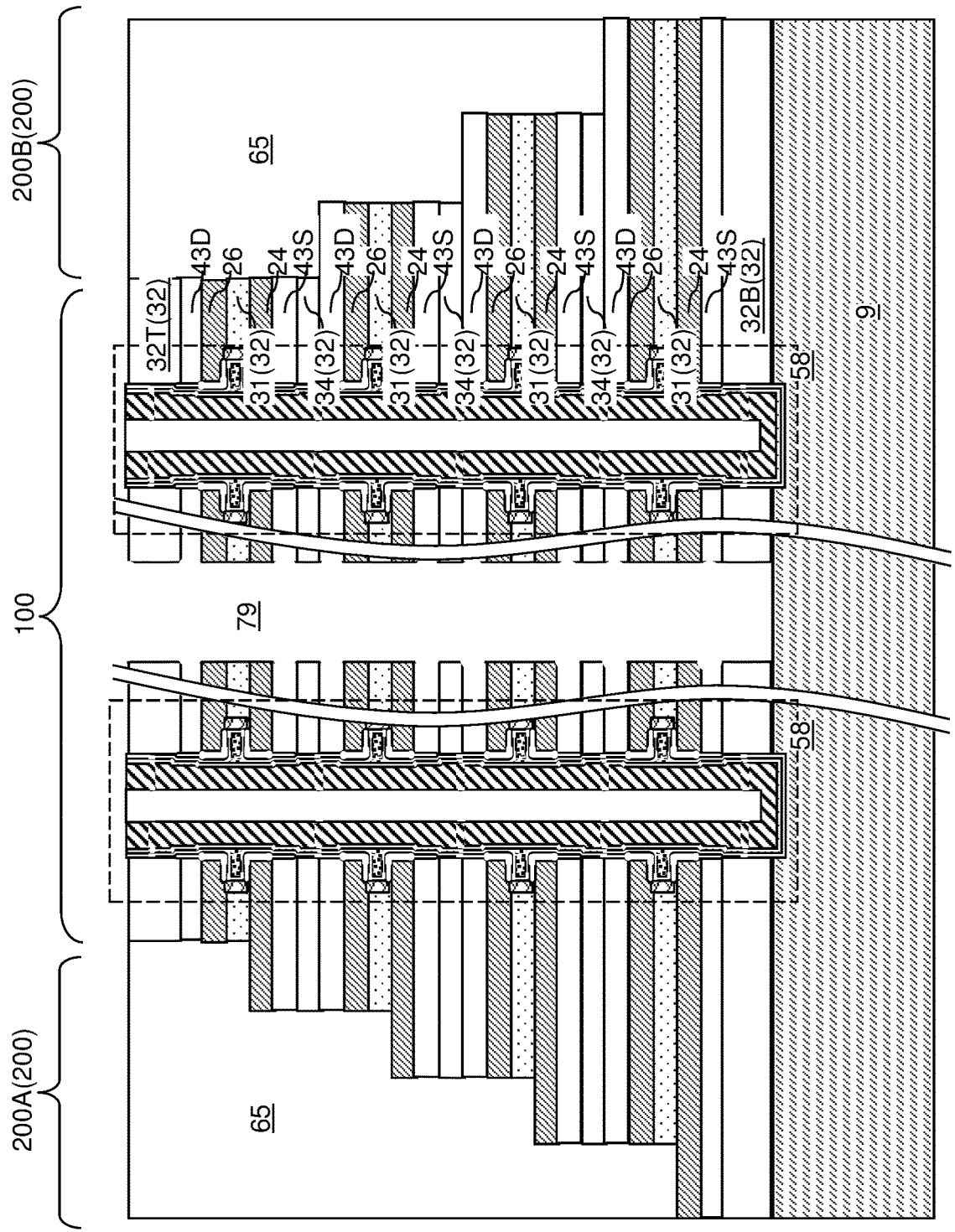
FIG. 9 is a schematic vertical cross-sectional view of the first exemplary structure after formation of source-level backside recesses and drain-level backside recesses according to the first embodiment of the present disclosure.

Referring to FIG. 9, an etchant that selectively etches the materials of the source sacrificial material layers 42S and drain sacrificial material layers 42D with respect to the materials of the insulating layers 32, the doped semiconductor source layers 24, the doped semiconductor drain layers 26, the retro-stepped dielectric material portions 65, and the semiconductor channels 60 can be introduced into the backside trenches 79, for example, employing an etch process. Source-level backside recesses 43S and drain-level backside recesses 43D are formed in volumes from which the source sacrificial material layers 42S and drain sacrificial material layers 42D are removed, respectively. In one embodiment, the source sacrificial material layers 42S and drain sacrificial material layers 42D can include silicon nitride, and the materials of the insulating layers 32 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials.

Each backside recess (43S, 43D) can be a laterally extending cavity having a lateral dimension that is greater than the vertical extent of the cavity. In other words, the lateral dimension of each backside recess (43S, 43D) can be greater than the height of the backside recess (43S, 43D). A plurality of source-level backside recesses 43S and the drain-level backside recesses 43D can be formed in the volumes from which the materials of the source sacrificial material layers 42S and drain sacrificial material layers 42D are removed. The memory openings in which the memory opening fill structures 58 are formed are herein referred to as front side openings or front side cavities in contrast with the source-level backside recesses 43S and the drain-level backside recesses 43D. Each of the plurality of source-level backside recesses 43S and the drain-level backside recesses 43D can extend substantially parallel to the top surface of the substrate 9. In one embodiment, each backside recess (43S, 43D) can have a uniform height throughout.

Figure 10:
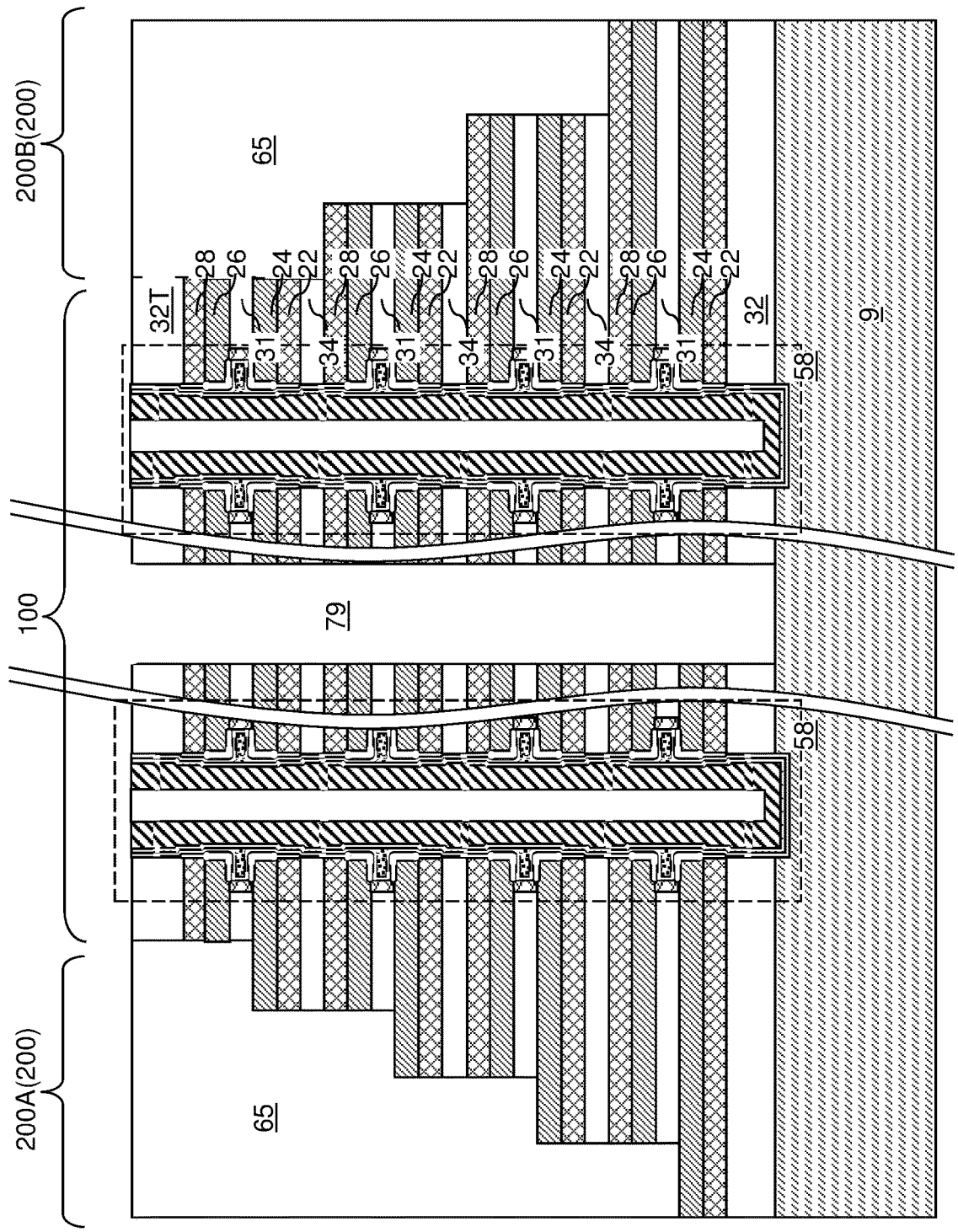
FIG. 10 is a schematic vertical cross-sectional view of the first exemplary structure after formation of metallic source layers and metallic drain layers according to the first embodiment of the present disclosure.

Referring to FIG. 10, at least one metallic material can be deposited in the source-level backside recesses 43S and the drain-level backside recesses 43D through the backside trenches 79. The at least one metallic material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. The at least one metallic material fills all volumes of the source-level backside recesses 43S and the drain-level backside recesses 43D. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers 22, which function as portions of electrically conductive source layers. Remaining portions of the at least one metallic material that fills the drain-level backside recesses 43D constitute metallic drain layers 28, which function as portions of electrically conductive bit layers.

Each contiguous combination of a doped semiconductor source layer 24 and a metallic source layer 22 constitutes a source layer (22, 24) that functions as a combination of a source region and a source line for a respective two-dimensional array of vertical field effect transistors. Each contiguous combination of a doped semiconductor drain layer 26 and a metallic drain layer 28 constitutes a drain layer (26, 28) that functions as a combination of a drain region and a bit line for a respective two-dimensional array of vertical field effect transistors.

Generally, the source sacrificial material layer 42S and the drain-level sacrificial material layers 42D are replaced with the metallic source layers 22 and the metallic drain layers 28 (i.e., source lines and bit lines), respectively. In this case, each of the source layers (22, 24) comprises a vertical stack of a doped semiconductor source layer 24 and a metallic source layer 22, and each of the drain layers (26, 28) comprises a vertical stack of a doped semiconductor drain layer 26 and a metallic drain layer 28. An alternating stack of source layers (22, 24) and drain layers (26, 28) is formed over the substrate 9.

Insulating layers (31, 34) are located between each vertically neighboring pair of a source layer (22, 24) and drain layer (26, 28). The channel-level spacer layers 31 have a different composition than the inter-transistor-level insulating layers 34. In one embodiment, each semiconductor channel 60 contacts a cylindrical sidewall of a respective channel-level spacer layer 31 located between a respective vertically neighboring pair of a source layer (22, 24) and a drain layer (26, 28). The insulating layers 32 are interlaced with the source layers (22, 24) and the drain layers (26, 28) of the alternating stack of source layers (22, 24) and drain layers (26, 28). The insulating layers 32 comprise channel-level insulating layers (comprising channel-level spacer layers 31) in contact with a respective one of the semiconductor channels 60, and inter-transistor-level insulating layers 34 located between vertically neighboring pairs of the channel-level insulating layers (comprising channel-level spacer layers 31) and not contacting any of the semiconductor channels 60.

Semiconductor oxide spacers 57 laterally contact a respective one of the source layers (22, 24) and the drain layers (26, 28). The semiconductor oxide spacers 57 contact a respective one of the semiconductor channels 60. The first vertically extending segments 571 and the laterally extending portions 573 of the semiconductor oxide spacers 57 are formed by oxidation of doped semiconductor material portions, i.e., portions of the doped semiconductor source layers 24 and the doped semiconductor drain layers 26. As such, the first vertically extending segments 571 and the laterally extending portions 573 of the semiconductor oxide spacers 57 can include dopants of the first conductivity type at an atomic concentration in a range from $1.0 \times 10^{16}/cm^3$ to $1.0 \times 10^{19}/cm^3$. In contrast, the second vertically extending segments 572 of the semiconductor oxide spacers 57 can be substantially free of dopants of the first conductivity type, i.e., may contain dopants of the first conductivity type at an atomic concentration less than $1.0 \times 10^{16}/cm^3$, such as less than $1.0 \times 10^{13}/cm^3$.

In one embodiment, the channel-level insulating layers 31 comprise a doped semiconductor oxide material (e.g., phosphorus doped silicon oxide, such as phosphosilicate glass), and the inter-transistor-level insulating layers 34 comprise a semiconductor oxide material (e.g., undoped silicon oxide) having an etch rate in 100:1 dilute hydrofluoric acid at room temperature that is less than 30% of an etch rate of the doped semiconductor oxide material in 100:1 dilute hydrofluoric acid at room temperature.

Figure 11:
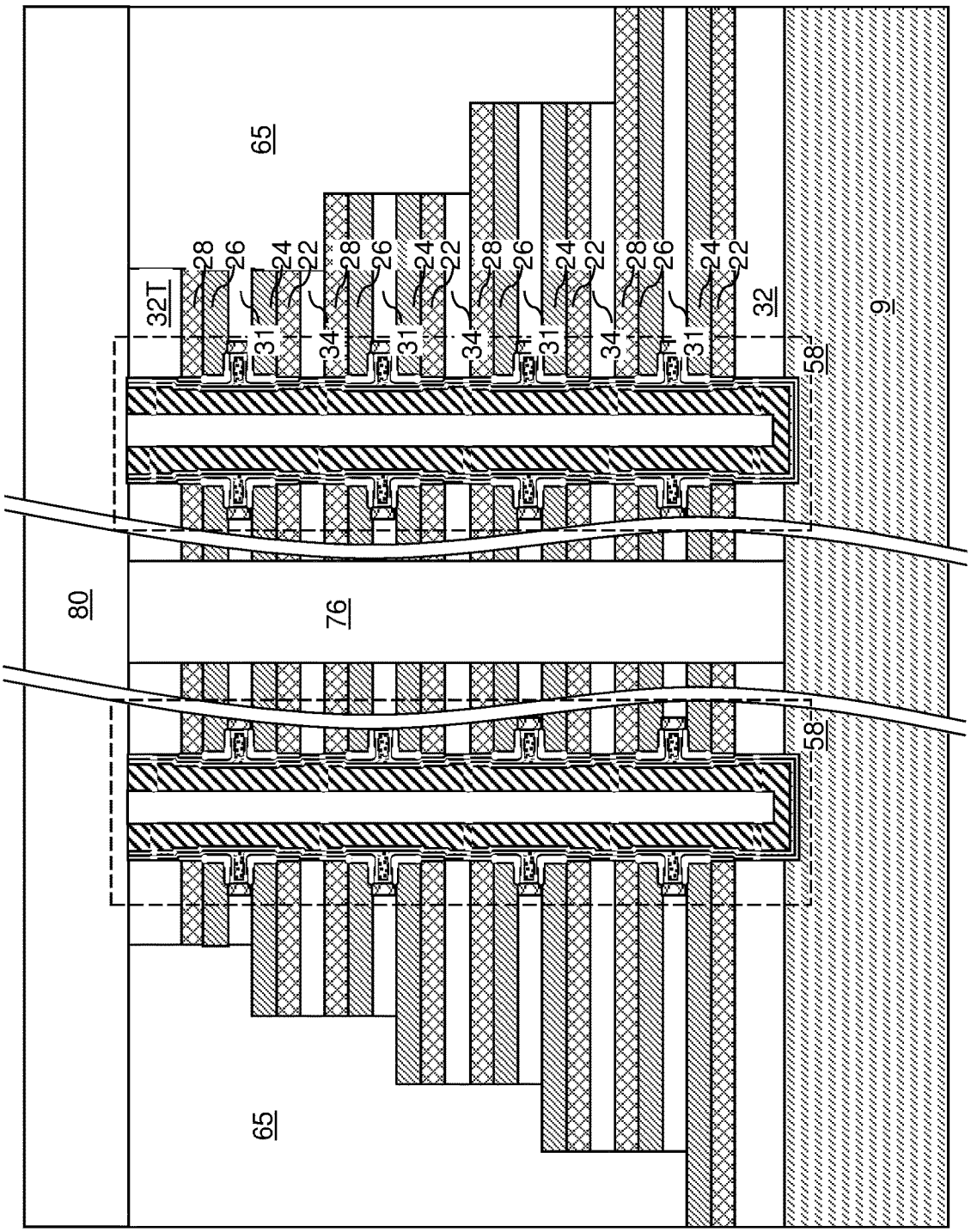
FIG. 11 is a schematic vertical cross-sectional view of the first exemplary structure after formation of a backside trench fill structure according to the first embodiment of the present disclosure.

Referring to FIG. 11, a dielectric material such as silicon oxide can be deposited in each backside trench to form backside trench fill structures 76. Portions of the dielectric material that is deposited over the topmost insulating layer 32T can constitute a contact-level dielectric layer 80. Each backside trench fill structure 76 can vertically extend through the multiple instances of a unit layer stack including a metallic source layer 22, a doped semiconductor source layer 24, a channel-level spacer layer 31, a doped semiconductor drain layer 26, a metallic drain layer 28, and an inter-transistor-level insulating layer 34.

Figure 12A:
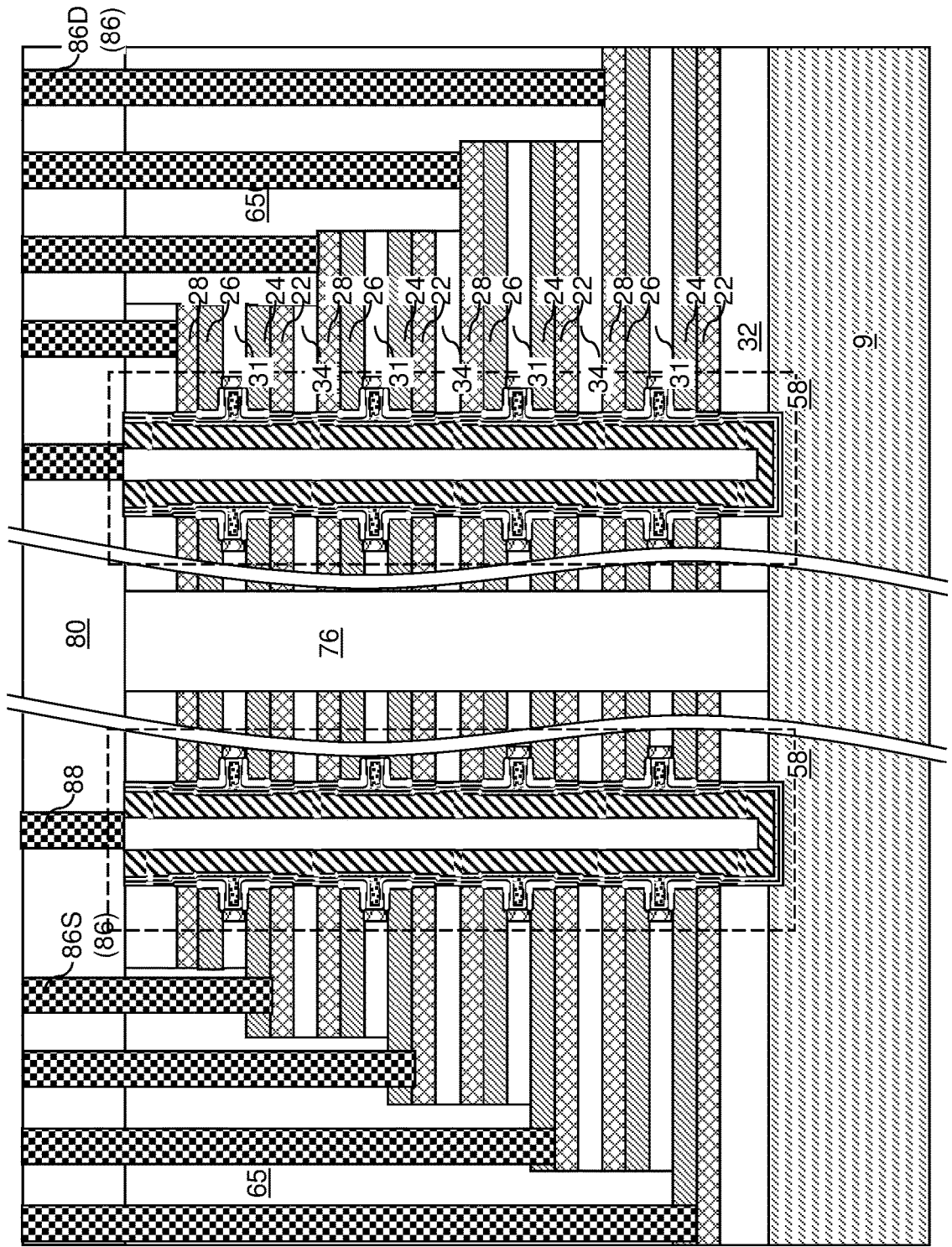
FIG. 12A is a schematic vertical cross-sectional view of the first exemplary structure after formation of contact via structures according to the first embodiment of the present disclosure.
Figure 12B:
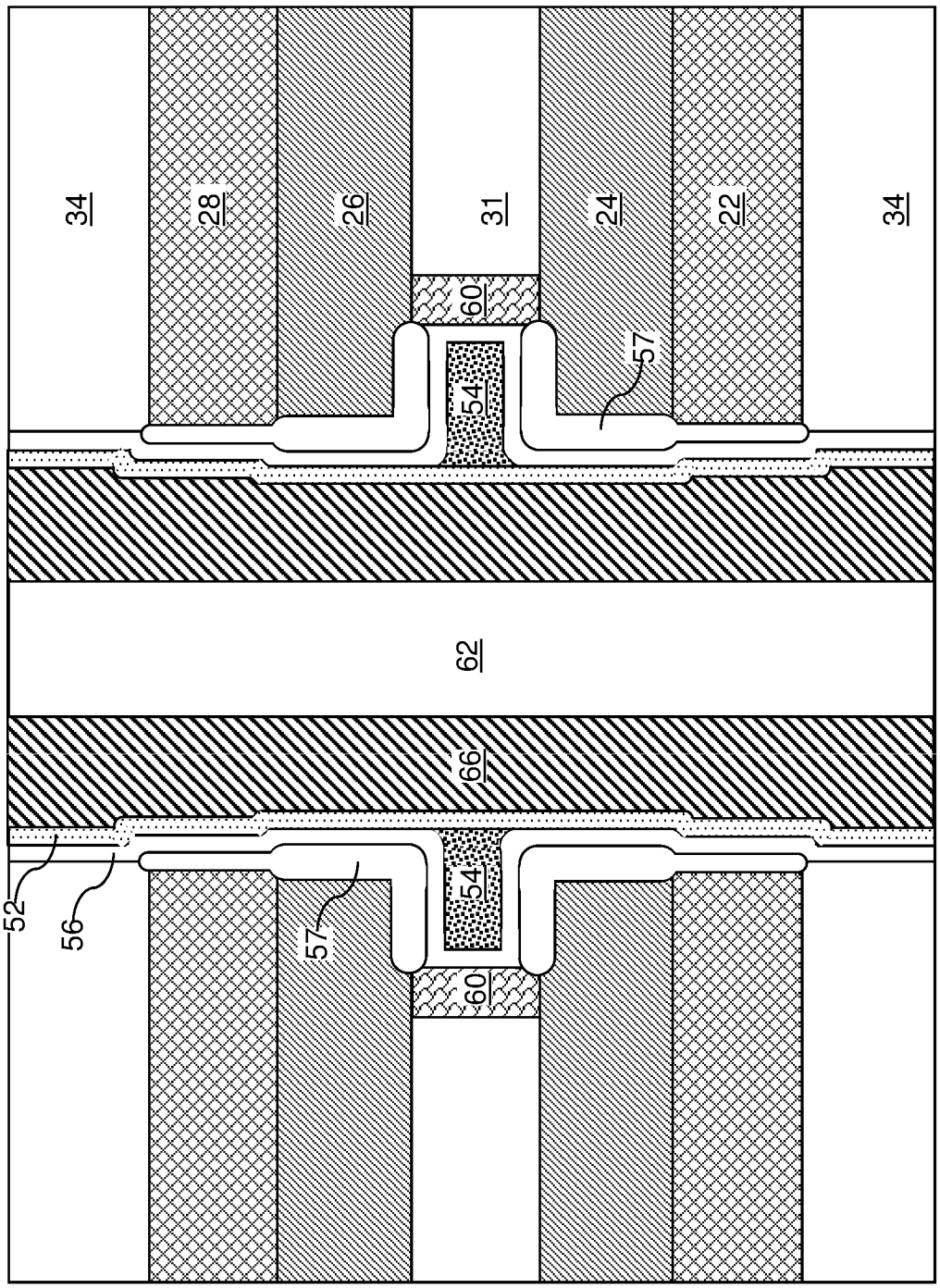
FIG. 12B is a schematic vertical cross-sectional view of a region of the first exemplary structure of FIG. 12A around a semiconductor channel.

Referring to FIGS. 12A and 12B, contact via structures (88, 86) can be formed through the contact-level dielectric layer 80 and optionally through a retro-stepped dielectric material portion 65. The contact via structures (88, 86) include word line contact via structures 88 each of which contacts a respective one of the contact pad structures 68 (if present, or one of the vertical word lines 66), and is electrically connected to a respective vertical word line 66. Word line interconnect lines can be subsequently formed over the contact-level dielectric layer 80. Each of the word line interconnect lines can be in electrical contact with a respective one of the vertical word lines 66 through a respective contact via structure 88 and optionally through a respective contact pad structure 68.

Further, the contact via structures (88, 86) include layer contact via structures 86 that contact a respective one of the source layers (22, 24) and the drain layers (26, 28) within the respective staircase regions (200A, 200B). The layer contact via structures 86 include source layer contact via structures 86S and drain layer contact via structures 86D. Each source layer contact via structure 86S contacts a respective one of the source layers (22, 24). Each drain layer contact via structure 86D contacts a respective one of the drain layers (26, 28). Source interconnect lines (not shown) and drain interconnect lines (not shown) can be subsequently formed over the contact-level dielectric layer 80 to electrically connect each of the layer contact via structures (86S, 86D) to a respective node of a driver circuit, which includes source line drivers, bit line drivers, and a sensing circuit.

In one embodiment, the source layers (22, 24) in the alternating stack of source layers (22, 24) and drain layers (26, 28) have different lateral extents that decrease with a vertical distance from the substrate 9, and the drain layers (26, 28) in the alternating stack of source layers (22, 24) and drain layers (26, 28) have different lateral extents that decrease with a vertical distance from the substrate 9. A first retro-stepped dielectric material portion 65 contacts horizontal surfaces of the source layers (22, 24) in the alternating stack and laterally surrounds the source layer contact via structures 86S. A second retro-stepped dielectric material portion 65 contacts horizontal surfaces of the drain layers (26, 28) in the alternating stack and laterally surrounds the drain layer contact via structures 86D. The memory material portions 54 comprise charge trapping material portions or floating gate structures that are laterally spaced from a most proximal one of the vertical word lines 66 by a respective blocking dielectric layer 52.

Figure 12C:
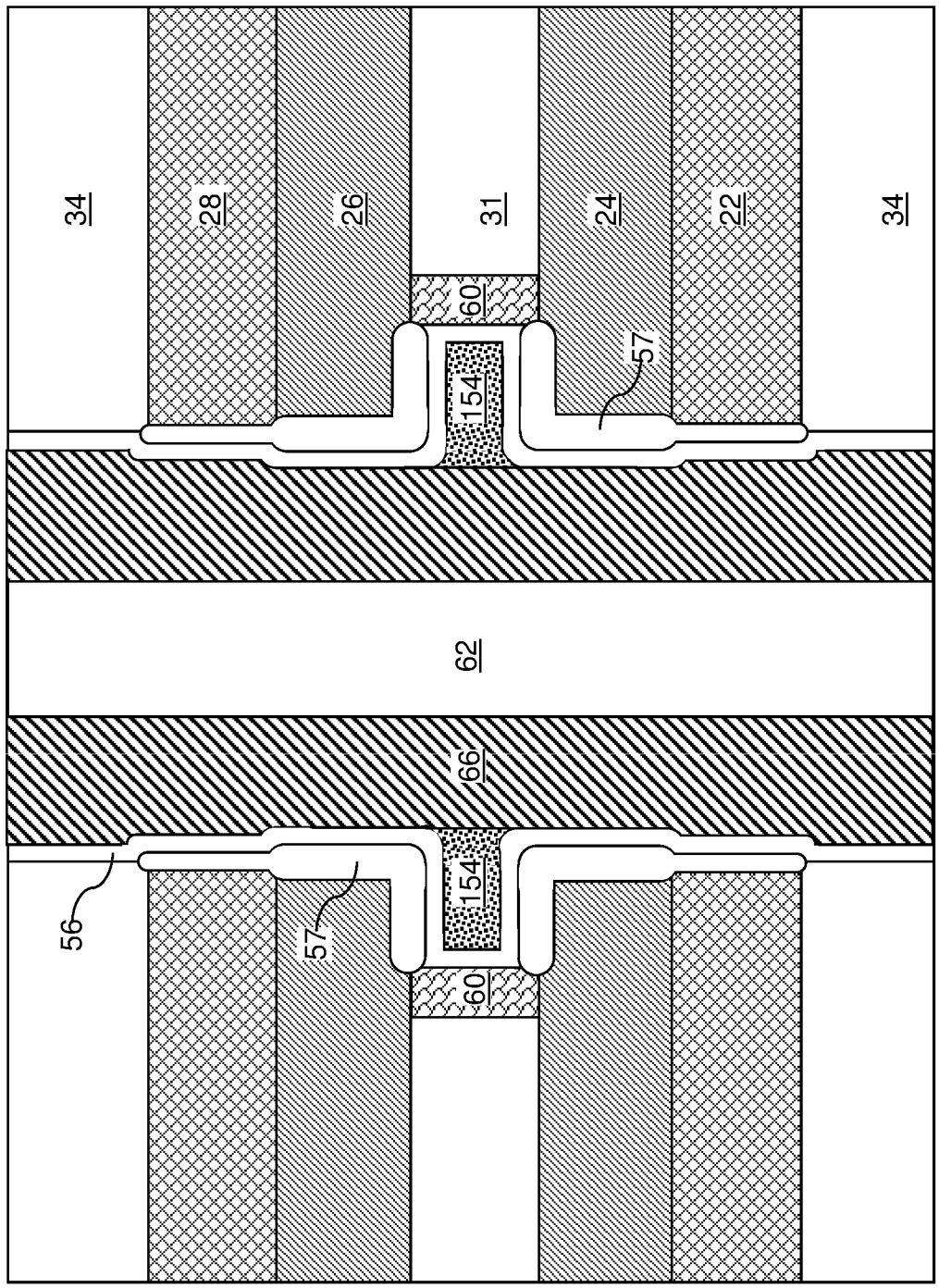
FIG. 12C is a schematic vertical cross-sectional view of a region of an alternative configuration of the first exemplary structure at a processing step corresponding to the processing steps of FIGS. 12A and 12B.

Referring to FIG. 12C, an alternative configuration of the first exemplary structure can be derived from the first exemplary structure by employing the alternative configuration illustrated in FIG. 5I. Specifically, a vertical stack of memory material portions 154 that are ferroelectric material portions is employed in each memory opening 49 in lieu of the combination of a blocking dielectric layer 52 and a vertical stack of memory material portions 54 that include charge trapping material portions or floating gate structures. The ferroelectric material portions can contact a most proximal one of the vertical word lines 66.

Figure 13:
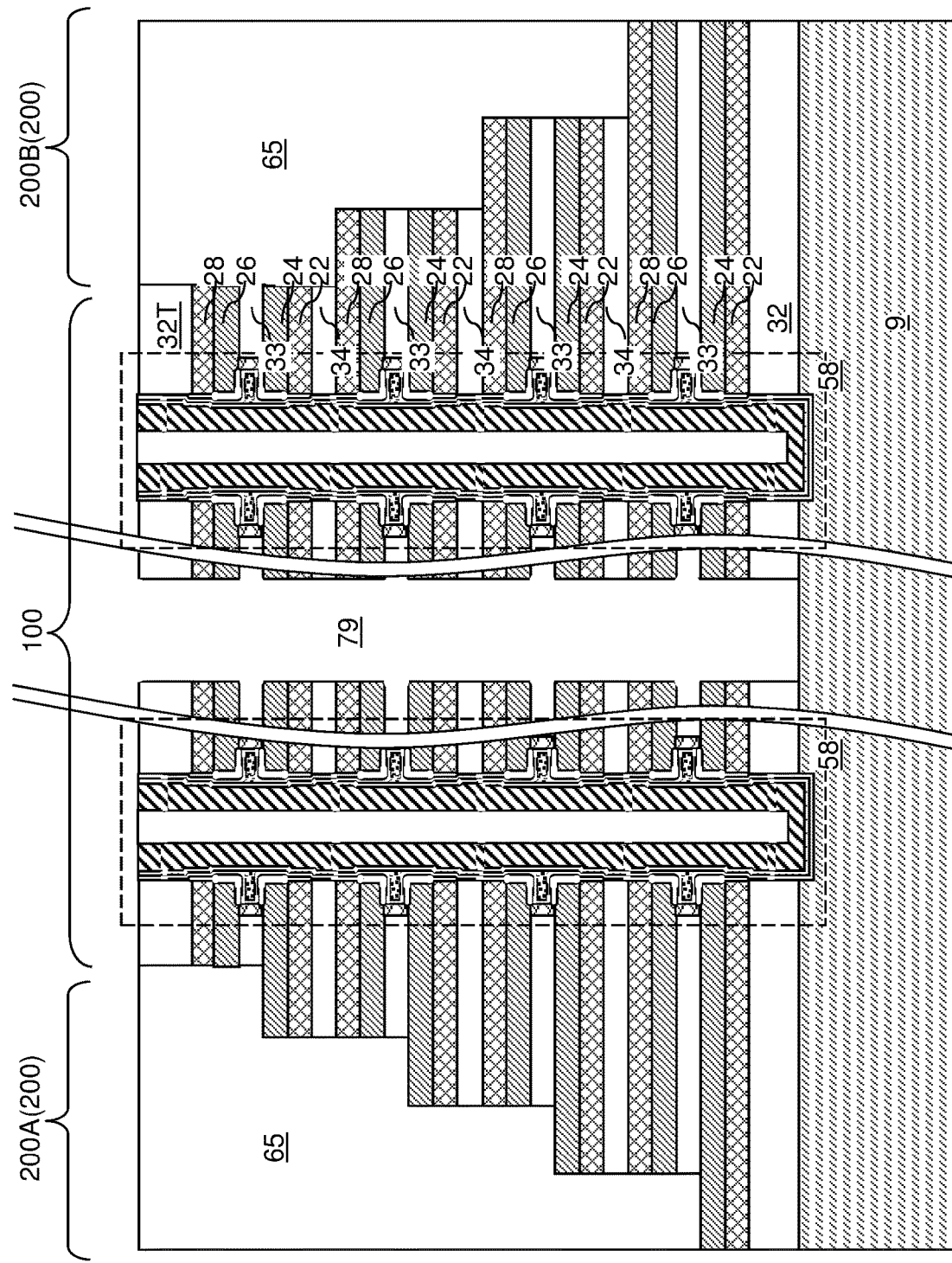
FIG. 13 is a schematic vertical cross-sectional view of a second exemplary structure after formation of channel-level cavities by selective removal of channel-level spacer layers according to a second embodiment of the present disclosure.

Referring to FIG. 13, a second exemplary structure according to a second embodiment of the present disclosure is illustrated. The second exemplary structure employs a sacrificial material for the channel-level spacer layers 31. The sacrificial material of the channel-level spacer layers 31 includes a material that can be removed selective to the materials of the doped semiconductor source layers 24, the doped semiconductor drain layers 26, the metallic source layers 22, the metallic drain layers 28, and the inter-transistor-level insulating layers 34. The sacrificial material of the channel-level spacer layers 31 can be replaced with a dielectric (i.e., insulating) material to form channel-level insulating layers. In case the sacrificial material of the channel-level spacer layers 31 includes an insulating material, the insulating material of the channel-level spacer layers 31 can be subsequently replaced with a dielectric material having a lower dielectric constant, or may be replaced with cavity-containing (i.e., airgap-containing) dielectric material portions (which lowers the effective dielectric constant and reduces capacitive coupling between neighboring pairs of a doped semiconductor source layer 24 and a doped semiconductor drain layer 26).

The sacrificial material of the channel-level spacer layers 31 may, or may not, be an insulating material. For example, the sacrificial material of the channel-level spacer layers 31 can include borosilicate glass, porous or non-porous organosilicate glass, amorphous carbon, diamond-like carbon (DLC), a polymer material, a dielectric metal oxide (e.g., aluminum oxide), a silicon-germanium alloy having an atomic concentration of germanium greater than 20%, or a metallic material that is different from the metallic materials of the metallic source layers 22 and the metallic drain layers 28. The inter-transistor-level insulating layers 34 can include undoped silicate glass. In case the sacrificial material of the channel-level spacer layers 31 includes borosilicate glass or porous or non-porous organosilicate glass, the etch rate of the material of the channel-level spacer layers 31 in 100:1 diluted hydrofluoric acid can be at least 10 times, such as 100 or more times, the etch rate of the material of the inter-transistor-level insulating layers 34 in 100:1 diluted hydrofluoric acid. In one embodiment, the inter-transistor-level insulating layers 34 can comprise a semiconductor oxide material (such as undoped silicate glass formed by decomposition of tetraethylorthosilicate) having an etch rate in 100:1 dilute hydrofluoric acid at room temperature that is less than 30%, such as less than 10% and/or less than 1%, of an etch rate of the doped semiconductor oxide material (which may be a borosilicate glass material or a porous or non-porous organosilicate glass material) in 100:1 dilute hydrofluoric acid at room temperature.

The second semiconductor structure of FIG. 13 can be derived from the first exemplary structure of FIG. 10, modified with an optional change in the material composition of the channel-level spacer layers 31. Specifically, channel-level cavities 33 can be formed by removing the channel-level spacer layers 31 selective to the materials of the doped semiconductor source layers 24, the doped semiconductor drain layers 26, the metallic source layers 22, the metallic drain layers 28, and the inter-transistor-level insulating layers 34 employing an isotropic etch process or an ashing process. In case the channel-level spacer layers 31 include borosilicate glass or porous or non-porous organosilicate glass, an isotropic wet etch process employing dilute hydrofluoric acid can be employed to form the channel-level cavities 33. In case the sacrificial material of the channel-level spacer layers 31 includes amorphous carbon, diamond-like carbon (DLC), or a polymer material, an ashing process or an isotropic etch process that ashes or etches the sacrificial material of the channel-level spacer layers 31 may be performed to form the channel-level cavities 33.

Figure 14:
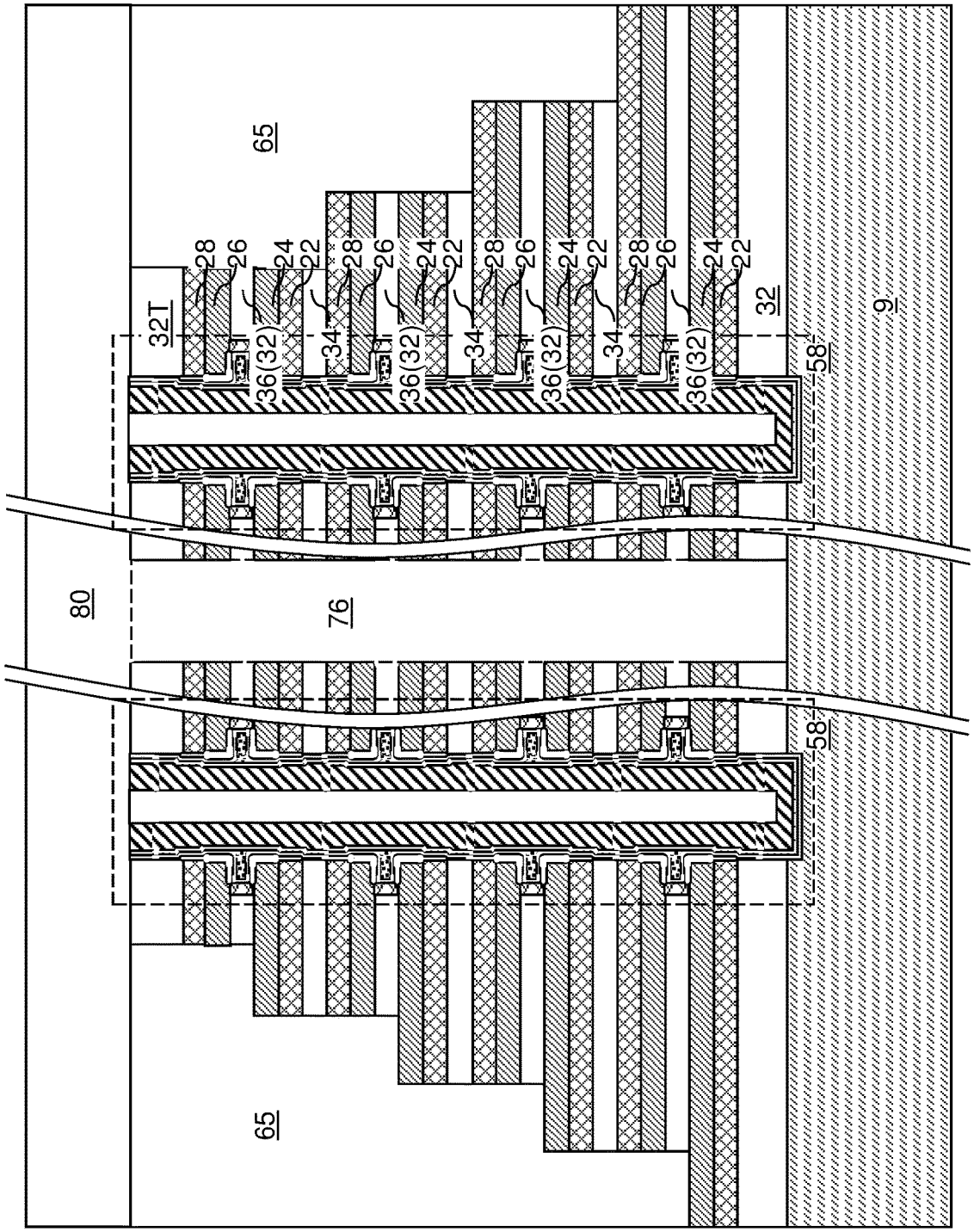
FIG. 14 is a schematic vertical cross-sectional view of the second exemplary structure after formation of channel-level insulating layers, a backside trench fill structure, and a contact-level insulating layer according to the second embodiment of the present disclosure.

Referring to FIG. 14, a dielectric material can be conformally or non-conformally deposited in the channel-level cavities 33 and the backside trenches 79. The deposited dielectric material can include a low dielectric constant (low-k) dielectric material such as porous or non-porous organosilicate glass (OSG). In one embodiment, the low-k dielectric material can be deposited conformally in the channel-level cavities 33 to fill the channel-level cavities 33. Portions of the deposited dielectric material that fills the channel-level cavities 33 comprise channel-level insulating layers 36, which are insulating layers 32. In one embodiment, the channel-level insulating layers 36 can fill the entirety of a respective channel-level cavity 33 without any void therein. Portions of the deposited dielectric material that fills the backside trenches 79 comprise backside trench fill structure 76. Portions of the dielectric material that is deposited over the topmost insulating layer 32T can constitute a contact-level dielectric layer 80. Each backside trench fill structure 76 can vertically extend through the multiple instances of a unit layer stack including a metallic source layer 22, a doped semiconductor source layer 24, a channel-level insulating layer 36, a doped semiconductor drain layer 26, a metallic drain layer 28, and an inter-transistor-level insulating layer 34.

Figure 15A:
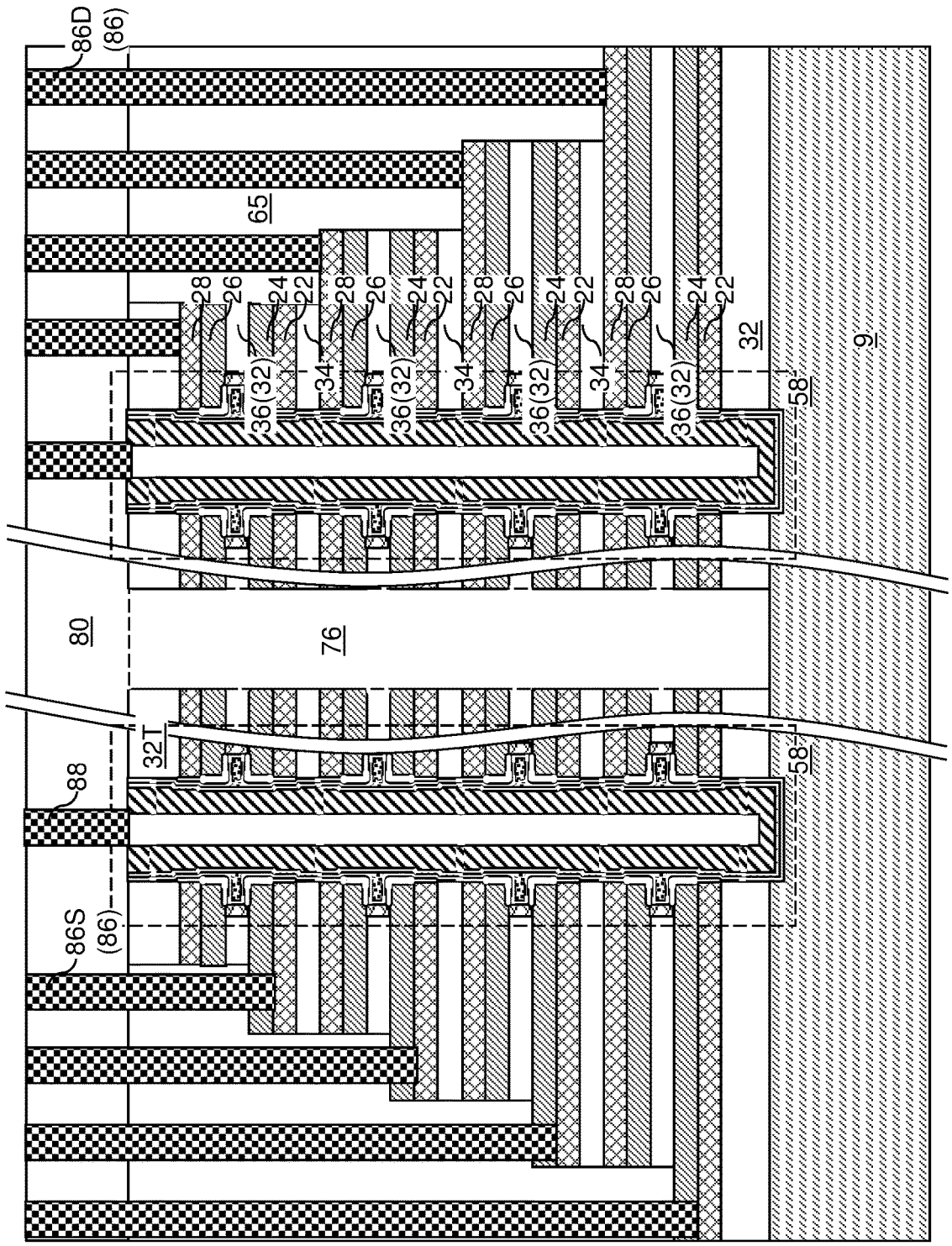
FIG. 15A is a schematic vertical cross-sectional view of the second exemplary structure after formation of contact via structures according to the second embodiment of the present disclosure.
Figure 15B:
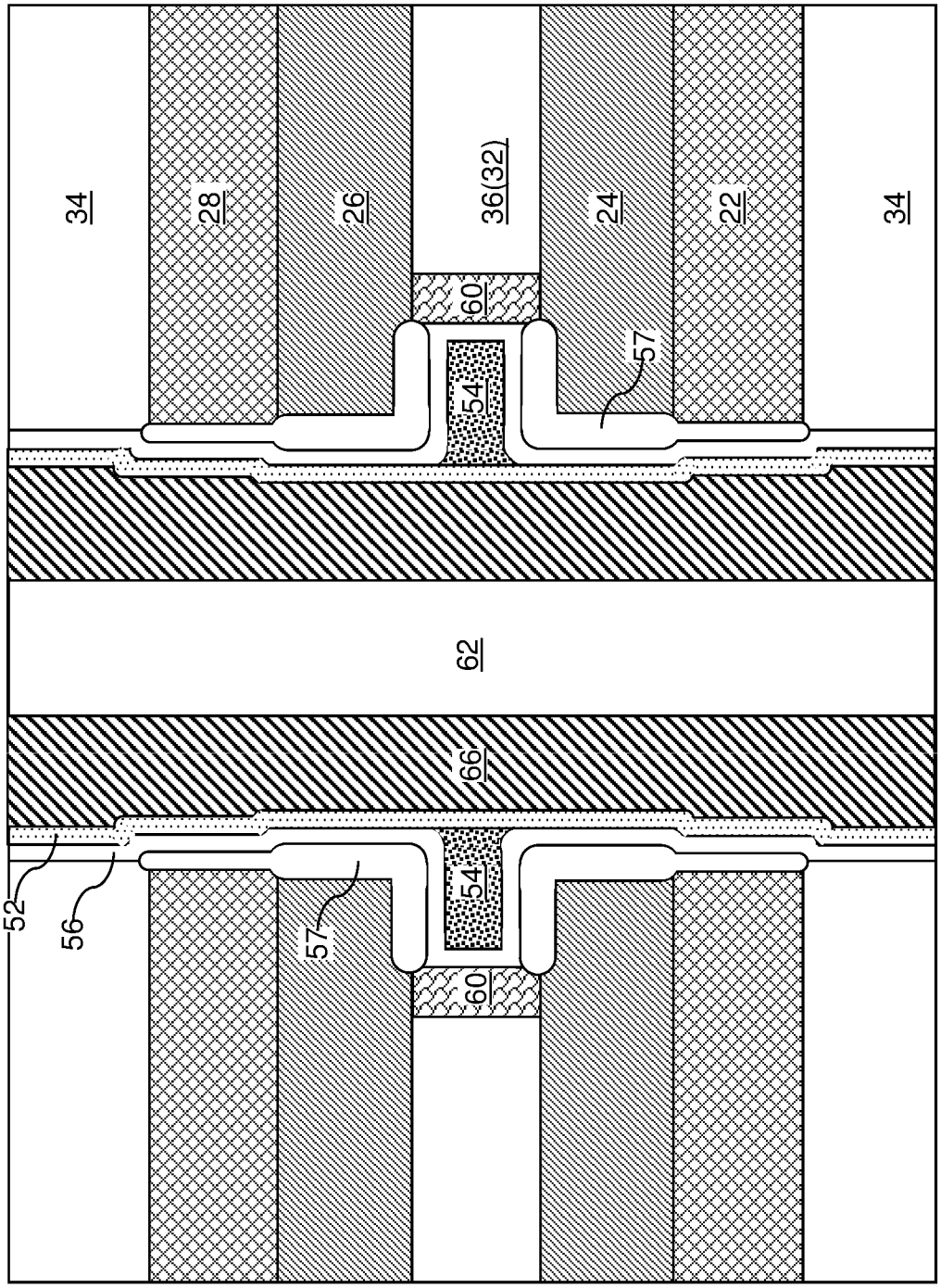
FIG. 15B is a schematic vertical cross-sectional view of a region of the second exemplary structure of FIG. 15A around a semiconductor channel.

Referring to FIGS. 15A and 15B, contact via structures (88, 86) can be formed through the contact-level dielectric layer 80 and optionally through a retro-stepped dielectric material portion 65, as described above with respect to FIG. 12A. The memory material portions 54 comprise charge trapping material portions or floating gate structures that are laterally spaced from a most proximal one of the vertical word lines 66 by a respective blocking dielectric layer 52.

Figure 15C:
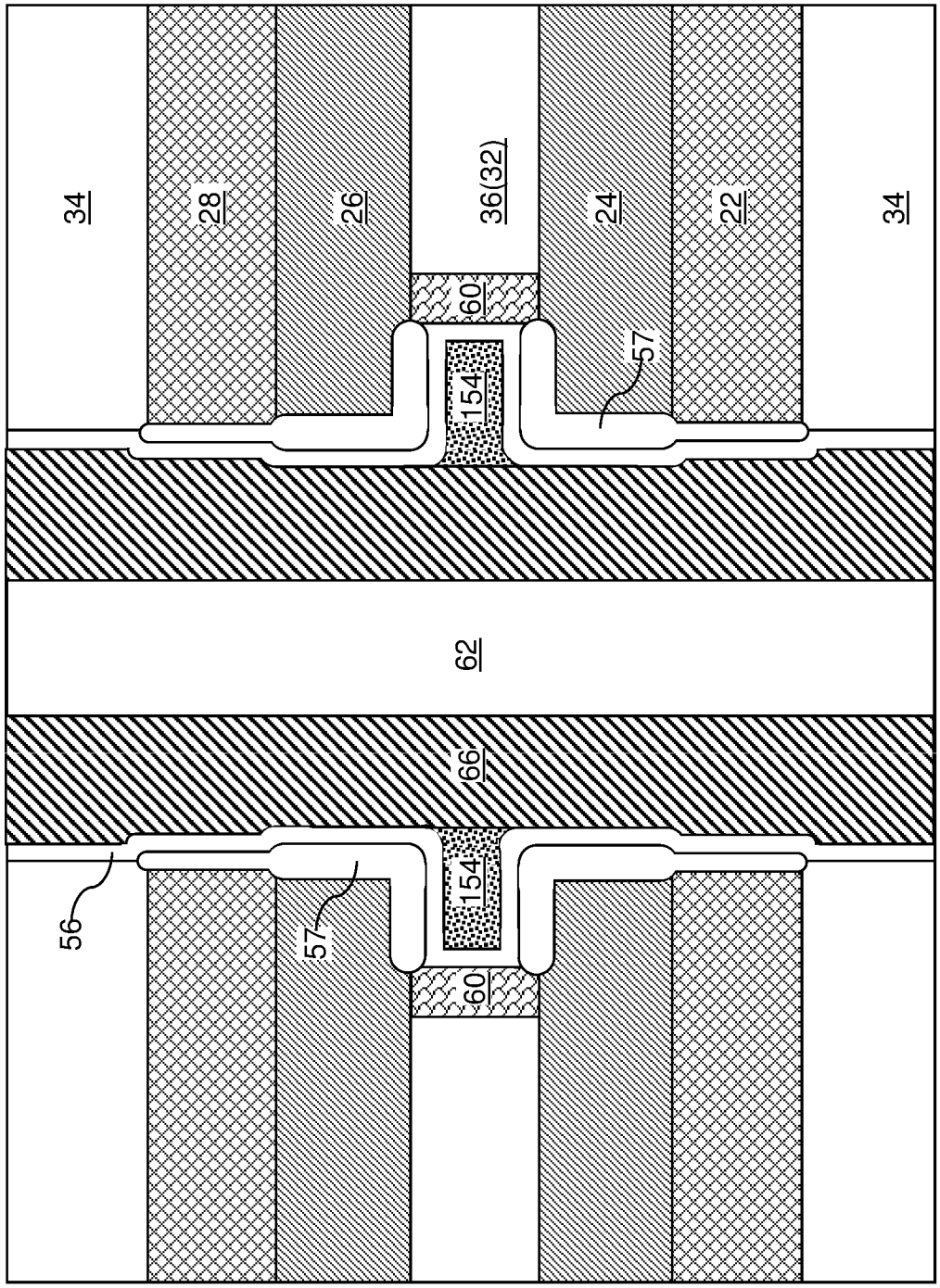
FIG. 15C is a schematic vertical cross-sectional view of a region of a first alternative configuration of the second exemplary structure at a processing step corresponding to the processing steps of FIGS. 15A and 15B.

Referring to FIG. 15C, a first alternative configuration of the second exemplary structure can be derived from the second exemplary structure by employing the alternative configuration of the first exemplary structure illustrated in FIG. 5I. Specifically, a vertical stack of memory material portions 154 that are ferroelectric material portions is employed in each memory opening 49 in lieu of the combination of a blocking dielectric layer 52 and a vertical stack of memory material portions 54 that include charge trapping material portions or floating gate structures. The ferroelectric material portions can contact a most proximal one of the vertical word lines 66.

An alternating stack of source layers (22, 24) and drain layers (26, 28) are formed over the substrate 9. Insulating layers 32 are interlaced with the source layers (22, 24) and the drain layers (26, 28) of the alternating stack {(22, 24), (26, 28)}. The insulating layers 32 comprise channel-level insulating layers 36 in contact with a respective one of the semiconductor channels 60, and inter-transistor-level insulating layers 34 located between vertically neighboring pairs of the channel-level insulating layers 36 and not contacting any of the semiconductor channels 60.

Figure 16A:
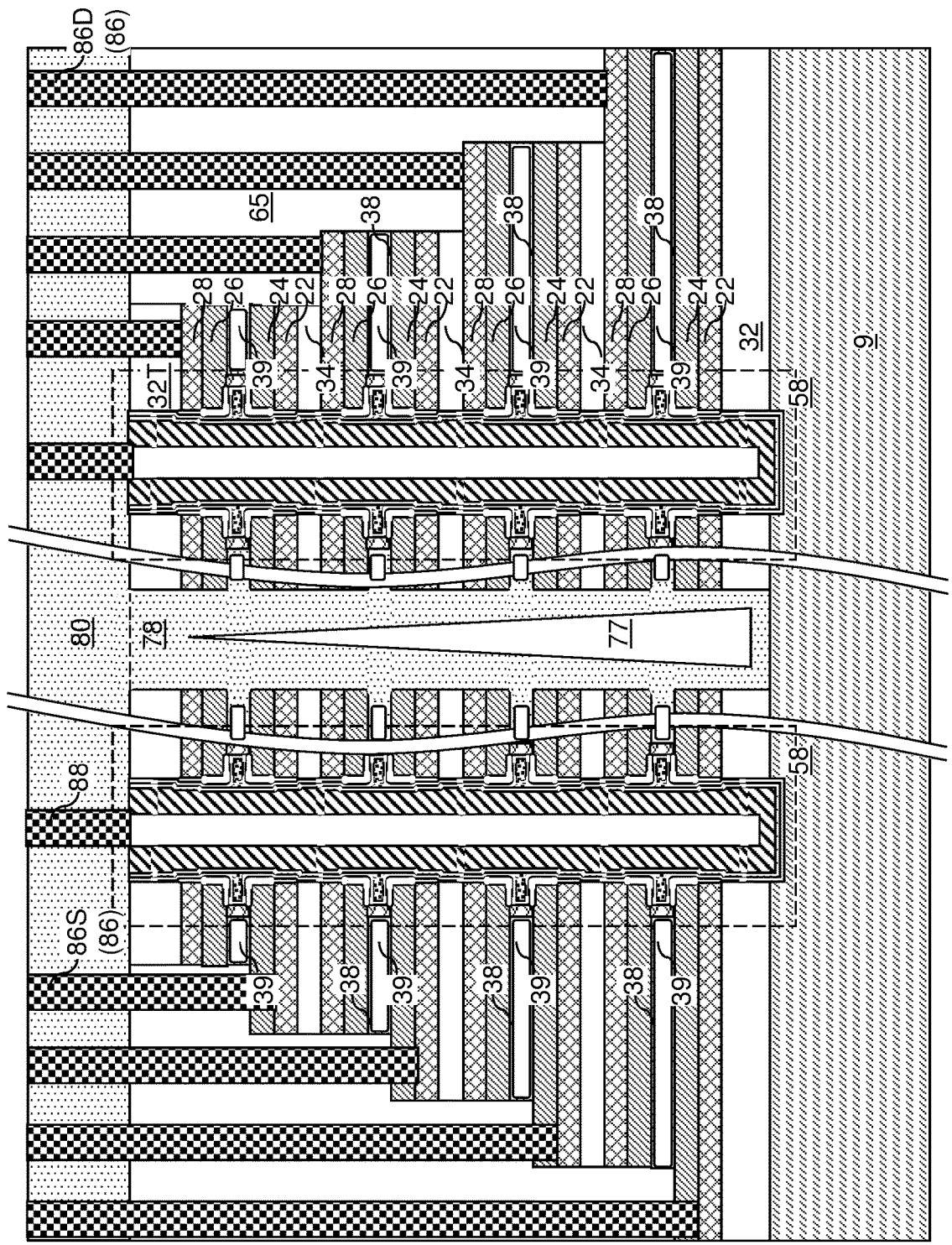
FIG. 16A is a schematic vertical cross-sectional view of a second alternative configuration of the second exemplary structure after formation of contact via structures according to the second embodiment of the present disclosure.
Figure 16B:
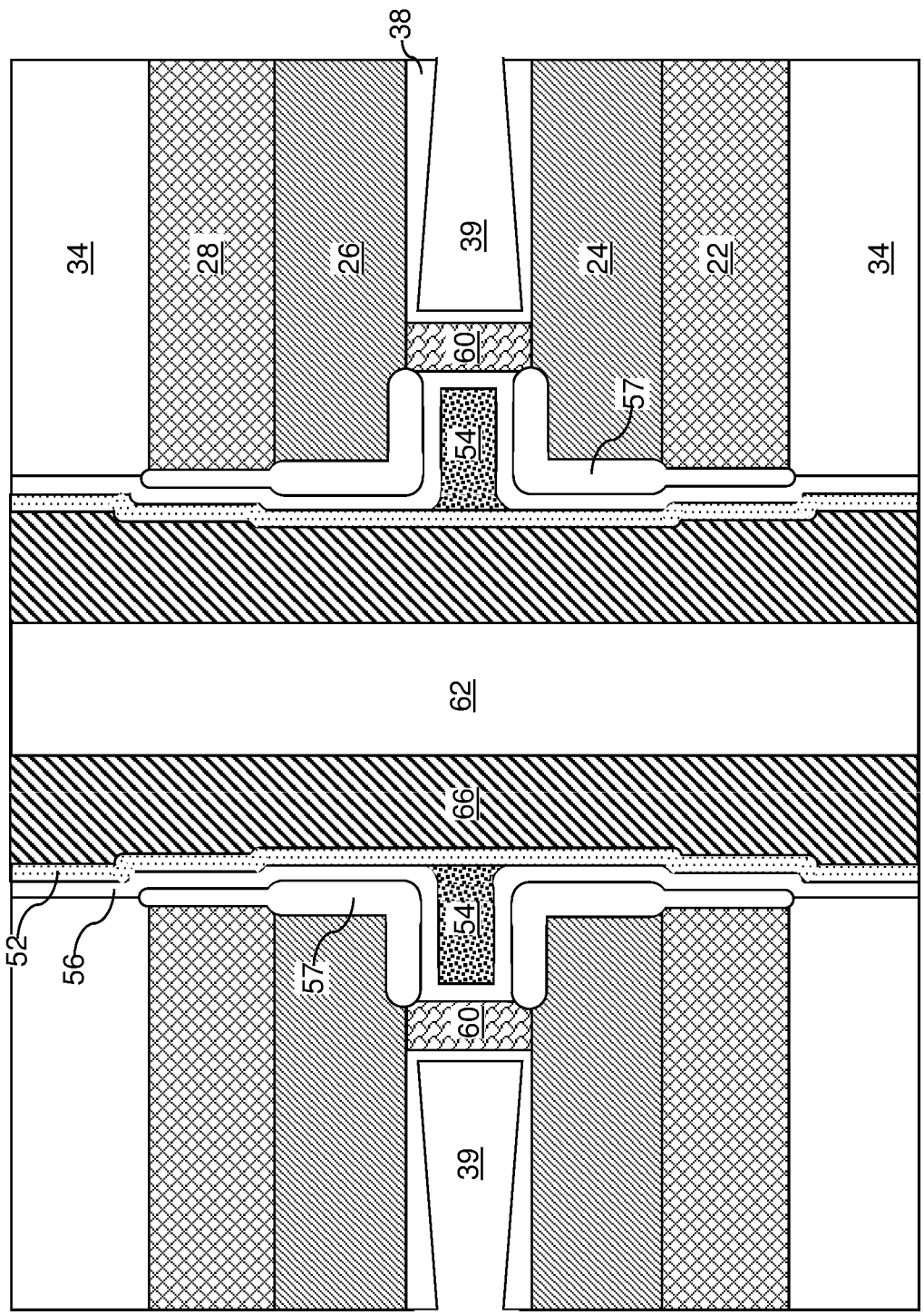
FIG. 16B is a schematic vertical cross-sectional view of a region of the second alternative configuration of the second exemplary structure of FIG. 16A around a semiconductor channel.

Referring to FIGS. 16A and 16B, a second alternative configuration of the second exemplary structure can be derived from the second exemplary structure illustrated in FIG. 13 by non-conformally depositing a dielectric material in the channel-level cavities 33. Channel-level insulating layers 38 are formed in the channel-level cavities 33 with encapsulated cavities (i.e., airgaps) 39 therein. Specifically, each of the channel-level insulating layers 38 can be formed as a dielectric encapsulation layer that embeds a respective encapsulated cavity 39 that is free of any solid phase material therein. In one embodiment, each dielectric encapsulation layer of the channel-level insulating layers 38 can include undoped silicate glass, a doped silicate glass, or porous or non-porous organosilicate glass. Each channel-level insulating layer 38 can include a dielectric encapsulation layer and an encapsulated cavity 39. The volume of an encapsulated cavity 39 may be in a range from 1% to 90% of the entire volume of a respective channel-level insulating layer 38 that includes the encapsulated cavity 39. An encapsulated cavity 39 may continuously laterally surround a plurality of memory opening fill structures 58.

Each portion of the non-conformally deposited dielectric material in the backside trenches 79 comprises a backside trench fill structure 78 that embeds a respective vertically-extending encapsulated cavity (i.e., airgap) 77. The portion of the non-conformally deposited dielectric material that is deposited above the top surface of the topmost insulating layer 32T comprises a contact-level dielectric layer 80. The processing steps of FIGS. 12A and 12B can be subsequently performed to form various contact via structures (88, 86S, 86D). The memory material portions 54 comprise charge trapping material portions or floating gate structures that are laterally spaced from a most proximal one of the vertical word lines 66 by a respective blocking dielectric layer 52.

Figure 16C:
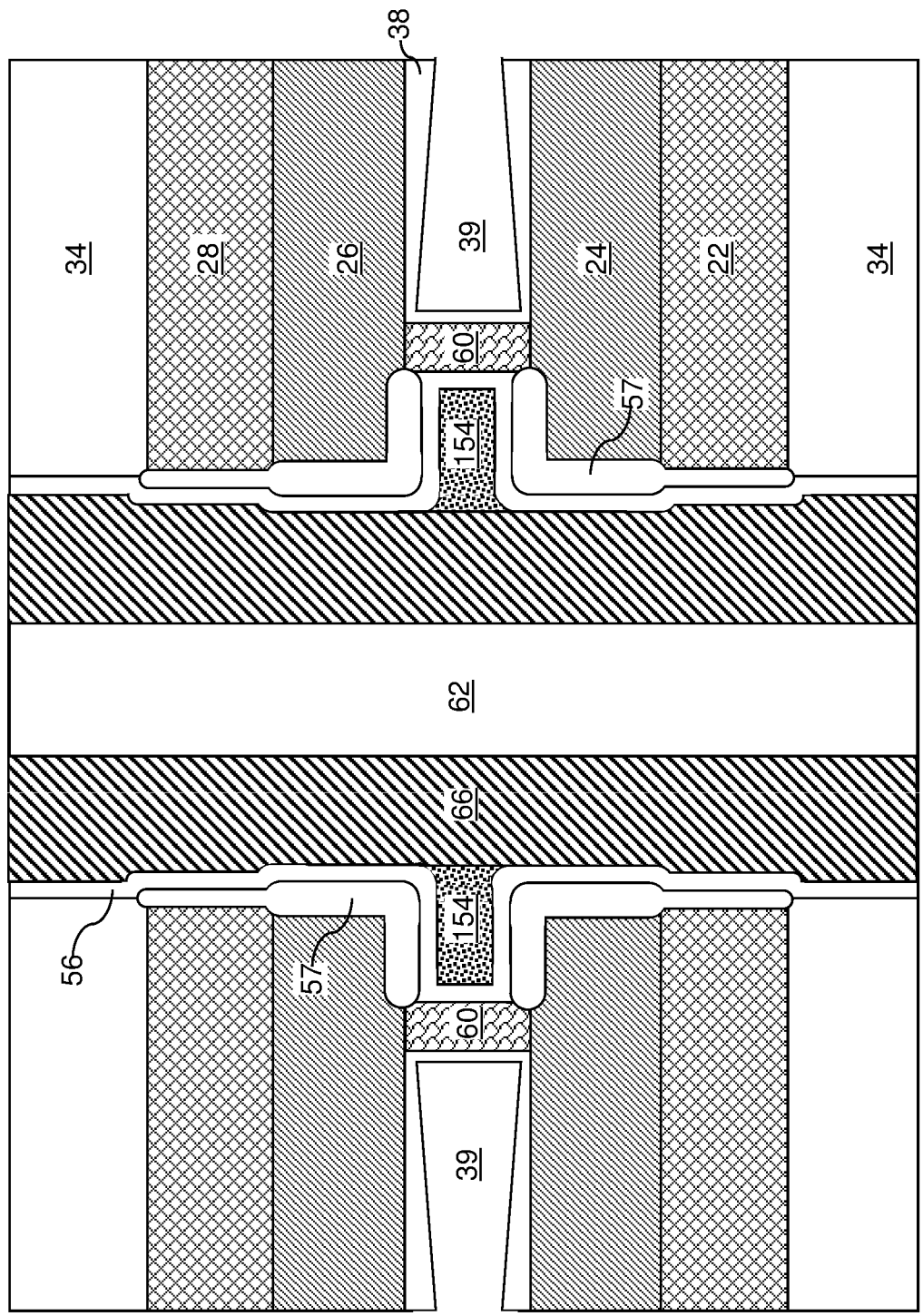
FIG. 16C is a schematic vertical cross-sectional view of a region of a third alternative configuration of the second exemplary structure at a processing step corresponding to the processing steps of FIGS. 16A and 16B.

Referring to FIG. 16C, a third alternative configuration of the second exemplary structure can be derived from the second alternative configuration of the second exemplary structure by employing the alternative configuration of the first exemplary structure illustrated in FIG. 5I. Specifically, a vertical stack of memory material portions 154 that are ferroelectric material portions is employed in each memory opening 49 in lieu of the combination of a blocking dielectric layer 52 and a vertical stack of memory material portions 54 that include charge trapping material portions or floating gate structures. The ferroelectric material portions can contact a most proximal one of the vertical word lines 66.

Figure 17A:
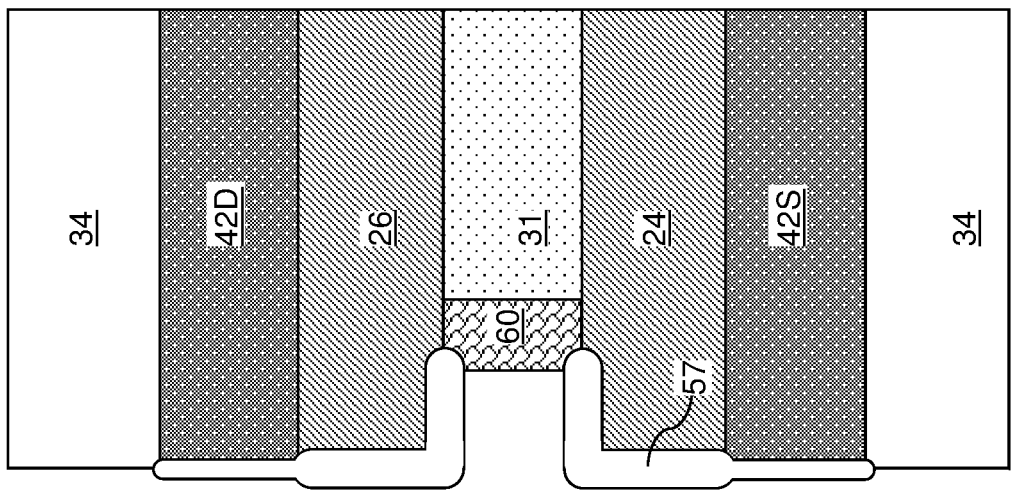
FIG. 17A is a schematic vertical cross-sectional view of a region around the channel cavity in a third exemplary structure after formation of semiconductor channels according to a third embodiment of the present disclosure.
Figure 17A:
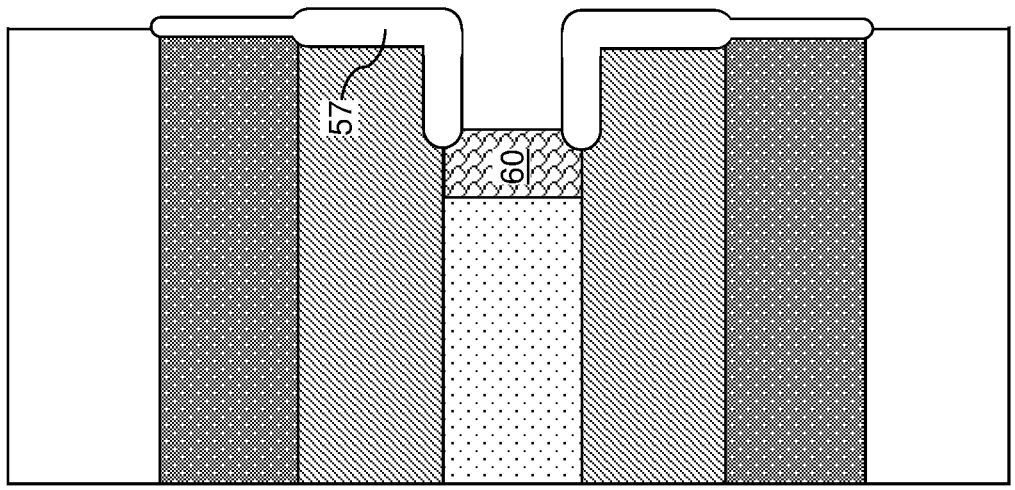

Referring to FIG. 17A, a first configuration of a third exemplary according to a third embodiment of the present disclosure can be derived from the first exemplary structure. The third exemplary structure of FIG. 17A can be the same as the first exemplary structure illustrated in FIG. 5D.

Figure 17B:
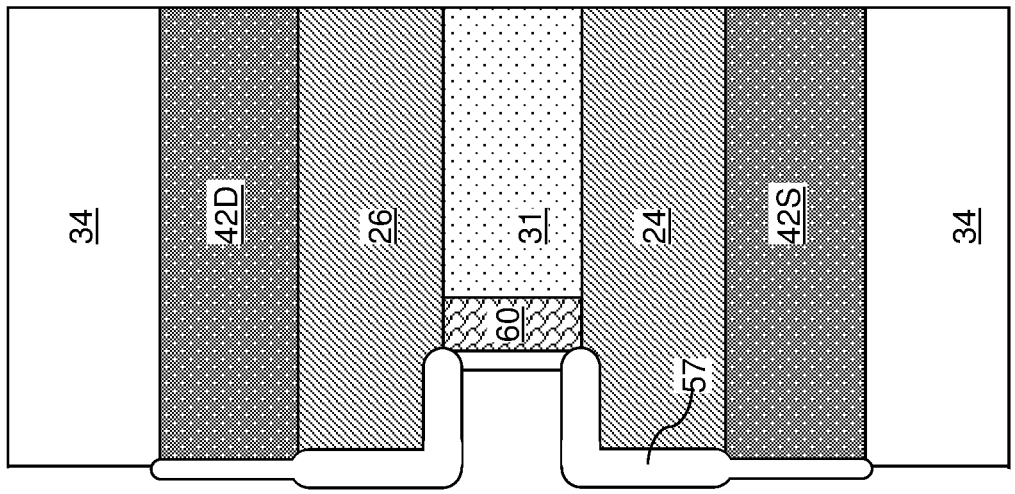
FIG. 17B is a schematic vertical cross-sectional view of the region around the channel cavity after formation of gate dielectric layers according to the third embodiment of the present disclosure.
Figure 17B:
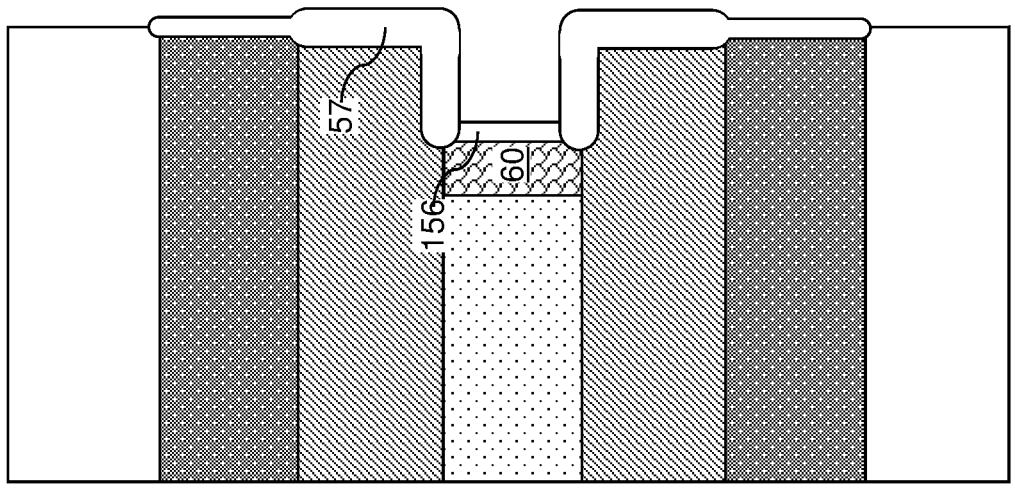

Referring to FIG. 17B, gate dielectric layers 156 can be formed by thermal oxidation or plasma oxidation of physically exposed surface portions of the semiconductor channels 60 instead of by deposition of a gate dielectric layer by CVD or ALD as in the prior embodiments. Each gate dielectric layer 156 can be formed as a discrete tubular material portion contacting an inner sidewall of a respective one of the semiconductor channels 60. Each gate dielectric layer 156 has a respective vertical extent that is not greater than a vertical extent of the respective one of the semiconductor channels 60. In one embodiment, each gate dielectric layer 156 has a respective vertical extent that is the same as the vertical extent of the respective one of the semiconductor channels 60. The thickness of each gate dielectric layer 156 can be in a range from 1 nm to 6 nm, such as from 1.5 nm to 3 nm.

Figure 17C:
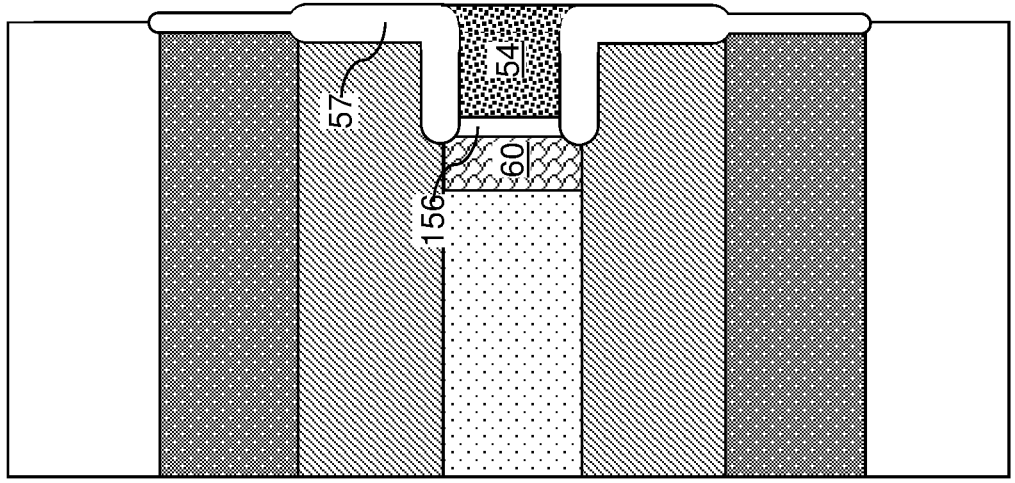
FIG. 17C is a schematic vertical cross-sectional view of the region around the channel cavity after formation of memory material portions according to the third embodiment of the present disclosure.
Figure 17C:
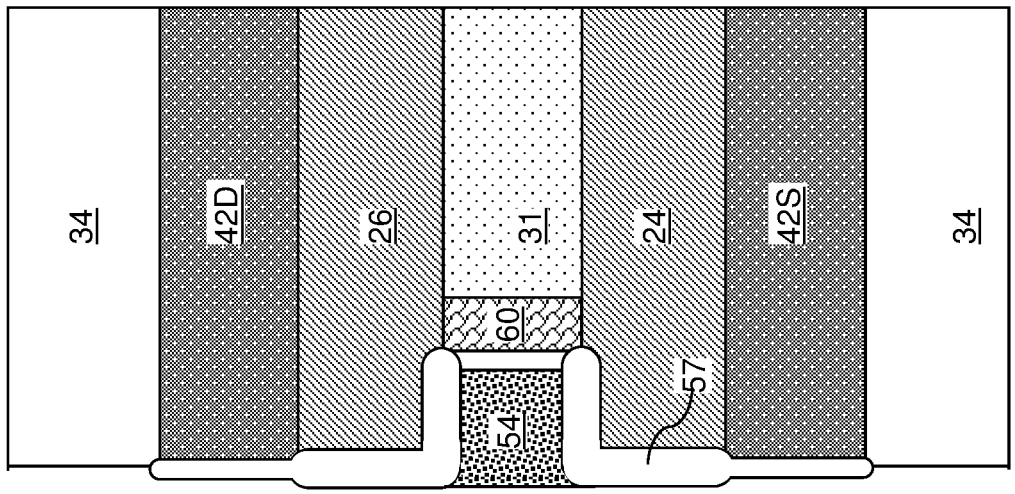

Referring to FIG. 17C, the processing steps of FIGS. 5F and 5G can be performed to form a memory material portion 54 within each channel cavity 349. In one embodiment, the memory material portions 54 include a charge trapping material such as silicon nitride. In another embodiment, the memory material portions 54 include a floating gate conductive material such as a metallic material or a heavily doped semiconductor material. A vertical stack of memory material portions 54 can be formed in each memory opening 49. Each memory material portion 54 can be located in each one of the memory openings 49, and can be laterally spaced from a respective one of the semiconductor channels 60 by a respective gate dielectric layer 156. In one embodiment, the memory material portions 54 comprise charge trapping material portions. In another embodiment, the memory material portions 54 comprise floating gate structures.

Figure 17D:
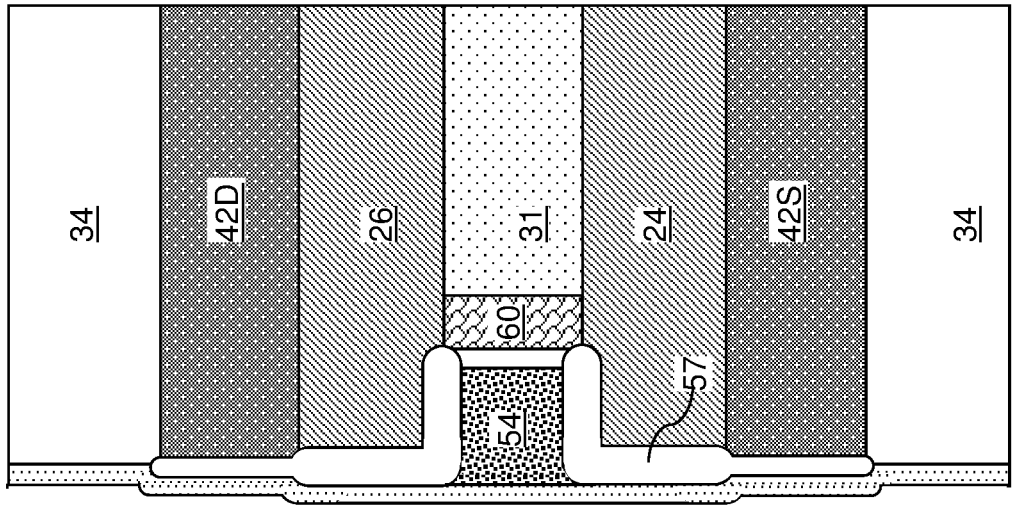
FIG. 17D is a schematic vertical cross-sectional view of the region around the channel cavity after formation of a blocking dielectric layer according to the third embodiment of the present disclosure.
Figure 17D:
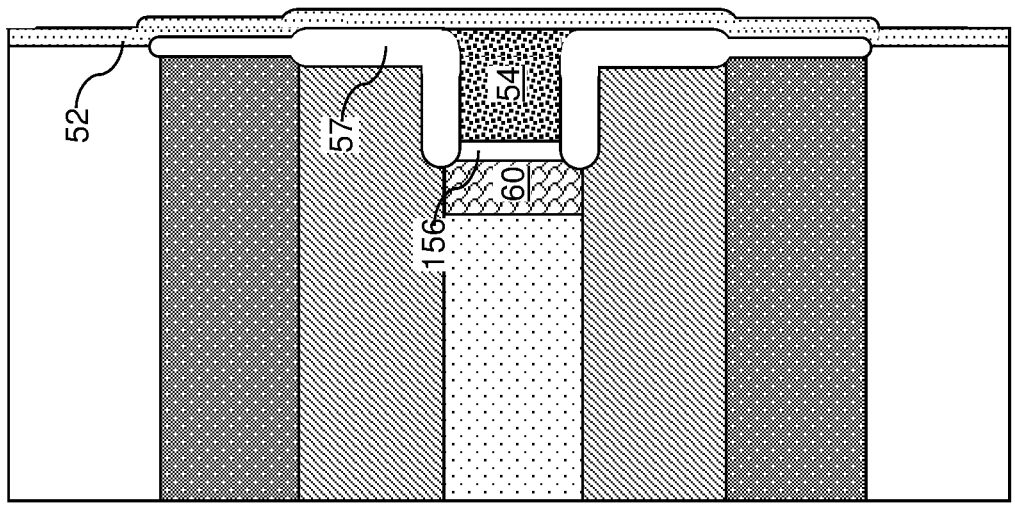

Referring to FIG. 17D, a blocking dielectric layer 52 can be formed on each of the memory material portions 54. The blocking dielectric layer 52 includes a blocking dielectric material such as silicon oxide, a dielectric metal oxide (such as aluminum oxide), or a combination thereof. The blocking dielectric layer 52 can be formed by a conformal deposition process such as a low pressure chemical vapor deposition process. The composition and the thickness of the blocking dielectric layer 52 can be the same as in the first embodiment.

Figure 17E:
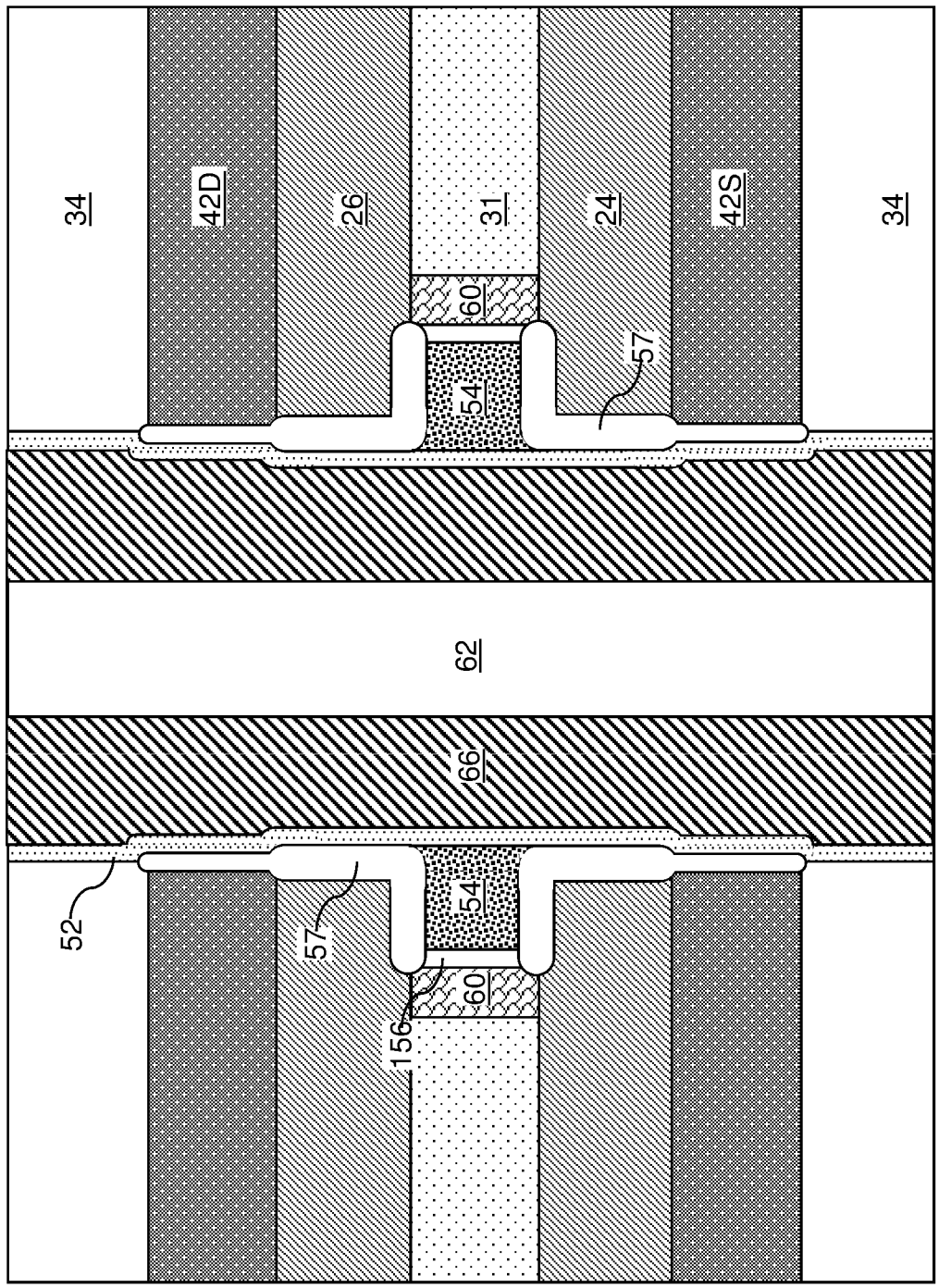
FIG. 17E is a schematic vertical cross-sectional view of the region around the channel cavity after formation of vertical word lines and dielectric cores according to the third embodiment of the present disclosure.

Referring to FIG. 17E, a vertical word line 66 and a dielectric core 62 can be formed within each memory opening 49 by performing the processing steps FIG. 5H. Generally, a gate dielectric layer 156 can be selectively formed on each of the semiconductor channels 60. Each of the memory material portions 54 is formed on a respective gate dielectric layer 156. Each vertical word line 66 can be formed on a respective blocking dielectric layer 52 in a respective memory opening 49.

Figure 18A:
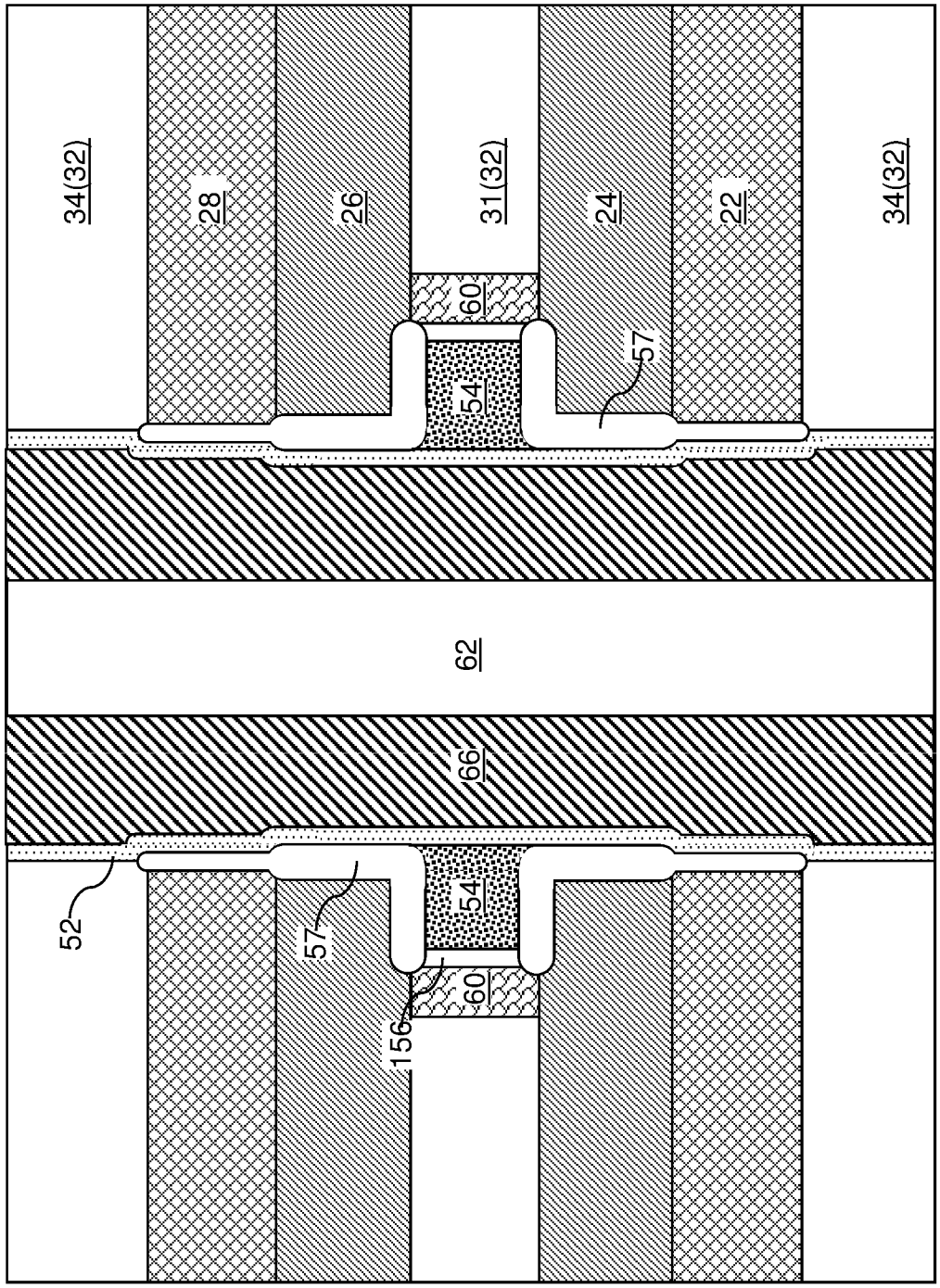
FIG. 18A is a schematic vertical cross-sectional view of a region of a first configuration of the third exemplary structure after formation of contact via structures according to the third embodiment of the present disclosure.

Referring to FIG. 18A, the processing steps of FIGS. 6, 7, 8A and 8B, 9, 10, 11, and 12A and 12B, and/or the processing steps of FIGS. 13, 14, and 15A and 15B, can be performed to replace the source sacrificial material layers 42S and the drain sacrificial material layers 42D with metallic source layers 22 and metallic drain layers 28, to form backside trench fill structures (76 or 78), and various contact via structures (88, 86S, 86D). The memory material portions 54 comprise charge trapping material portions or floating gate structures that are laterally spaced from a most proximal one of the vertical word lines 66 by a respective blocking dielectric layer 52.

Figure 18B:
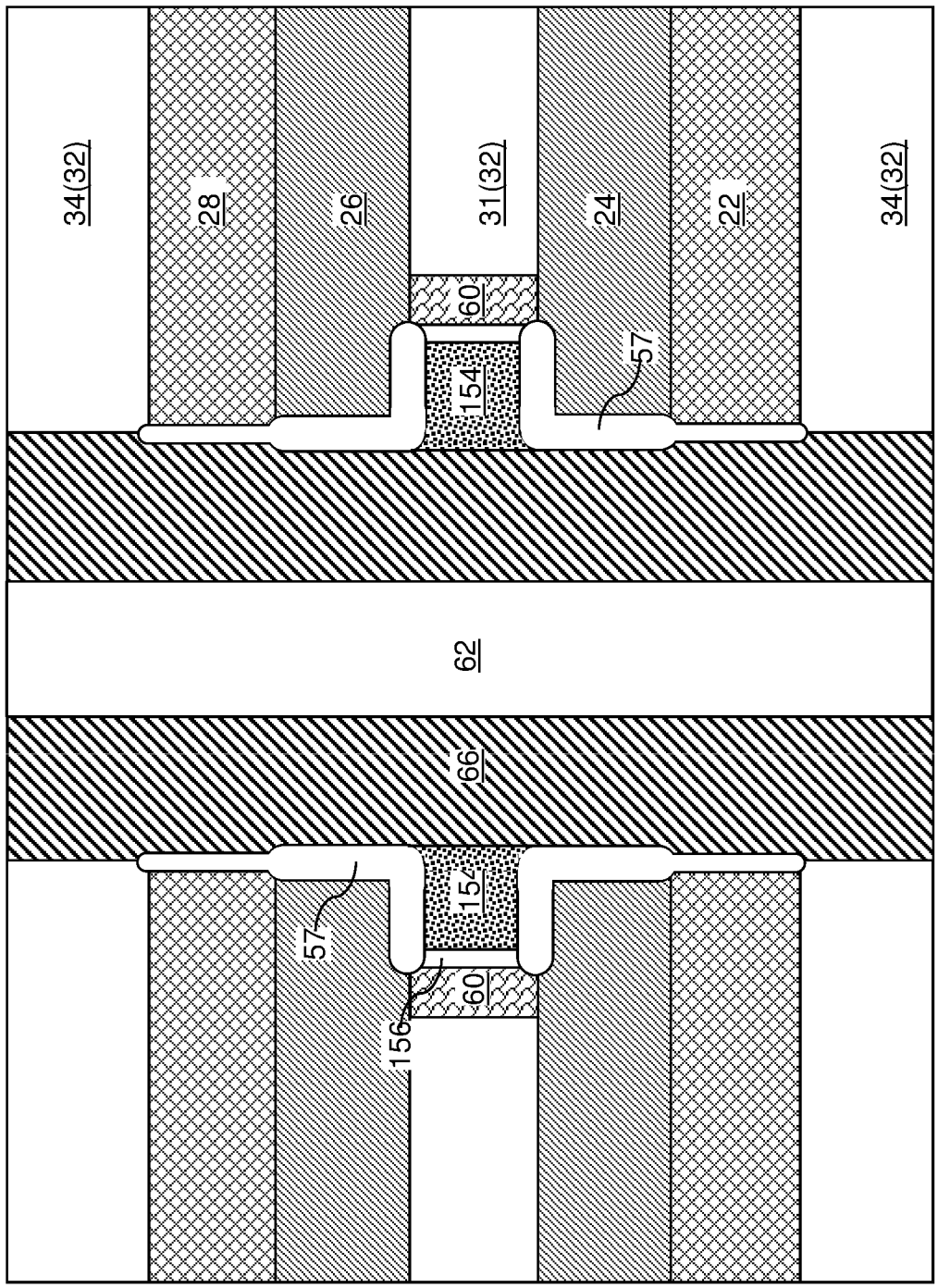
FIG. 18B is a schematic vertical cross-sectional view of a region of a second configuration of the third exemplary structure after formation of contact via structures according to the third embodiment of the present disclosure.

Referring to FIG. 18B, a second configuration of the third exemplary structure can be derived from the first configuration of the third exemplary structure by employing the alternative configuration of the first exemplary structure illustrated in FIG. 5I. Specifically, a vertical stack of memory material portions 154 that are ferroelectric material portions is employed in each memory opening 49 in lieu of the combination of a blocking dielectric layer 52 and a vertical stack of memory material portions 54 that include charge trapping material portions or floating gate structures. The ferroelectric material portions can contact a most proximal one of the vertical word lines 66.

An alternating stack of source layers (22, 24) and drain layers (26, 28) are formed over the substrate 9. Insulating layers 32 are interlaced with the source layers (22, 24) and the drain layers (26, 28) of the alternating stack {(22, 24), (26, 28)}. The insulating layers 32 comprise channel-level insulating layers 36 in contact with a respective one of the semiconductor channels 60, and inter-transistor-level insulating layers 34 located between vertically neighboring pairs of the channel-level insulating layers 36 and not contacting any of the semiconductor channels 60.

Figure 18C:
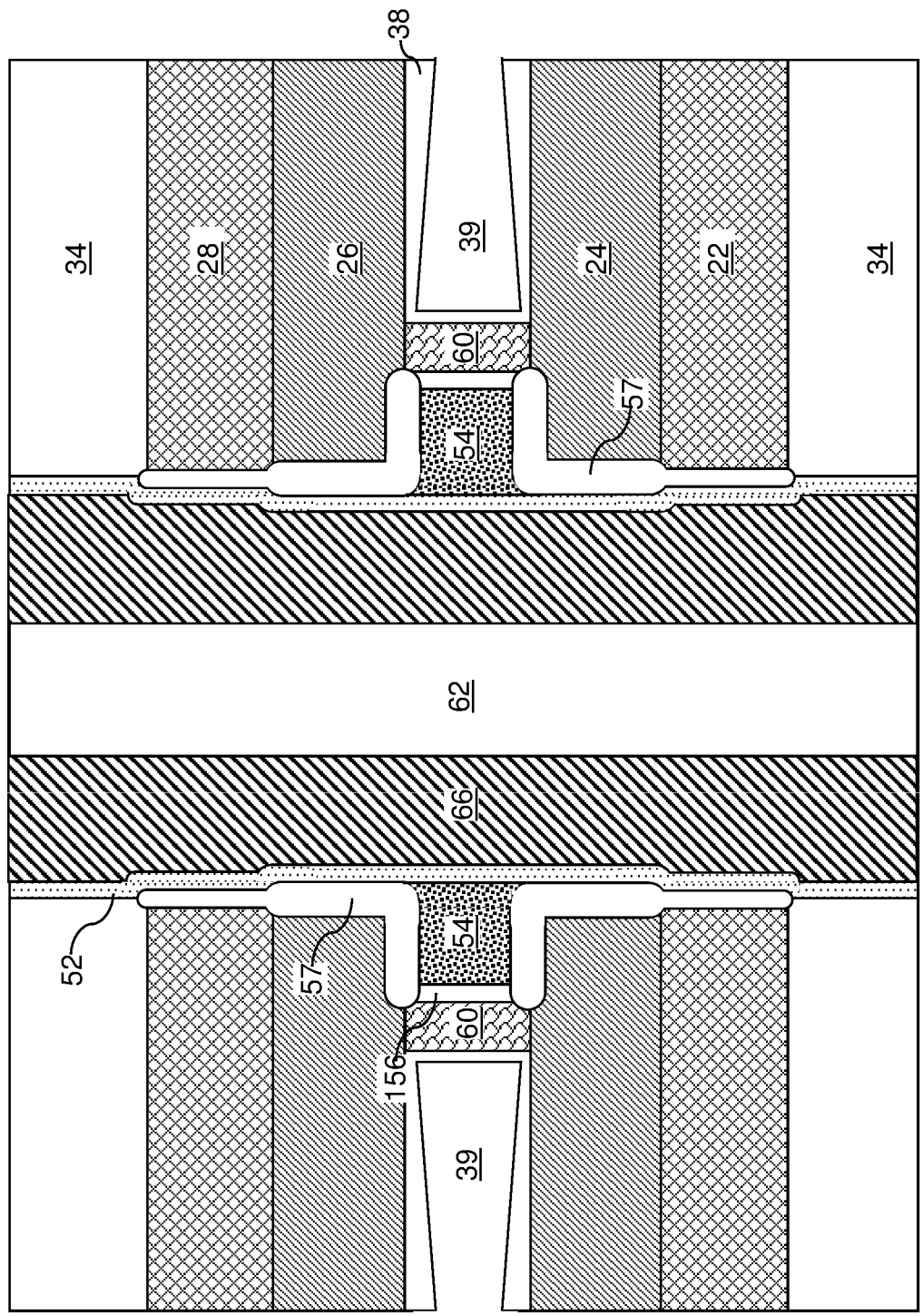
FIG. 18C is a schematic vertical cross-sectional view of a region of a third configuration of the third exemplary structure after formation of contact via structures according to the third embodiment of the present disclosure.

Referring to FIG. 18C, a third configuration of the third exemplary structure can be derived from the first configuration of the third exemplary structure illustrated in FIG. 17E by performing the processing steps of FIGS. 6, 7, 8A and 8B, 9, 10, 13, 14, and 15C, to replace the source sacrificial material layers 42S and the drain sacrificial material layers 42D with metallic source layers 22 and metallic drain layers 28, to form channel-level cavities 33, to form channel-level insulating layers 38 with encapsulated cavities 39 therein within each of the channel-level cavities 33, to form backside trench fill structures (76 or 78), and various contact via structures (88, 86S, 86D). The memory material portions 54 comprise charge trapping material portions or floating gate structures that are laterally spaced from a most proximal one of the vertical word lines 66 by a respective blocking dielectric layer 52.

Figure 18D:
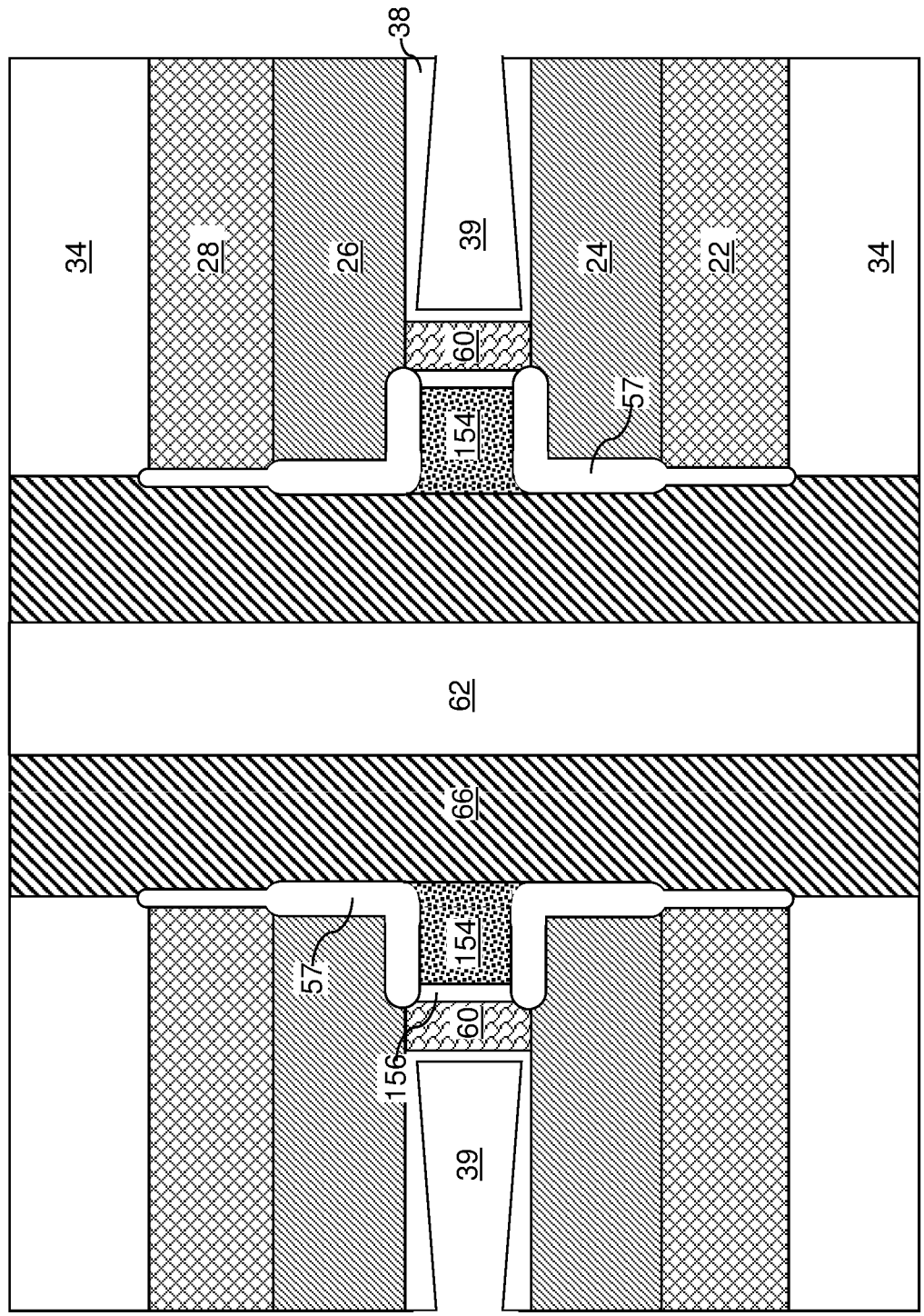
FIG. 18D is a schematic vertical cross-sectional view of a region of a fourth configuration of the third exemplary structure after formation of contact via structures according to the third embodiment of the present disclosure.

Referring to FIG. 18D, a fourth configuration of the third exemplary structure can be derived from the third configuration of the third exemplary structure by employing the alternative configuration of the first exemplary structure illustrated in FIG. 5I. Specifically, a vertical stack of memory material portions 154 that are ferroelectric material portions is employed in each memory opening 49 in lieu of the combination of a blocking dielectric layer 52 and a vertical stack of memory material portions 54 that include charge trapping material portions or floating gate structures.

The ferroelectric material portions can contact a most proximal one of the vertical word lines 66.

Referring to all drawings and according to various embodiments of the present disclosure, a three-dimensional memory device is provided, which comprises: an alternating stack of source layers (22, 24) and drain layers (26, 28) located over a substrate 9; memory openings 49 vertically extending through the alternating stack {(22, 24), (26, 28)}; vertical word lines 66 located in each one of the memory openings 49 and vertically extending through each of the source layers (22, 24) and the drain layers (26, 28) of the alternating stack {(22, 24), (26, 28)}; vertical stacks of discrete semiconductor channels 60 located in each one of the memory openings 49 and contacting horizontal surfaces of a respective vertically neighboring pair of a source layer (22, 24) of the source layers (22, 24) and a drain layer (26, 28) of the drain layers (26, 28); vertical stacks of discrete memory material portions (54 or 154) located in each one of the memory openings 49 and laterally surrounding a respective one of the vertical word lines 66, wherein each memory material portion (54, or 154) is laterally spaced from a respective one of the semiconductor channels 60 by a respective gate dielectric layer 50.

In one embodiment, the semiconductor channels 60 are vertically separated from each other; the memory material portions are vertically separated from each other; each of the source layers (22, 24) comprises a respective vertical stack of a doped semiconductor source layer 24 and a metallic source layer 22; and each of the drain layers (26, 28) comprises a respective vertical stack of a doped semiconductor drain layer 26 and a metallic drain layer 28.

In one embodiment, semiconductor oxide spacers 57 laterally contact a respective one of the source layers (22, 24) and the drain layers (26, 28) and contact a respective one of the semiconductor channels 60. Each semiconductor oxide spacer 57 within a first subset of the semiconductor oxide spacers 57 contacts a respective doped semiconductor source layer 24 and a respective metallic source layer 22; and each semiconductor oxide spacer 57 within a second subset of the semiconductor oxide spacers 57 contacts a respective doped semiconductor drain layer 26 and a respective metallic drain layer 28.

In one embodiment, each of the semiconductor oxide spacers 57 comprises: a vertically extending portion (571, 572) that contacts a vertical stack of a doped semiconductor source layer 24 and a metallic source layer 22 or a vertical stack of a doped semiconductor drain layer 26 and a metallic drain layer 28; and a laterally extending portion 573 that contacts the respective one of the semiconductor channels 60. In one embodiment, the vertically extending portion (571, 572) comprises: a first vertically extending segment 571 that adjoins the laterally extending portion 573 and contacts the doped semiconductor source layer 24 or the doped semiconductor drain layer 26; and a second vertically extending segment 572 that is spaced from the laterally extending portion 573 by the first vertically extending segment 571 and contacts the metallic source layer 22 or the metallic drain layer 28. In one embodiment, the first vertically extending segment 571 has a lateral thickness that is the same as a vertical thickness of the laterally extending portion 573 and is less than a lateral thickness of the second vertically extending segment 572.

In one embodiment, each of the gate dielectric layers 50 vertically extends continuously through each level of the source layers (22, 24) and the drain layers (26, 28) within the alternating stack {(22, 24), (26, 28)}. In another embodiment, each of the gate dielectric layers 50 comprises a discrete gate dielectric layer which contacts a respective one of the semiconductor channels 60, has a respective vertical extent that is not greater than a vertical extent of the respective one of the semiconductor channels 60.

In one embodiment, insulating layers 32 can be interlaced with the source layers (22, 24) and the drain layers (26, 28) of the alternating stack {(22, 24), (26, 28)}, wherein the insulating layers 32 comprise: channel-level insulating layers (31, 36, 38) in contact with a respective one of the semiconductor channels 60; and inter-transistor-level insulating layers 34 located between vertically neighboring pairs of the channel-level insulating layers (31, 36, 38) and not contacting any of the semiconductor channels 60. In one embodiment, the channel-level insulating layers 38 comprise a respective dielectric encapsulation layer that embeds a respective encapsulated cavity 39 that is free of any solid phase material.

In one embodiment, the channel-level insulating layers 31 comprise a doped semiconductor oxide material; and the inter-transistor-level insulating layers 34 comprise a semiconductor oxide material having an etch rate in 100:1 dilute hydrofluoric acid at room temperature that is less than 30% of an etch rate of the doped semiconductor oxide material in 100:1 dilute hydrofluoric acid at room temperature.

In one embodiment, the memory material portions 54 comprise charge trapping material portions or floating gate structures that are laterally spaced from a most proximal one of the vertical word lines by a respective blocking dielectric layer. In one embodiment, the memory material portions 154 comprise ferroelectric material portions that contact a most proximal one of the vertical word lines.

The various embodiments of the present disclosure can be employed to provide discrete memory material portions (54, 154) and/or self-aligned isolation structures comprising the semiconductor oxide spacers 57. Specifically, the discrete memory material portions reduce or prevent the incomplete erase issues during the erase operation of a continuous charge trapping layer in a NOR array. Furthermore, the gate dielectric layer and the optional blocking dielectric layer may be formed with an increased thickness for discrete memory material portions and reduce the risk of electrical breakdown. Finally, the semiconductor oxide spacers 57 provide electrical isolation between the source layers (22, 24) and the vertical word lines 66 and between the drain layers (26, 28) and the vertical word lines 66. The self-aligned electrical isolation structures provided by the semiconductor oxide spacers 57 permit scaling of the three-dimensional array of vertical field effect transistors and reduce program disturb issues. The three-dimensional array of vertical field effect transistors 300 comprises a NOR array. Each NOR array includes a respective source layer (22, 24), a respective drain layer (26, 28), a two-dimensional array of tubular semiconductor channels 60, a two-dimensional array of gate dielectric layers (56 or 156), a two-dimensional array of memory material portions (54 or 154), a two-dimensional array of blocking dielectric layers 52, and a two-dimensional array of vertical word lines 66.

Figure 19A:
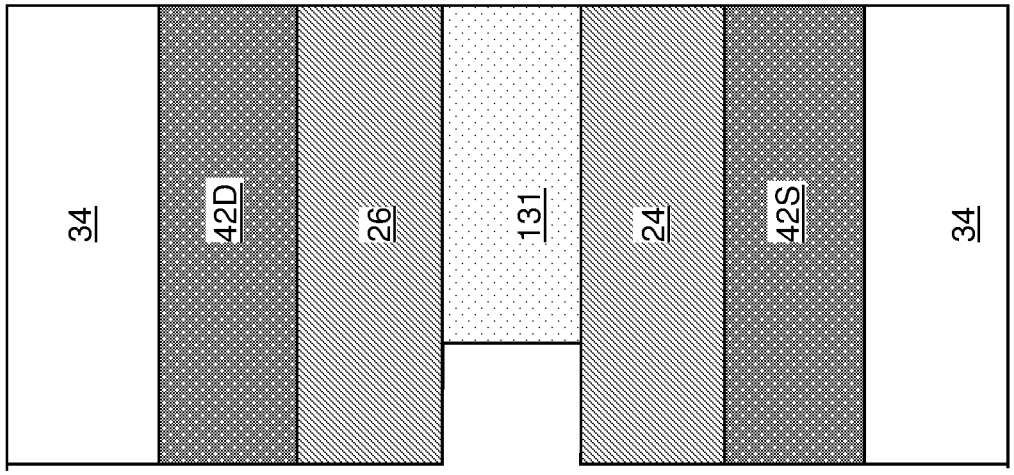
FIGS. 19A-19E are sequential vertical cross-sectional view of a region in a memory opening in a fourth exemplary structure during formation of a memory opening fill structure according to a fourth embodiment of the present disclosure.
Figure 19A:
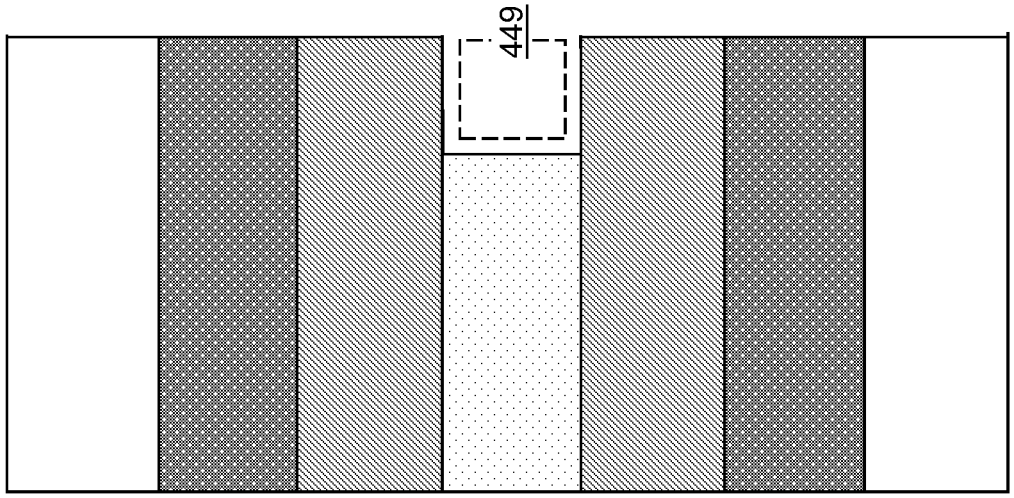

Referring to FIG. 19A, a memory opening 49 in a fourth exemplary structure is illustrated at a processing step corresponding to the processing steps FIGS. 4 and 5A. The fourth exemplary structure at the processing steps of FIG. 19A may be derived from the first exemplary structure at the processing steps of FIGS. 4 and 5A by employing a sacrificial channel-level spacer layer 131 instead of each instance of the channel-level spacer layer 31. Generally, a vertical repetition of unit layer stacks (42S, 24, 131, 26, 42D, 34) can be formed over a substrate. Each of the unit layer stacks (42S, 24, 131, 26, 42D, 34) comprises a source-level material layer (which may include a stack of an optional source sacrificial material layer 42S and a doped semiconductor source layer 24), a sacrificial channel-level spacer layer 131, a drain-level material layer (which may include a stack of a doped semiconductor drain layer 26 and an optional drain sacrificial material layer 42D), and an inter-transistor-level insulating layer 34. Thus, the unit layer stack (42S, 24, 131, 26, 42D, 34) in the fourth exemplary structure may differ from the unit layer stack (42S, 24, 31, 26, 42D, 34) in the first exemplary structure of FIGS. 4 and 5A by the presence of the sacrificial channel-level spacer layer 131 instead of a channel-level spacer layer 31.

Each sacrificial channel-level spacer layer 131 includes a sacrificial material that is different from the materials of the source-level material layer (42S, 24), the drain-level material layer (26, 42D), and the inter-transistor-level insulating layer 34. In an illustrative example, the sacrificial channel-level spacer layer 131 may include a germanium-containing material (such as a silicon-germanium alloy) including germanium at an atomic percentage in a range from 15% to 100%, amorphous carbon, diamond-like carbon, porous or non-porous organosilicate glass, a silicon-containing polymer material, or a carbon-based polymer material. The sacrificial channel-level spacer layers 131 may be deposited by chemical vapor deposition, physical vapor deposition, spin coating. The thickness of each sacrificial channel-level spacer layer 131 can be in a range from 20 nm to 80 nm, although lesser and greater thicknesses can also be employed.

Generally, the source-level material layers are formed as, or are subsequently replaced with, source layers comprising at least one source-side conductive material, and the drain-level material layers are formed as, or are subsequently replaced with, drain layers comprising at least one drain-side conductive material. In the case of the fourth exemplary structure, each source-level material layer can include a stack of a source sacrificial material layer 42S that is subsequently replaced with a metallic source layer that is a first component of a source layer, and a doped semiconductor source layer 24 that is a second component of the source layer. Each drain-level material layer can include a stack of a drain sacrificial material layer 42D that is subsequently replaced with a metallic drain layer that is a first component of a drain layer, and a doped semiconductor drain layer 26 that is a second component of the drain layer. The doped semiconductor source layers 24 and the doped semiconductor drain layers 26 can have a doping of a first conductivity type.

In one embodiment, each of the source-level material layers (42S, 24) comprises a respective sacrificial source-level material layer 42S, and each of the drain-level material layers (26, 42D) comprises a respective sacrificial drain-level material layer 42D. In one embodiment, each of the source-level material layers (42S, 24) further comprises a respective doped semiconductor source layer 24, and each of the drain-level material layers (26, 42D) further comprises a respective doped semiconductor drain layer 26. In one embodiment, each of the source-level material layers (42S, 24) and the drain-level material layers (26, 42D) comprises a respective doped polysilicon layer (e.g., N+ doped polysilicon layer) (24, 26) and a respective silicon nitride layer (42S, 42D).

The cavities formed at each level of the sacrificial channel-level spacer layers 131 are herein referred to as annular recess cavities 449, which may have the same configuration as the channel cavities 349 in the first exemplary structure.

The lateral recess distance of each annular recess cavity 449 may be in a range from 10 nm to 100 nm, such as from 20 nm to 50 nm, although lesser and greater lateral recess distances may also be employed. Generally, memory openings 49 can vertically extend through the vertical repetition of multiple instances of the unit layer stack (42S, 24, 131, 26, 42D, 34). A vertical stack of annular recess cavities 449 can be formed around each of the memory openings 49 by laterally recessing the sacrificial channel-level spacer layers 131 relative to the source-level material layers (42S, 24), the drain-level material layers (26, 42D), and the inter-transistor-level insulating layers 34.

Figure 19B:
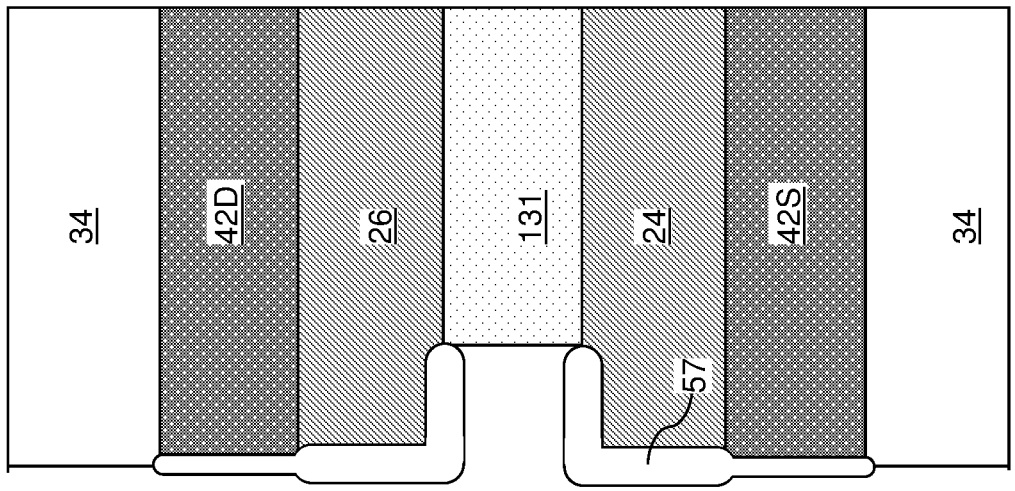
Figure 19B:
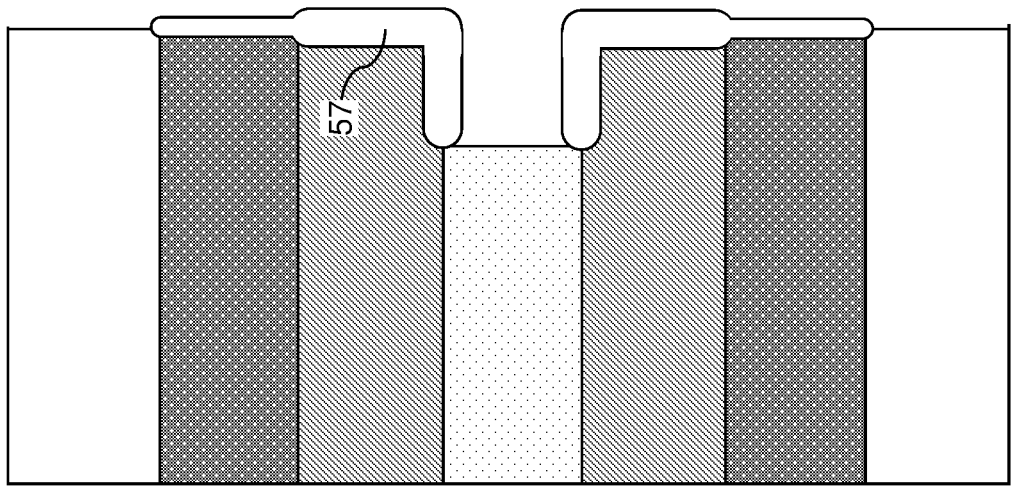

Referring to FIG. 19B, the processing steps of FIG. 5B can be performed to form semiconductor oxide spacers 57. Generally, at least one semiconductor oxide spacer 57, such as a vertical stack of semiconductor oxide spacers 57, can be formed over the source-level material layers (42S, 24) and the drain-level material layers (26, 42D). In one embodiment, a plurality of semiconductor oxide spacers 57 can be formed by oxidizing surface portions of the source-level material layers (42S, 24) and the drain-level material layers (26, 42D) into semiconductor oxide portions, such as silicon oxide portions.

Figure 19C:
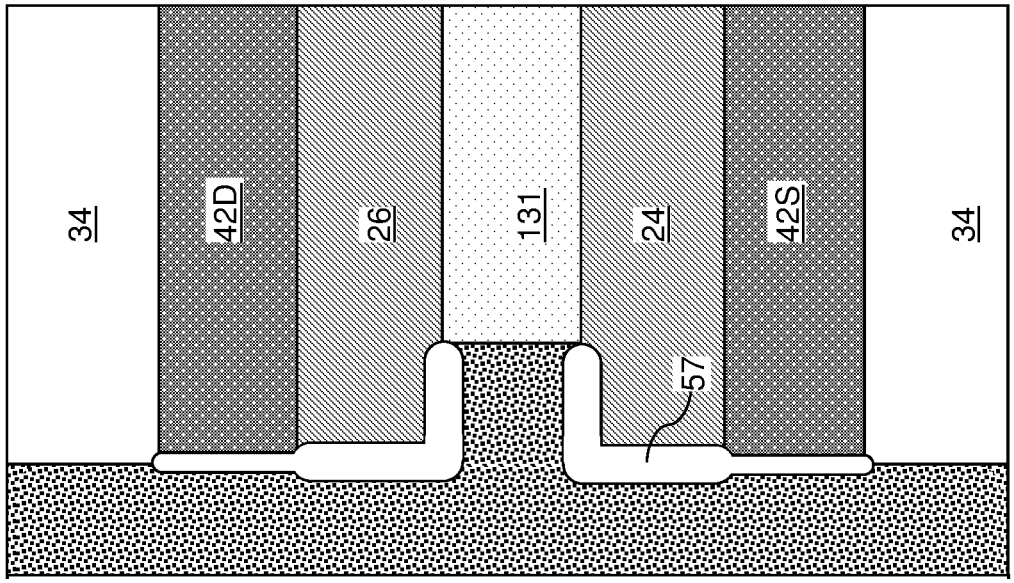
Figure 19C:
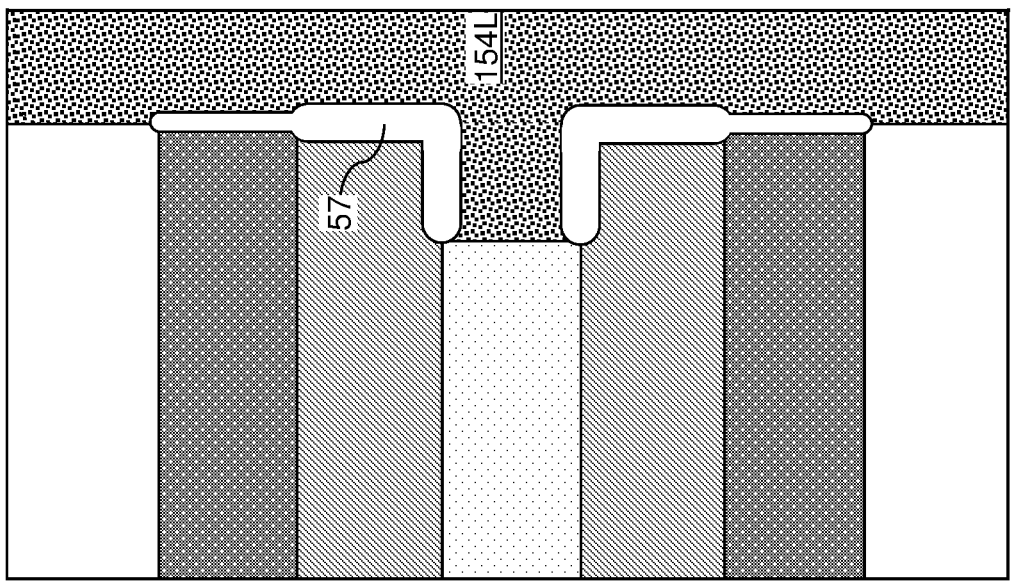

Referring to FIG. 19C, a memory material layer 154L can be deposited at a peripheral portion of each memory opening 49. The memory material layer 154L includes a material that can form a memory element when divided into discrete material portions. In one embodiment, the memory material layer 154L includes a ferroelectric material. In one embodiment, the memory material layer 154L may include the ferroelectric non-centrosymmetric orthorhombic phase of doped or undoped hafnium oxide layer. The doped hafnium oxide may include at least one dopant selected from Al, Zr, Si, Y, Gd and/or La. Other suitable ferroelectric materials may also be used, as such as titanate ferroelectric materials (e.g., barium titanate, lead titanate, lead zirconate titanate, lead lanthanum zirconate titanate ("PLZT"), etc.) or rare earth doped Wurtzite phase III-nitride semiconductor materials. In one embodiment, the memory material layer 154L may consist essentially of $Hf_xZr_{1-x}O_2$, in which x is in a range between 0.1 to 0.6, such as 0.2 to 0.5. Alternatively, the memory material layer 154L may include a charge trapping material, such as silicon nitride. In another embodiment, the memory material layer 154L includes a conductive floating gate material, such as a metallic material or a heavily doped semiconductor material. The thickness of the memory material layer 154L can be selected such that the entirety of each remaining volume of the annular recess cavities 449 can be filled with the memory material layer 54L. For example, the thickness of the memory material layer 154L, as measured laterally from a vertical sidewall of an inter-transistor-level insulating layer 34 may be in a range from 10 nm to 40 nm, such as from 15 nm to 30 nm, although lesser and greater thicknesses may also be employed.

Figure 19D:
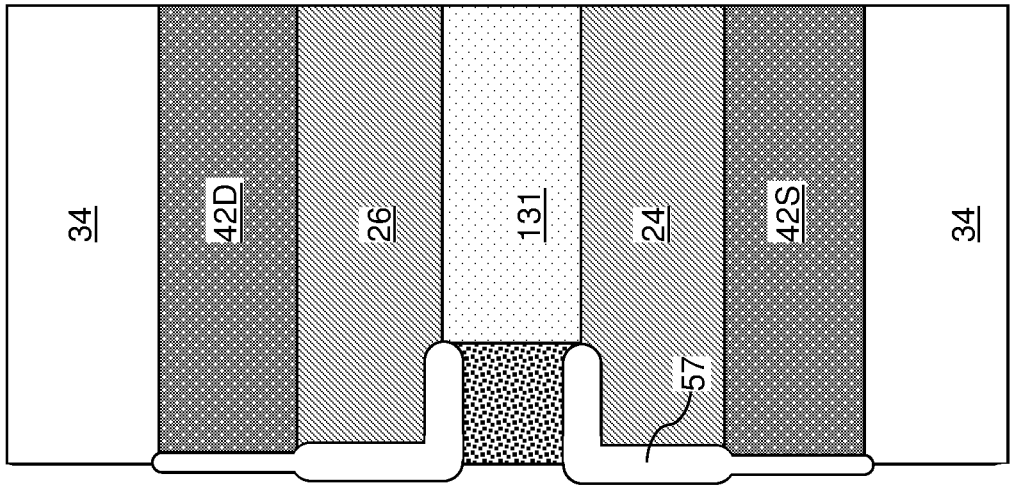
Figure 19D:
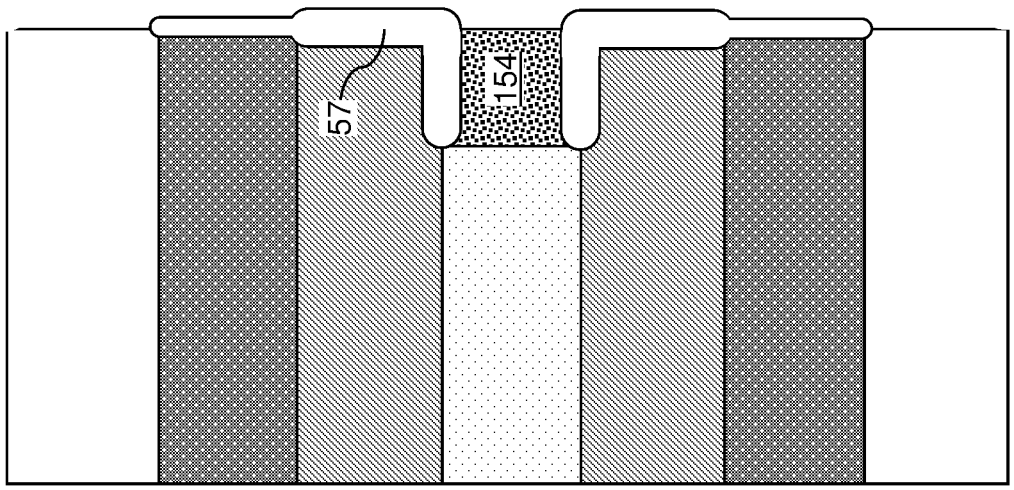

Referring to FIG. 19D, an etch process can be performed to remove portions of the memory material layer 154L that are located outside the annulare recess cavities 449. The etch process may include an isotropic etch process (such as a wet etch process or a chemical dry etch), and/or may include an anisotropic etch process. A wet etch process and/or a reactive ion etch process can be employed to remove portions of the memory material layer 154L that are located outside the annulare recess cavities 449. Generally, the etch chemistry of the etch process can be selected depending on the material of the memory material layer 154L. Each remaining portion of the memory material layer 154L that remains in the annulare recess cavities 449 comprises a memory material portion 154.

A vertical stack of discrete, vertically separated memory material portions 154 can be formed in each annulare recess cavity 449. Each memory material portion 154 can be located in a respective one of the annulare recess cavities 449. In one embodiment, the memory material portions 154 comprise ferroelectric material portions. In one embodiment, the memory material portions 154 comprise charge trapping material portions. In another embodiment, the memory material portions 154 comprise floating gate structures.

Figure 19E:
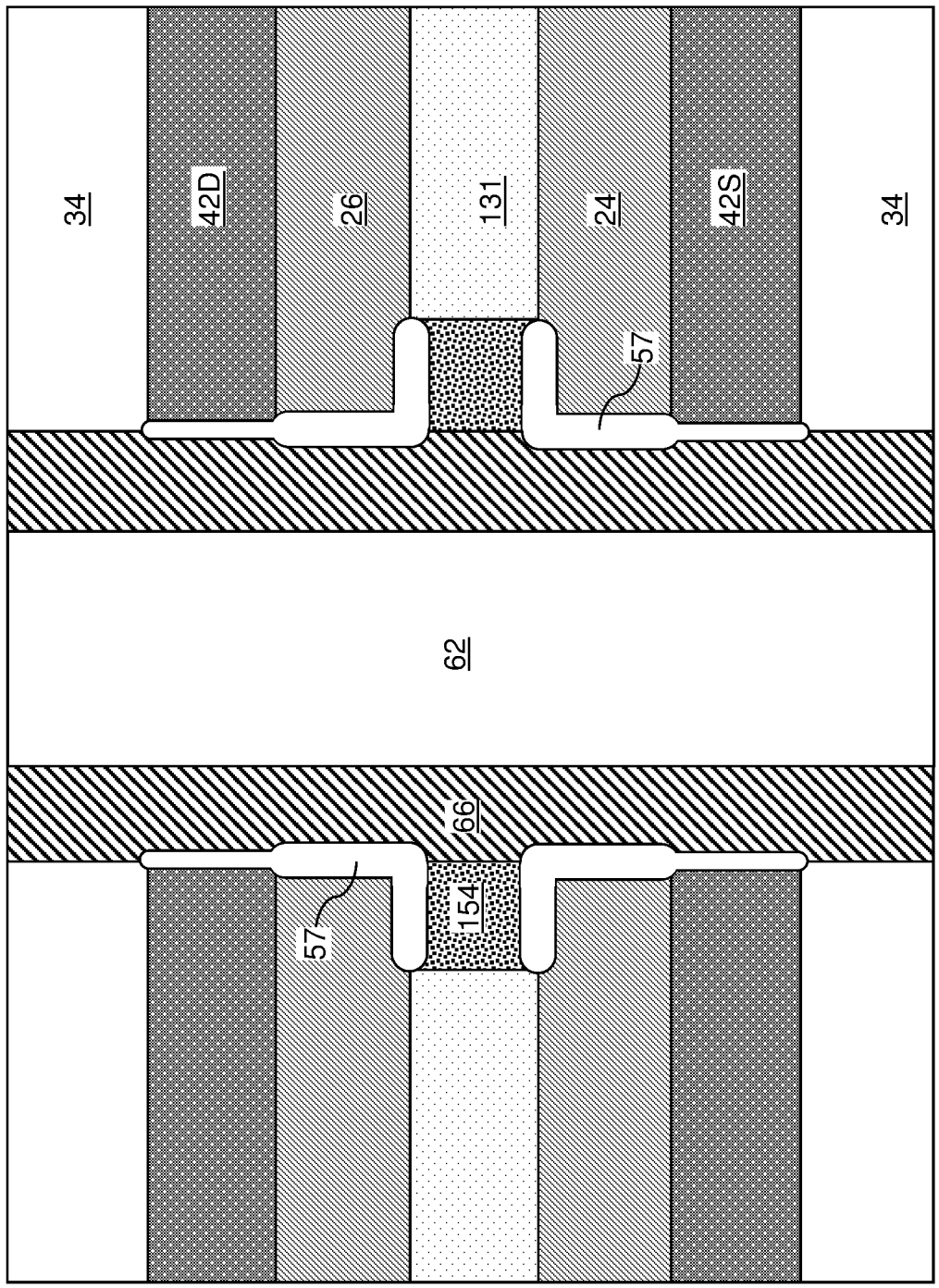

Referring to FIG. 19E, at least one gate electrode material can be deposited on the vertical stack of memory material portions 154 around each memory opening 49. For example, a layer stack of a metallic nitride liner (e.g., barrier layer) including a conductive metallic nitride (such as TiN, TaN, or WN) and a metal fill layer including a metal (such as W, Co, Mo, Ru, Cu, or an alloy thereof) can be sequentially deposited as the at least one gate electrode material. Additionally or alternatively, a heavily doped semiconductor material may be employed as one of the at least one gate electrode material. Each portion of the at least one gate electrode material deposited in the memory openings 49 comprises a vertical word line 66. The vertical word line extends perpendicular to the top surface of the substrate 9. Each vertical word line 66 functions as a gate electrode (e.g., control gate electrode) for a vertical stack of memory material portions 154. Thus, a vertical word line 66 is formed in each of the memory openings 49. Each of the vertical word lines 66 is formed on a respective vertical stack of memory material portions 154 of the memory material portions 154. In case the memory material portions 154 comprise ferroelectric material portions, each of the vertical word lines 66 can be formed on a respective vertical stack of ferroelectric material portions.

In case the memory openings 49 are not completely filled with the at least one gate electrode material, a dielectric fill material can be deposited in the remaining unfilled volumes of the memory openings 49. Each portion of the deposited dielectric fill material comprises a dielectric core 62. The dielectric core 62 includes a dielectric fill material such as silicon oxide. The ferroelectric material of the memory material portions 154 may be crystallized during this step using either a separate crystallization anneal and/or due to the high temperature deposition steps of the vertical word lines 66 and the dielectric core 62.

Figure 19F:
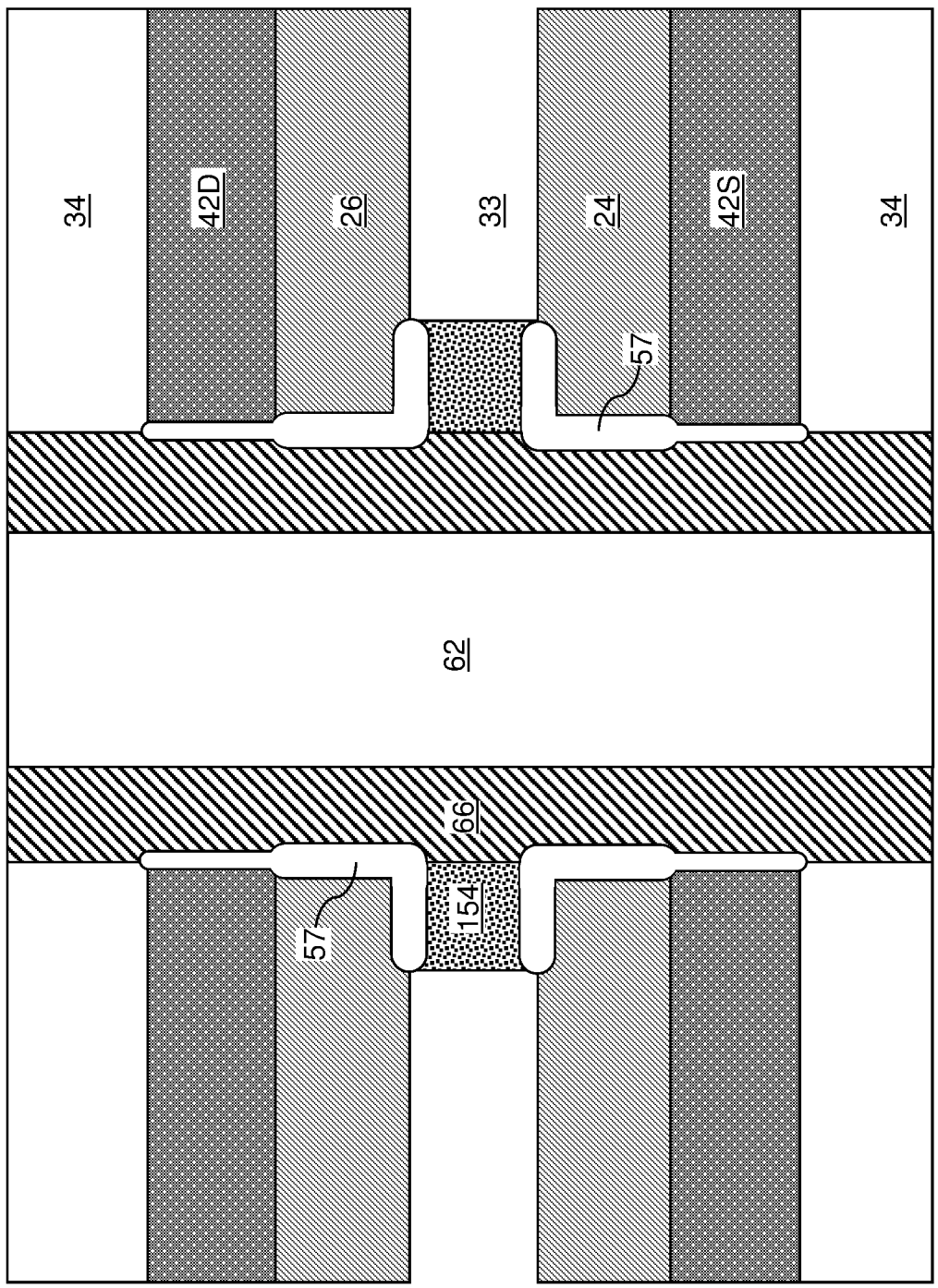
FIGS. 19F-19J are sequential vertical cross-sectional view of a region in a memory opening in the fourth exemplary structure during formation of semiconductor channel layers and electrically conductive layers according to the fourth embodiment of the present disclosure.

Referring to FIG. 19F, the processing steps of FIGS. 7 and 8 may be subsequently performed to form contact pad structures 68 and backside trenches 79. Subsequently, an isotropic etchant is introduced into the backside trenches 79 in an isotropic etch process. The isotropic etchant has an etch chemistry that etches the material of the sacrificial channel-level spacer layers 131 selective to the materials of the source-level material layers (42S, 24), the drain-level material layers (26, 42D), and the inter-transistor-level insulating layers 34. In one embodiment, the etch rate of the material of the sacrificial channel-level spacer layers 131 in the isotropic etchant may be at least 10 times, such as at least 100 times, the collateral etch rates of the source-level material layers (42S, 24), the drain-level material layers (26, 42D), and the inter-transistor-level insulating layers 34. In an illustrative example, if the sacrificial channel-level spacer layers 131 include a silicon-germanium alloy, a wet etch process employing a mixture of hydrogen peroxide and dilute hydrofluoric acid may be employed. If the sacrificial channel-level spacer layers 131 include organosilicate glass or borosilicate glass, a wet etch process employing dilute hydrofluoric acid may be employed. Alternatively, if the sacrificial channel-level spacer layers 131 include a carbon-based material or a thermally-decomposable silicon-based polymer, an ashing process may be performed to remove the sacrificial channel-level spacer layers 131 selective to the source-level material layers (42S, 24), the drain-level material layers (26, 42D), and the inter-transistor-level insulating layers 34. Generally, sacrificial channel-level spacer layers 131 are removed selective to the source-level material layers (42S, 24), the drain-level material layers (26, 42D), and the inter-transistor-level insulating layers 34, i.e., without removing, or with minimal collateral removal of, the source-level material layers (42S, 24), the drain-level material layers (26, 42D), and the inter-transistor-level insulating layers 34. Channel-level cavities 33 are formed in volumes from which the material of the sacrificial channel-level spacer layers 131 is removed.

Figure 19G:
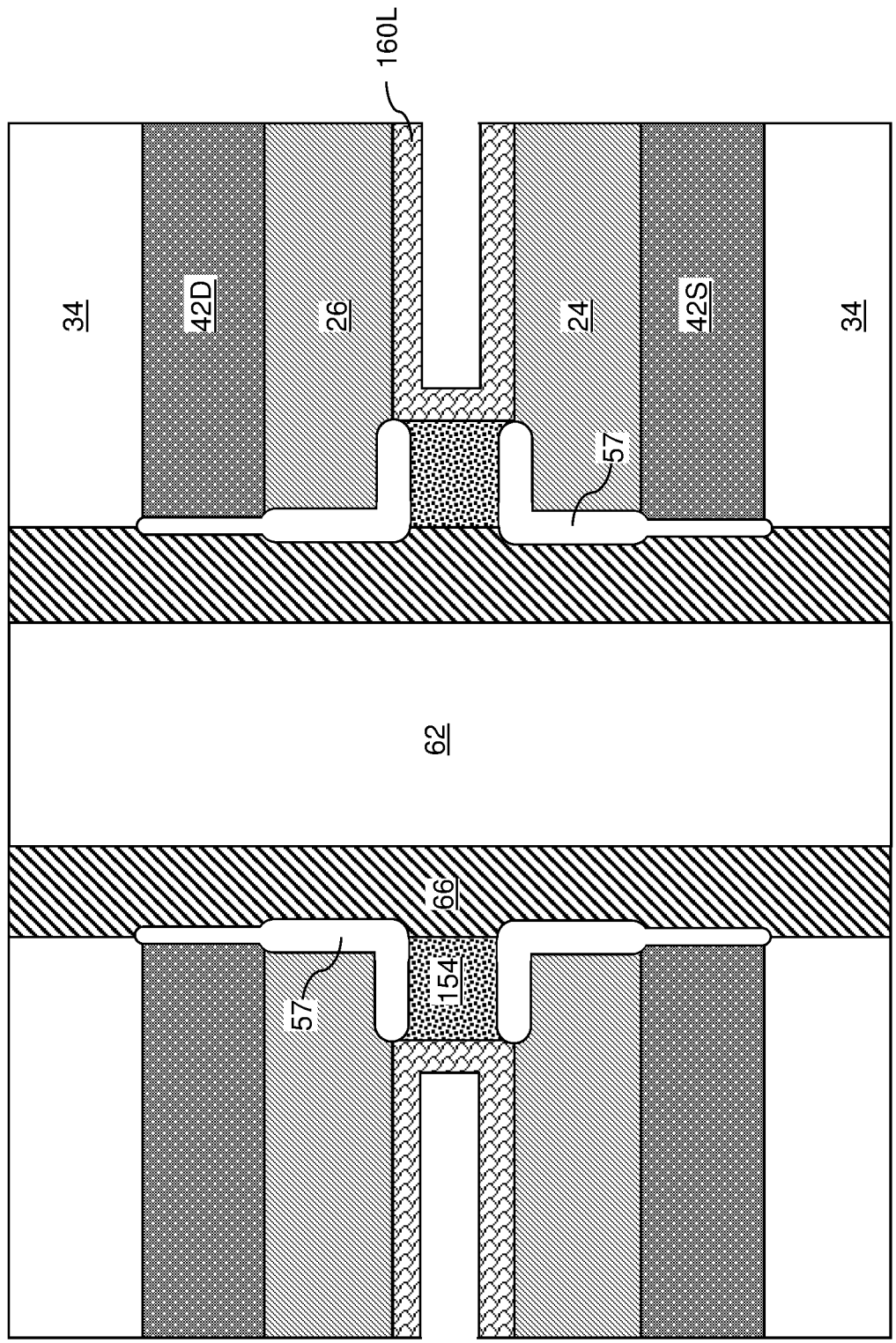

Referring to FIG. 19G, a semiconductor channel layer 160L can be deposited in the peripheral regions of the channel-level cavities 33 and over the physically exposed cylindrical surfaces of the memory material portions 154 by a conformal deposition process such as a chemical vapor deposition process. The continuous semiconductor channel layer 160L includes a semiconductor material having a doping of a second conductivity type, which is the opposite of the first conductivity type. For example, if the first conductivity type is n-type, the second conductivity type is p-type, and vice versa. The semiconductor material in the continuous semiconductor channel layer 160L can include silicon (e.g., polysilicon or amorphous silicon), a silicon-germanium alloy, or a compound semiconductor material. The atomic concentration of dopants of the second conductivity type in the continuous semiconductor channel layer 160L can be in a range from $1.0 \times 10^{14}/cm^3$ to $3.0 \times 10^{17}/cm^3$, although lesser and greater atomic concentrations can also be employed. The thickness of the continuous semiconductor channel layer 160L can be selected such that a gap remains between an upper horizontally-extending portion and a lower horizontally-extending portion of the continuous semiconductor channel layer 160L within each of the channel-level cavities 33. In one embodiment, the thickness of the continuous semiconductor channel layer 160L may be the in a range from 1 nm to 15 nm, such as from 3 nm to 10 nm, although lesser and greater thicknesses can also be employed.

Figure 19H:
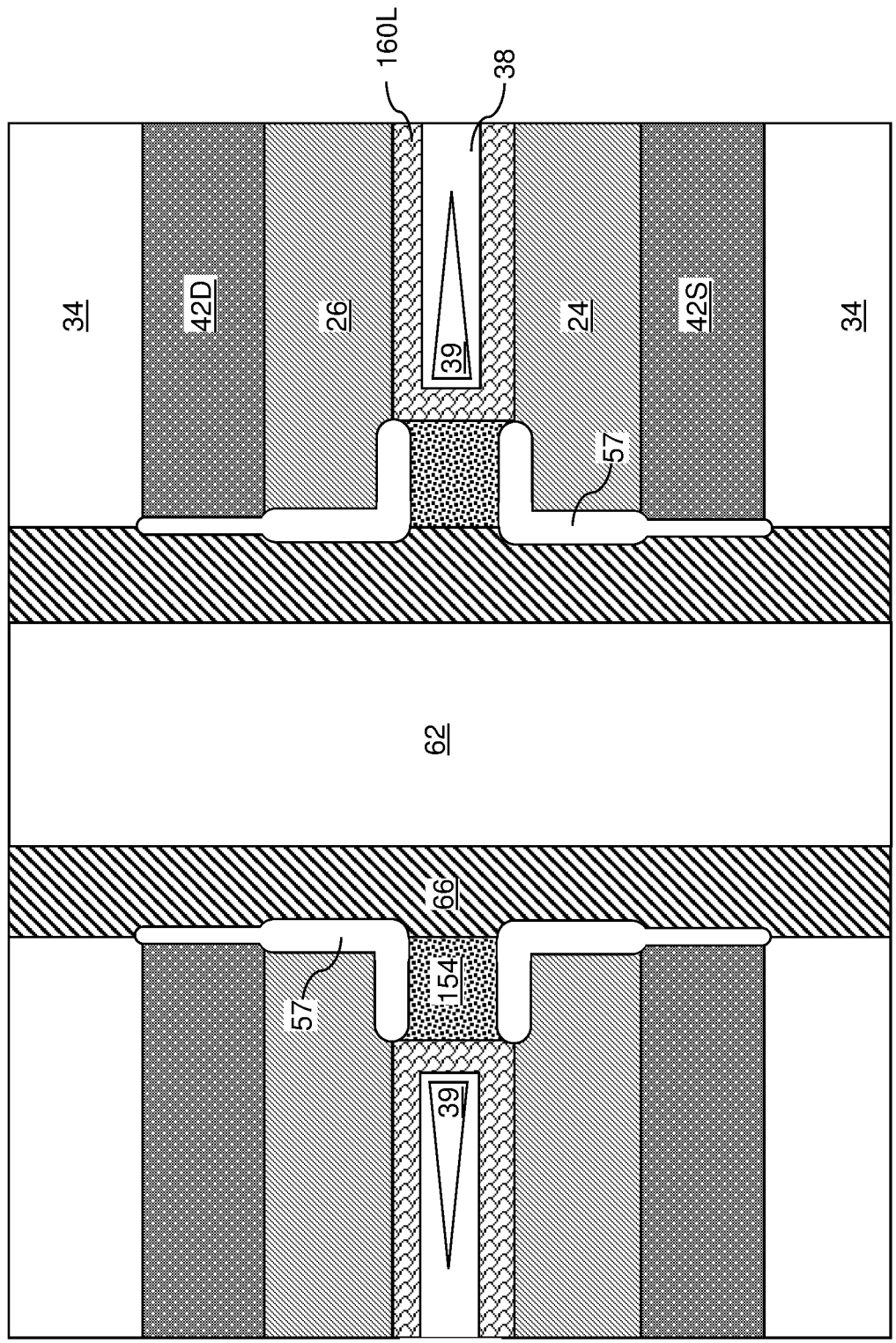

Referring to FIG. 19H, a dielectric material can be non-conformally deposited in the channel-level cavities 33. Channel-level insulating layers 38 are formed in the channel-level cavities 33 with encapsulated cavities 39 (i.e., airgaps) therein. Specifically, each of the channel-level insulating layers 38 can be formed as a dielectric encapsulation layer that embeds a respective encapsulated cavity 39 that is free of any solid phase material therein. In one embodiment, each dielectric encapsulation layer of the channel-level insulating layers 38 can include undoped silicate glass, a doped silicate glass, or porous or non-porous organosilicate glass. Each channel-level insulating layer 38 can include a dielectric encapsulation layer and an encapsulated cavity 39. The volume of an encapsulated cavity 39 may be in a range from 1% to 90% of the entire volume of a respective channel-level insulating layer 38 that includes the encapsulated cavity 39. An encapsulated cavity 39 may continuously laterally surround a plurality of memory opening fill structures. A sidewall recess along the backside trench 79 wall may be performed to remove the channel-level insulating layer 38 and the continuous semiconductor channel layer 160L from the backside trench 79 in order to separate the continuous semiconductor channel layer 160L into separate channels for the respective vertically separated transistors and to provide access to the source and drain level sacrificial layers for their removal in the subsequent step.

Figure 19I:
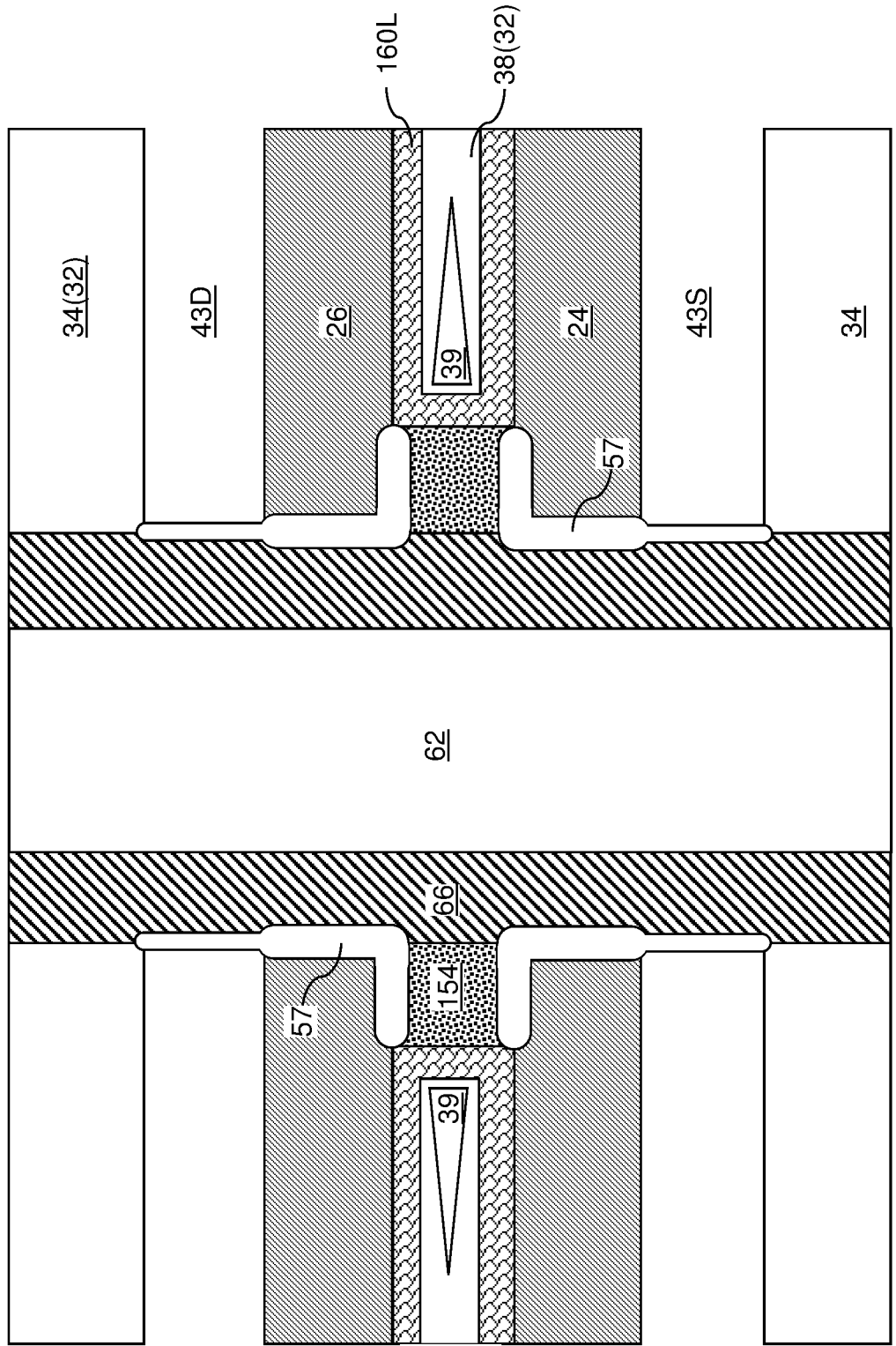

Referring to FIG. 19I, an etchant that selectively etches the materials of the source sacrificial material layers 42S and drain sacrificial material layers 42D with respect to the materials of the channel-level insulating layers 38, the doped semiconductor source layers 24, the doped semiconductor drain layers 26, the inter-transistor-level insulating layers 34, the retro-stepped dielectric material portions 65, and the memory material portions 154 can be introduced into the backside trenches 79, for example, employing an etch process. Source-level backside recesses 43S and drain-level backside recesses 43D are formed in volumes from which the source sacrificial material layers 42S and drain sacrificial material layers 42D are removed, respectively. In one embodiment, the source sacrificial material layers 42S and drain sacrificial material layers 42D can include silicon nitride, and the materials of the insulating layers 32 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials.

Each backside recess (43S, 43D) can be a laterally extending cavity having a lateral dimension that is greater than the vertical extent of the cavity. In other words, the lateral dimension of each backside recess (43S, 43D) can be greater than the height of the backside recess (43S, 43D). A plurality of source-level backside recesses 43S and the drain-level backside recesses 43D can be formed in the volumes from which the materials of the source sacrificial material layers 42S and drain sacrificial material layers 42D are removed. Each of the plurality of source-level backside recesses 43S and the drain-level backside recesses 43D can extend substantially parallel to the top surface of the substrate 9. In one embodiment, each backside recess (43S, 43D) can have a uniform height throughout.

Figure 19J:
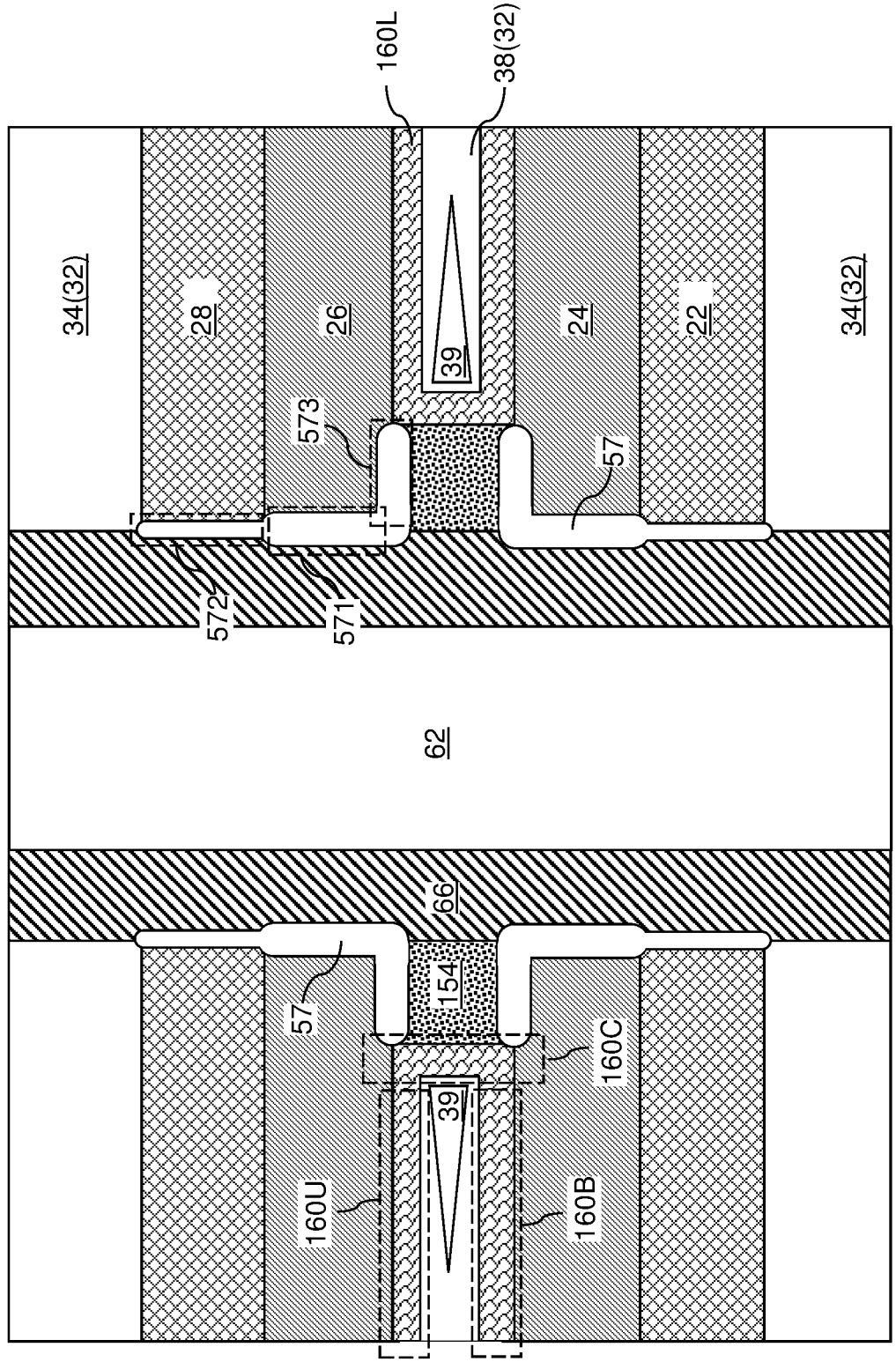

Referring to FIG. 19J, the processing steps of FIG. 10 can be performed. Referring collectively to FIGS. 19J and 10, at least one metallic material can be deposited in the source-level backside recesses 43S and the drain-level backside recesses 43D through the backside trenches 79. The at least one metallic material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. The at least one metallic material fills all volumes of the source-level backside recesses 43S and the drain-level backside recesses 43D. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers 22, which function as portions of electrically conductive source layers. Remaining portions of the at least one metallic material that fills the drain-level backside recesses 43D constitute metallic drain layers 28, which function as portions of electrically conductive bit layers.

Each contiguous combination of a doped semiconductor source layer 24 and a metallic source layer 22 constitutes a source layer (22, 24) that functions as a combination of a source region and a source line for a respective two-dimensional array of vertical field effect transistors. Each contiguous combination of a doped semiconductor drain layer 26 and a metallic drain layer 28 constitutes a drain layer (26, 28) that functions as a combination of a drain region and a bit line for a respective two-dimensional array of vertical field effect transistors.

Generally, the source sacrificial material layer 42S and the drain-level sacrificial material layers 42D are replaced with the metallic source layers 22 and the metallic drain layers 28 (i.e., source lines and bit lines), respectively. In this case, each of the source layers (22, 24) comprises a vertical stack of a doped semiconductor source layer 24 and a metallic source layer 22, and each of the drain layers (26, 28) comprises a vertical stack of a doped semiconductor drain layer 26 and a metallic drain layer 28. An alternating stack of source layers (22, 24) and drain layers (26, 28) is formed over the substrate 9.

Insulating layers (38, 34) are located between each vertically neighboring pair of a source layer (22, 24) and drain layer (26, 28). The channel-level spacer layers 38 may, or may not, have a different material composition than the inter-transistor-level insulating layers 34. In one embodiment, each semiconductor channel layer 160L contacts and embeds on three sides a respective channel-level spacer layer 38 located between a respective vertically neighboring pair of a source layer (22, 24) and a drain layer (26, 28). The insulating layers 32 are interlaced with the source layers (22, 24) and the drain layers (26, 28) of the alternating stack of source layers (22, 24) and drain layers (26, 28). The insulating layers 32 comprise channel-level insulating layers (comprising channel-level spacer layers 38) in contact with a respective one of the semiconductor channel layers 160L, and inter-transistor-level insulating layers 34 located between vertically neighboring pairs of the channel-level insulating layers (comprising channel-level spacer layers 38) and not contacting any of the semiconductor channel layers 160L.

Semiconductor oxide spacers 57 laterally contact a respective one of the source layers (22, 24) and the drain layers (26, 28). The semiconductor oxide spacers 57 contact a respective one of the semiconductor channel layers 160L. The first vertically extending segments 571 and the laterally extending portions 573 of the semiconductor oxide spacers 57 are formed by oxidation of doped semiconductor material portions, i.e., portions of the doped semiconductor source layers 24 and the doped semiconductor drain layers 26. As such, the first vertically extending segments 571 and the laterally extending portions 573 of the semiconductor oxide spacers 57 can include dopants of the first conductivity type at an atomic concentration in a range from $1.0 \times 10^{16}/cm^3$ to $1.0 \times 10^{19}/cm^3$. In contrast, the second vertically extending segments 572 of the semiconductor oxide spacers 57 can be substantially free of any electrical dopants, i.e., may contain electrical dopants of any conductivity type at an atomic concentration less than $1.0 \times 10^{16}/cm^3$, such as less than $1.0 \times 10^{13}/cm^3$. Each semiconductor channel layer 160L may comprise a plurality of cylindrical sidewalls that contact with outer cylindrical sidewalls of a plurality of memory material portions 154 located at a same level, i.e., at a same height from a top surface of the substrate 9. Each semiconductor channel layer 160L may comprise a plurality of cylindrical sidewalls that contact with outer cylindrical sidewalls of a plurality of memory material portions 154 located at a same level, i.e., at a same height from a top surface of the substrate 9.

A composite channel-level layer (38, 160L) can be formed at each level of the memory material portions 154. Each composite channel-level layer (38, 160L) comprises a semiconductor channel layer 160L including a cylindrical channel portion 160C, an upper horizontally-extending portion 160U adjoined to a top end of the cylindrical channel portion 160C, and a lower horizontally-extending portion 160B adjoined to a bottom end of the cylindrical channel portion 160C. Further, each composite channel-level layer (38, 160L) includes a channel-level insulating layer 38 laterally surrounding the cylindrical channel portion 160C and located between the upper horizontally-extending portion 160U and the lower horizontally extending portion 160B of the semiconductor channel layer 160L.

Any residual portion of the semiconductor channel layers 160L, the metallic source layers 22, and the metallic drain layers 28, if present at this processing step, can be removed by performing an etch back process, which may employ an anisotropic etch process and/or an isotropic etch process. Subsequently, the processing steps of FIGS. 11 and 12A-12C can be performed to complete manufacture of the fourth exemplary structure.

Figure 20A:
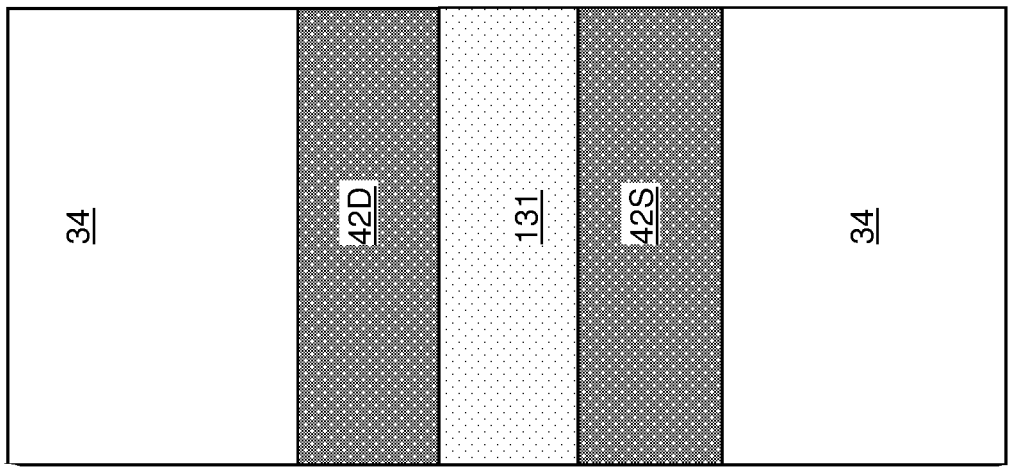
FIGS. 20A-20F are sequential vertical cross-sectional view of a region in a memory opening in a fifth exemplary structure during formation of a memory opening fill structure according to a fifth embodiment of the present disclosure.
Figure 20A:
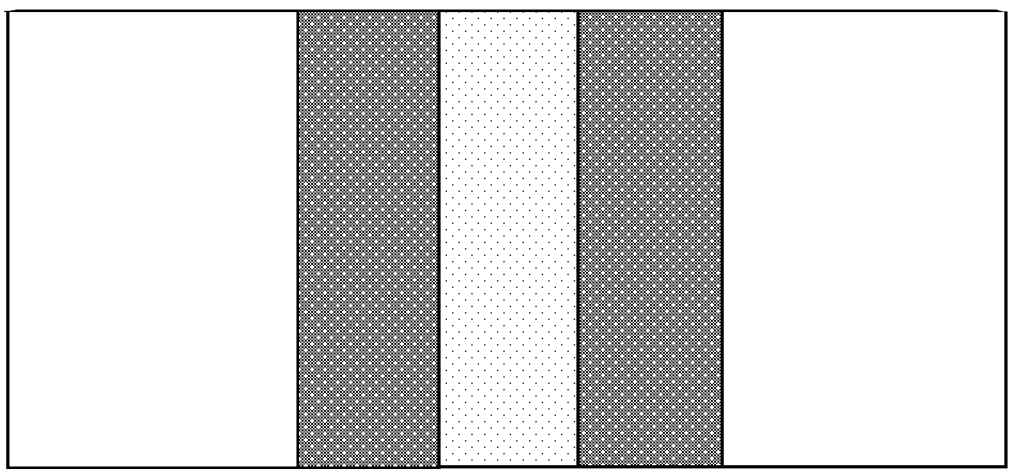

Referring to FIG. 20A, a fifth exemplary structure according to a fifth embodiment of the present disclosure is illustrated at a processing step corresponding to the processing steps of FIGS. 3A and 3B. The fifth exemplary structure at the processing steps of FIG. 20A may be derived from the third exemplary structure at the processing steps of FIGS. 3A and 3B by employing a sacrificial channel-level spacer layer 131 instead of each instance of the channel-level spacer layer 31, and by omitting formation of the doped semiconductor source layers 24 and the doped semiconductor drain layers 26. Generally, a vertical repetition of unit layer stacks (42S, 131, 42D, 34) can be formed over a substrate. Each of the unit layer stacks (42S, 131, 42D, 34) comprises a source-level material layer (which may include a source sacrificial material layer 42S), a sacrificial channel-level spacer layer 131, a drain-level material layer (which may include a drain sacrificial material layer 42D), and an inter-transistor-level insulating layer 34. Thus, the unit layer stack (42S, 131, 42D, 34) in the fifth exemplary structure may differ from the unit layer stack (42S, 31, 42D, 34) in the first exemplary structure of FIGS. 4 and 5A by the presence of the sacrificial channel-level spacer layer 131 instead of a channel-level spacer layer 31, and by omission of a doped semiconductor source layer 24 and a doped semiconductor drain layer 26.

Each sacrificial channel-level spacer layer 131 includes a sacrificial material that is different from the materials of the source-level material layer (which may include a source sacrificial material layer 42S), the drain-level material layer (which may include a drain sacrificial material layer 42D), and the inter-transistor-level insulating layer 34. In an illustrative example, the sacrificial channel-level spacer layer 131 may include a germanium-containing material (such as a silicon-germanium alloy) including germanium at an atomic percentage in a range from 15% to 100%, amorphous carbon, diamond-like carbon, porous or non-porous organosilicate glass, a silicon-containing polymer material, or a carbon-based polymer material. The sacrificial channel-level spacer layers 131 may be deposited by chemical vapor deposition, physical vapor deposition, spin coating. The thickness of each sacrificial channel-level spacer layer 131 can be in a range from 20 nm to 80 nm, although lesser and greater thicknesses can also be employed.

Generally, the source-level material layers are formed as, or are subsequently replaced with, source layers comprising at least one source-side conductive material, and the drain-level material layers are formed as, or are subsequently replaced with, drain layers comprising at least one drain-side conductive material. In the case of the fifth exemplary structure, each source-level material layer can include a source sacrificial material layer 42S that is subsequently replaced with a metallic source layer. Each drain-level material layer can include a drain sacrificial material layer 42D that is subsequently replaced with a metallic drain layer.

In one embodiment, each of the source-level material layers comprises a respective sacrificial source-level material layer 42S, and each of the drain-level material layers comprises a respective sacrificial drain-level material layer 42D. In one embodiment, each of the silicon nitride.

Figure 20B:
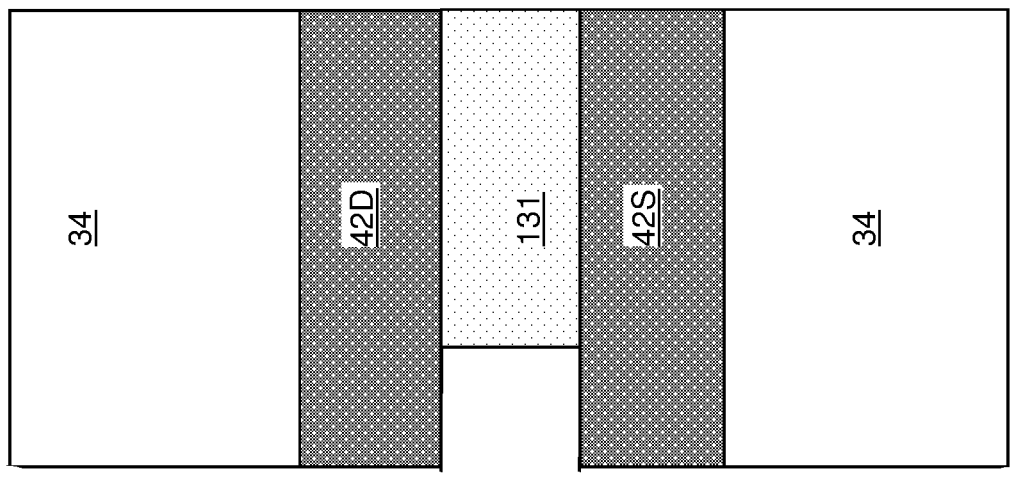
Figure 20B:
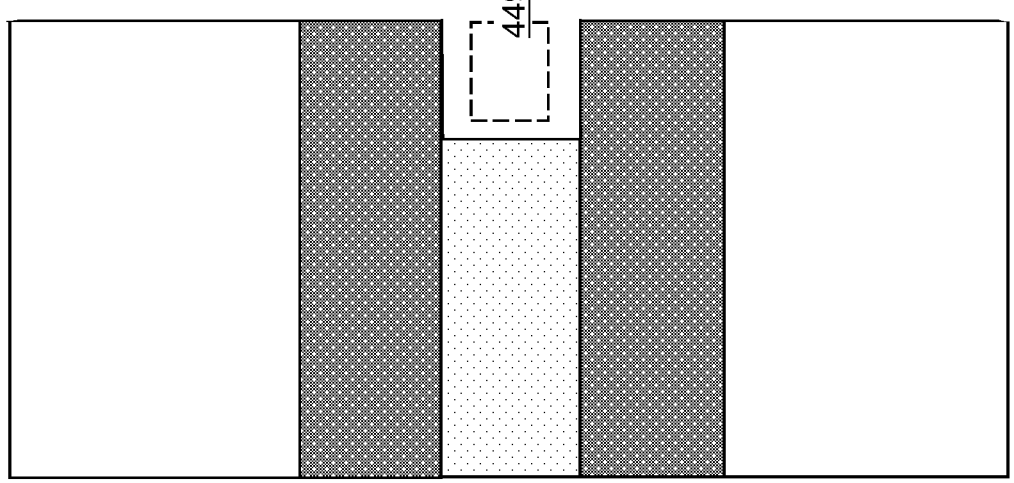

Referring to FIG. 20B, the processing steps of FIG. 19A can be performed to form annular recess cavities 449. The lateral recess distance of each annular recess cavity 449 may be in a range from 10 nm to 100 nm, such as from 20 nm to 50 nm, although lesser and greater lateral recess distances may also be employed.

Figure 20C:
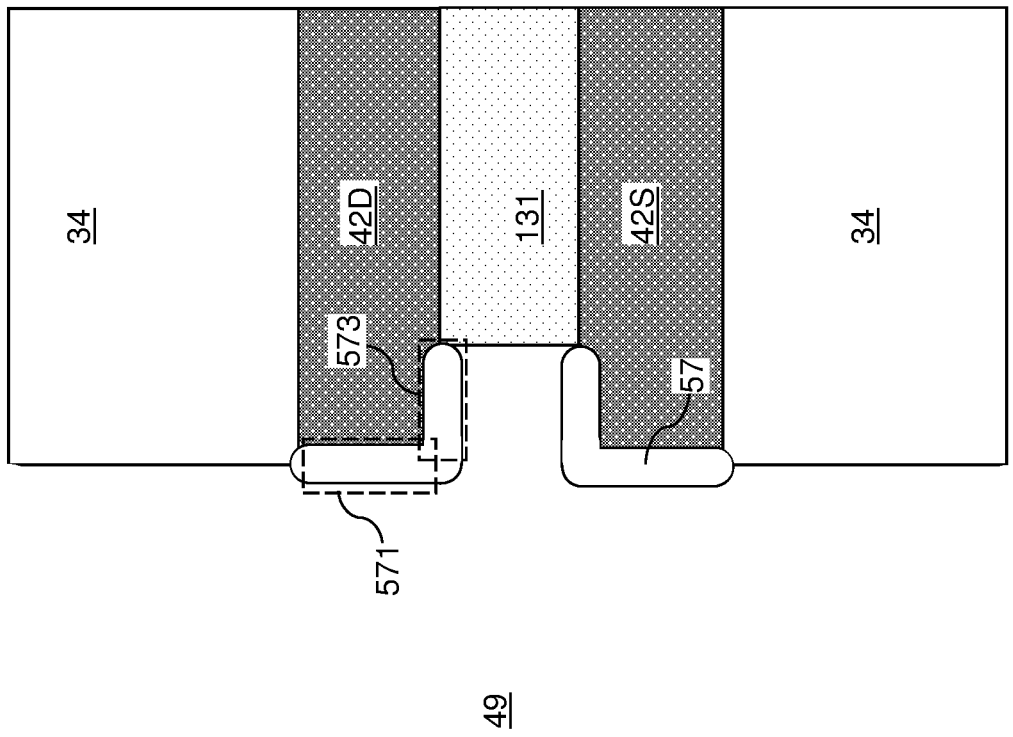
Figure 20C:
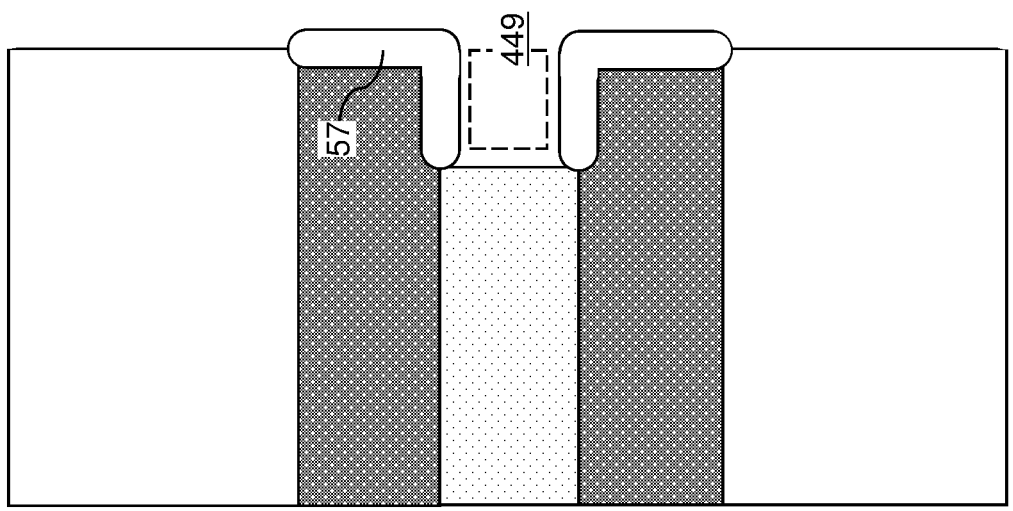

Referring to FIG. 20C, the processing steps of FIG. 19B can be performed to form semiconductor oxide spacers 57, such as silicon oxide spacers. Specifically, surface portions of the sacrificial source-level material layer 42S and the sacrificial drain-level material layers 42D may be oxidized to form the semiconductor oxide spacers 57 by converting silicon nitride to silicon oxide. Each semiconductor oxide spacer 57 may include a first vertically extending segment 571 and a laterally extending portions 573. In case the sacrificial source-level material layer 42S and the sacrificial drain-level material layers 42D comprise silicon oxide, the semiconductor oxide spacers 57 may be substantially free of electrical dopants of any conductivity type.

Figure 20D:
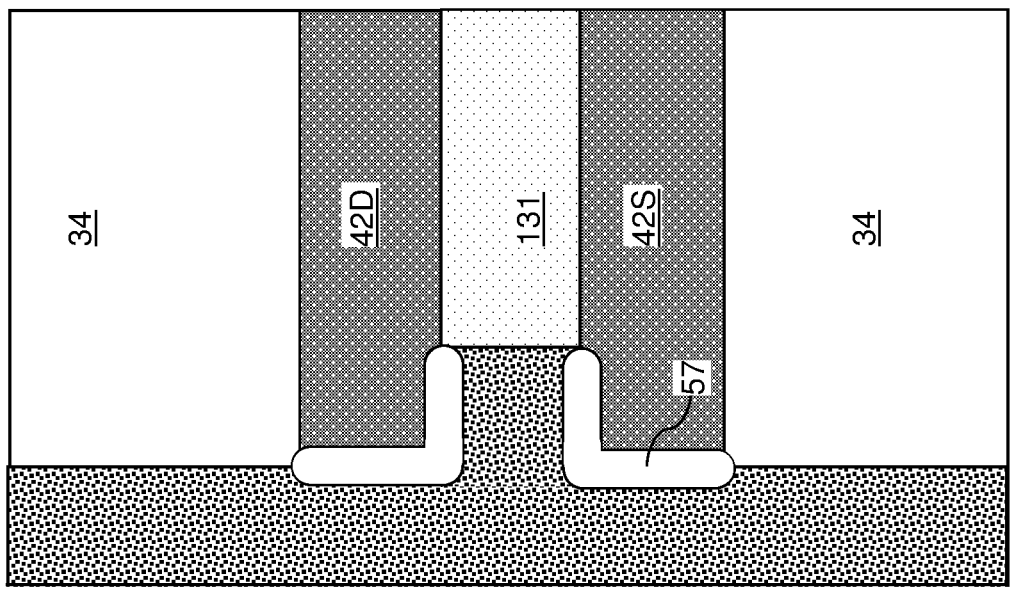
Figure 20D:
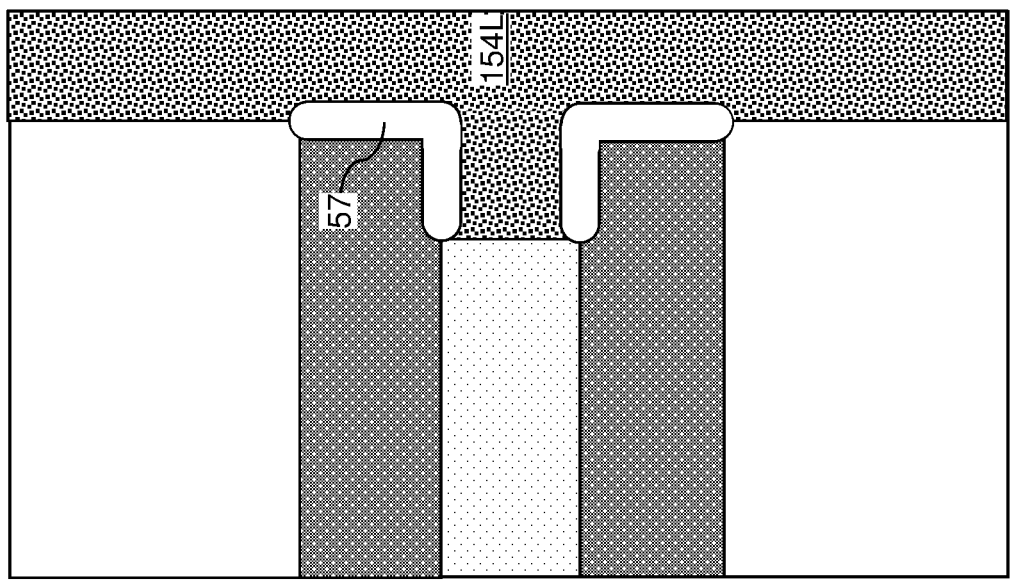

Referring to FIG. 20D, the processing steps of FIG. 19C can be performed to deposit a memory material layer.

Figure 20E:
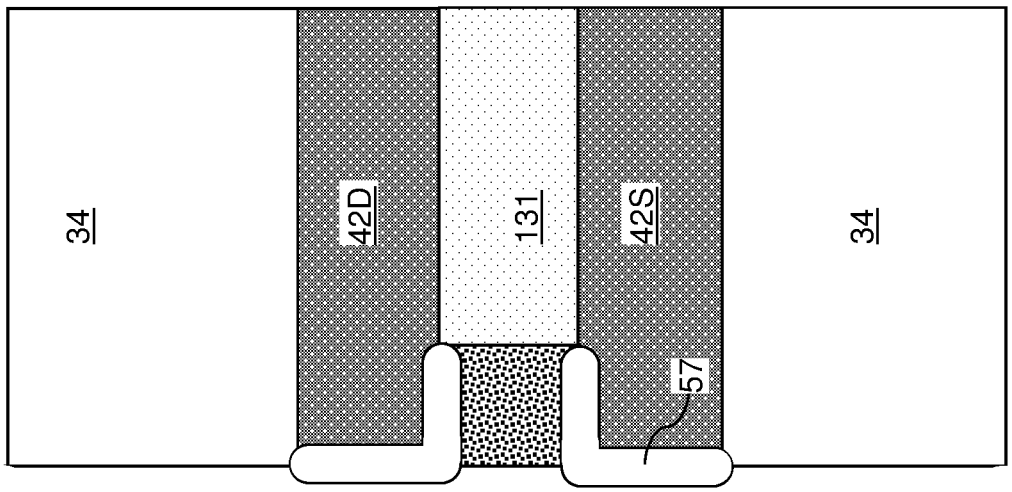
Figure 20E:
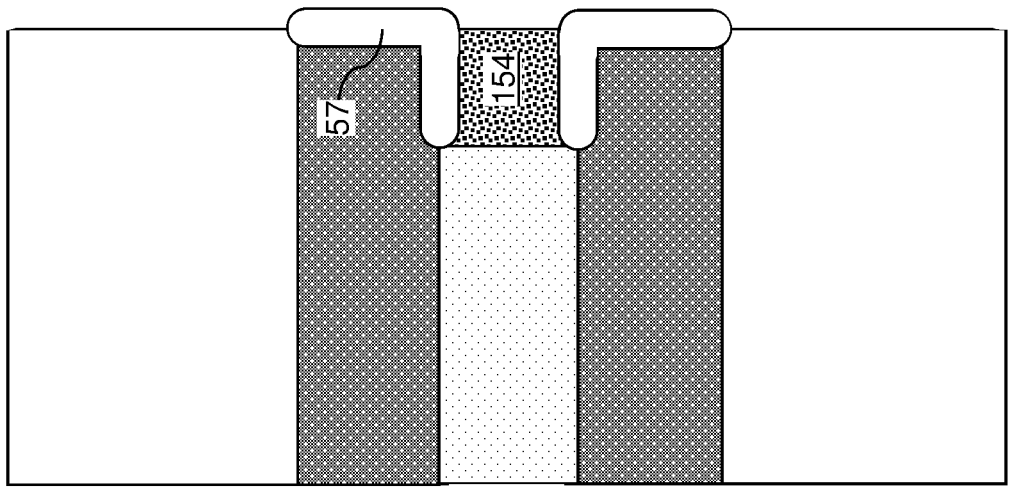

Referring to FIG. 20E, the processing steps of FIG. 19D can be performed to form memory material portions 154.

Figure 20F:
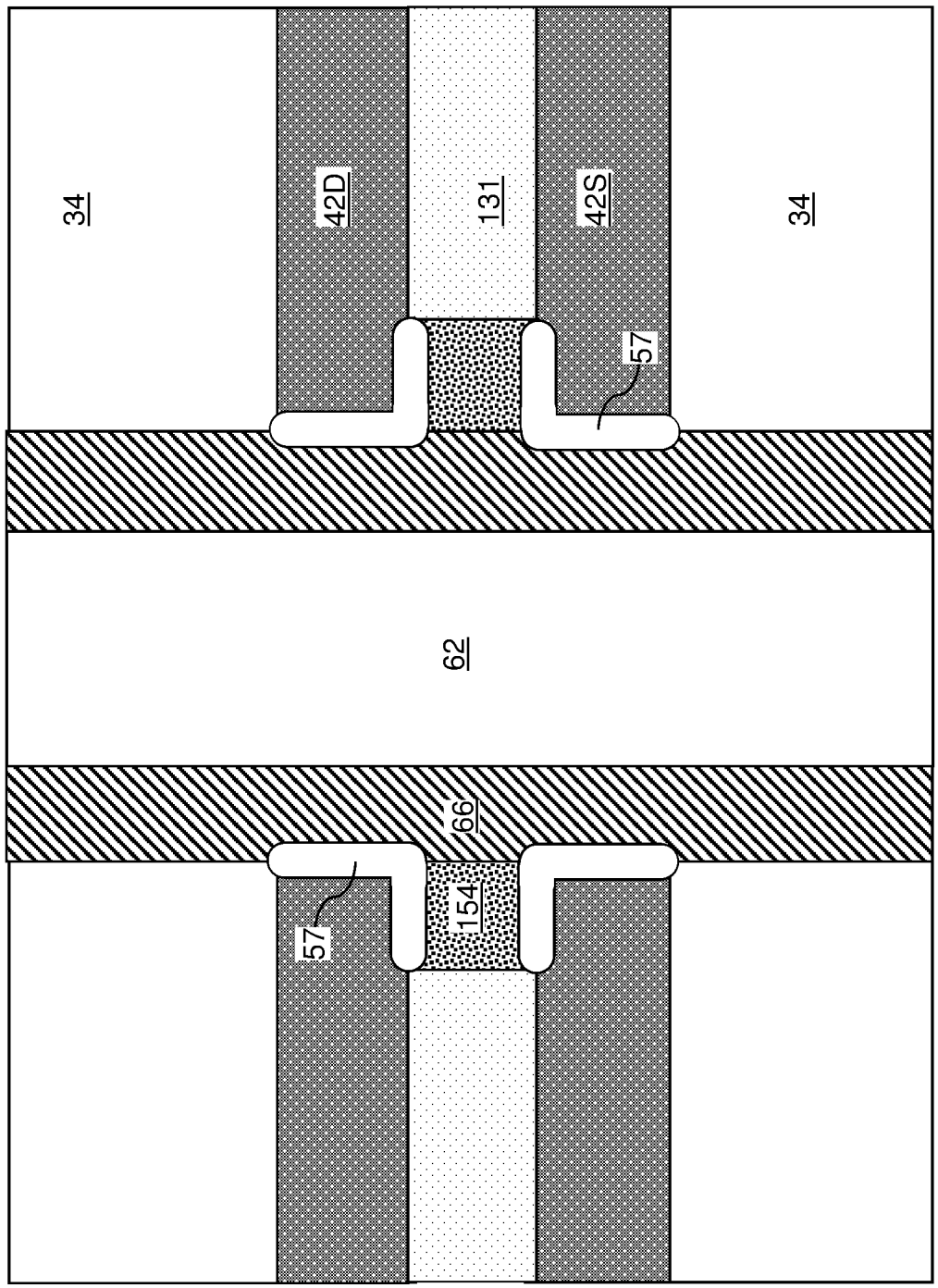

Referring to FIG. 20F, the processing steps of FIG. 19E can be performed to form a vertical word line 66 and a dielectric core 62 within each memory opening 49.

Figure 20G:
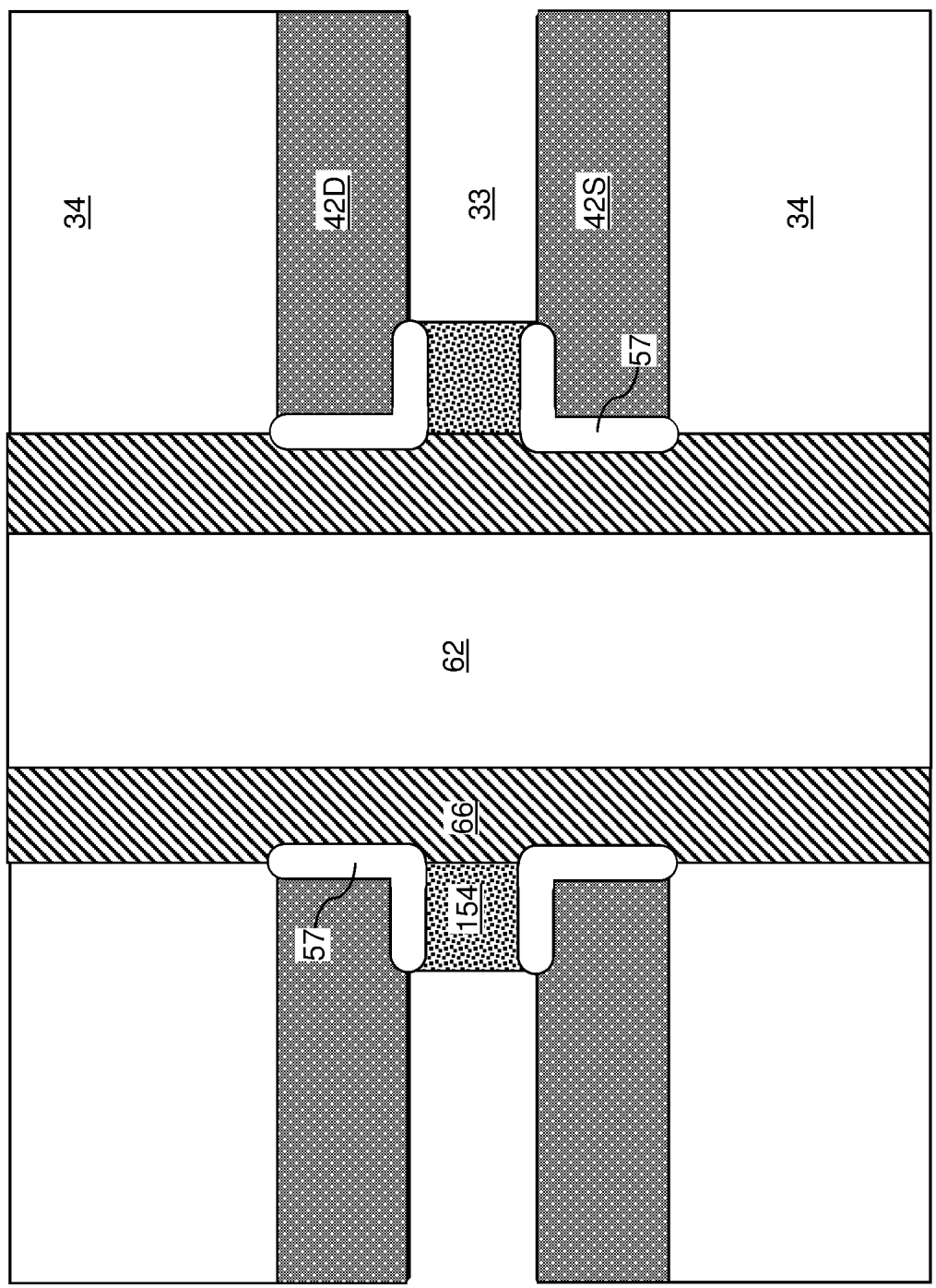
FIGS. 20G-20K are sequential vertical cross-sectional view of a region in a memory opening in the fifth exemplary structure during formation of semiconductor channel layers and electrically conductive layers according to the fifth embodiment of the present disclosure.

Referring to FIG. 20G, the processing steps of FIGS. 7 and 8 may be subsequently performed to form contact pad structures 68 and backside trenches 79. Subsequently, an isotropic etchant is introduced into the backside trenches 79 in an isotropic etch process. The isotropic etchant has an etch chemistry that etches the material of the sacrificial channel-level spacer layers 131 selective the materials of the source sacrificial material layers 42S, the drain sacrificial material layers 42D, and the inter-transistor-level insulating layers 34. In one embodiment, the etch rate of the material of the sacrificial channel-level spacer layers 131 in the isotropic etchant may be at least 10 times, such as at least 100 times, the collateral etch rates of the source sacrificial material layers 42S, the drain sacrificial material layers 42D, and the inter-transistor-level insulating layers 34. In an illustrative example, if the sacrificial channel-level spacer layers 131 include a silicon-germanium alloy, a wet etch process employing a mixture of hydrogen peroxide and dilute hydrofluoric acid may be employed. If the sacrificial channel-level spacer layers 131 include organosilicate glass or borosilicate glass, a wet etch process employing dilute hydrofluoric acid may be employed. Alternatively, if the sacrificial channel-level spacer layers 131 include a carbon-based material or a thermally-decomposable silicon-based polymer, an ashing process may be performed to remove the sacrificial channel-level spacer layers 131 selective to the source sacrificial material layers 42S, the drain sacrificial material layers 42D, and the inter-transistor-level insulating layers 34. Generally, sacrificial channel-level spacer layers 131 are removed selective to the source sacrificial material layers 42S, the drain sacrificial material layers 42D, and the inter-transistor-level insulating layers 34, i.e., without removing, or with minimal collateral removal of, the source sacrificial material layers 42S, the drain sacrificial material layers 42D, and the inter-transistor-level insulating layers 34. Channel-level cavities 33 are formed in volumes from which the material of the sacrificial channel-level spacer layers 131 is removed.

Figure 20H:
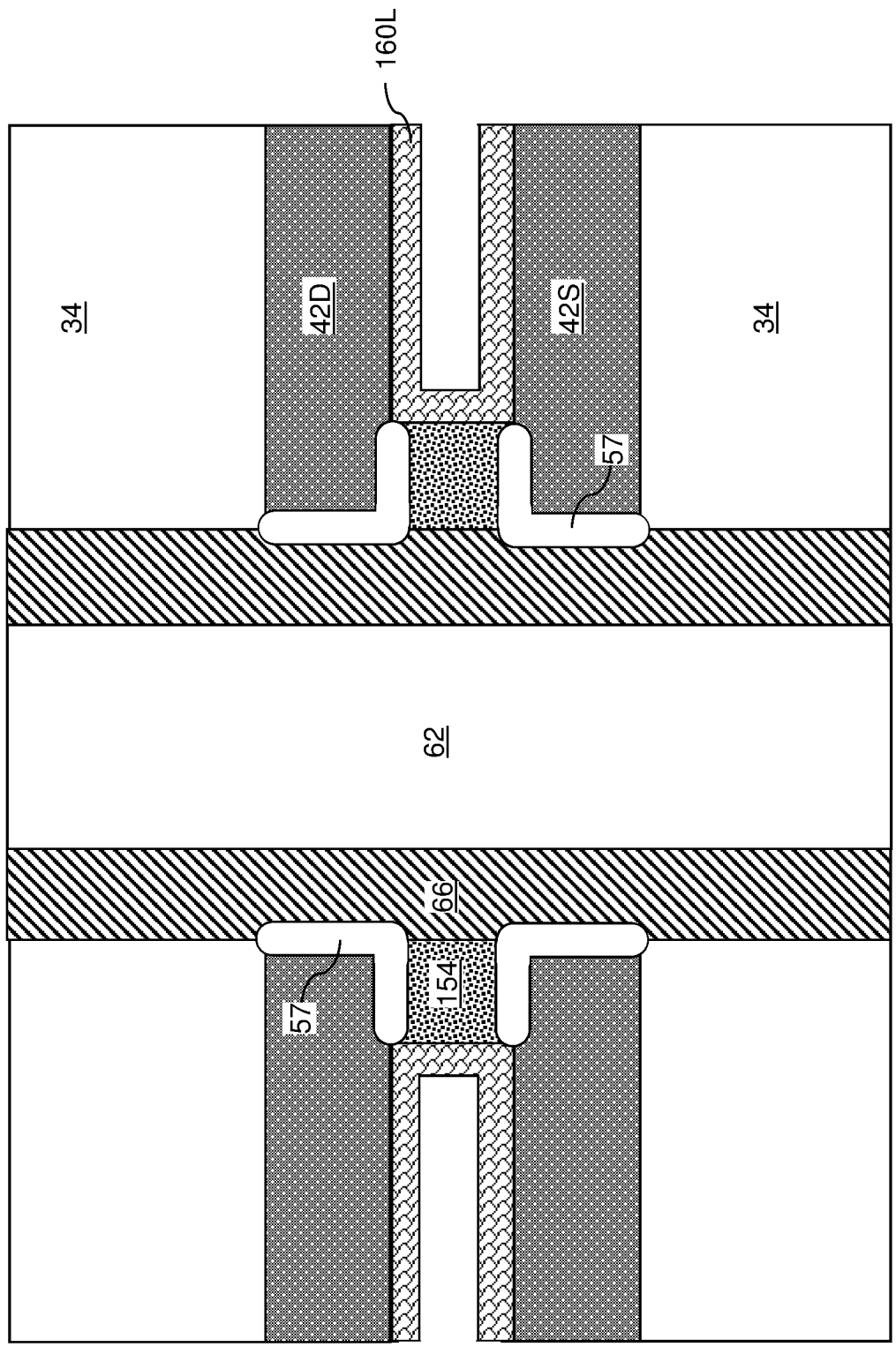

Referring to FIG. 20H, the processing steps of FIG. 19G can be performed to deposit a semiconductor channel layer 160L in the peripheral regions of the channel-level cavities 33 and over the physically exposed cylindrical surfaces of the memory material portions 154. The thickness of the continuous semiconductor channel layer 160L can be selected such that a gap remains between an upper horizontally-extending portion and a lower horizontally-extending portion of the continuous semiconductor channel layer 160L within each of the channel-level cavities 33. In one embodiment, the thickness of the continuous semiconductor channel layer 160L may be the in a range from 1 nm to 15 nm, such as from 3 nm to 10 nm, although lesser and greater thicknesses can also be employed. The semiconductor channel layer 160L is formed directly on physically exposed horizontal surfaces of the source sacrificial material layers 42S and the drain sacrificial material layers 42D, physically exposed outer cylindrical surfaces of the memory material portions 154, and any physically exposed surface segments of semiconducting oxide spacers 57.

Figure 20I:
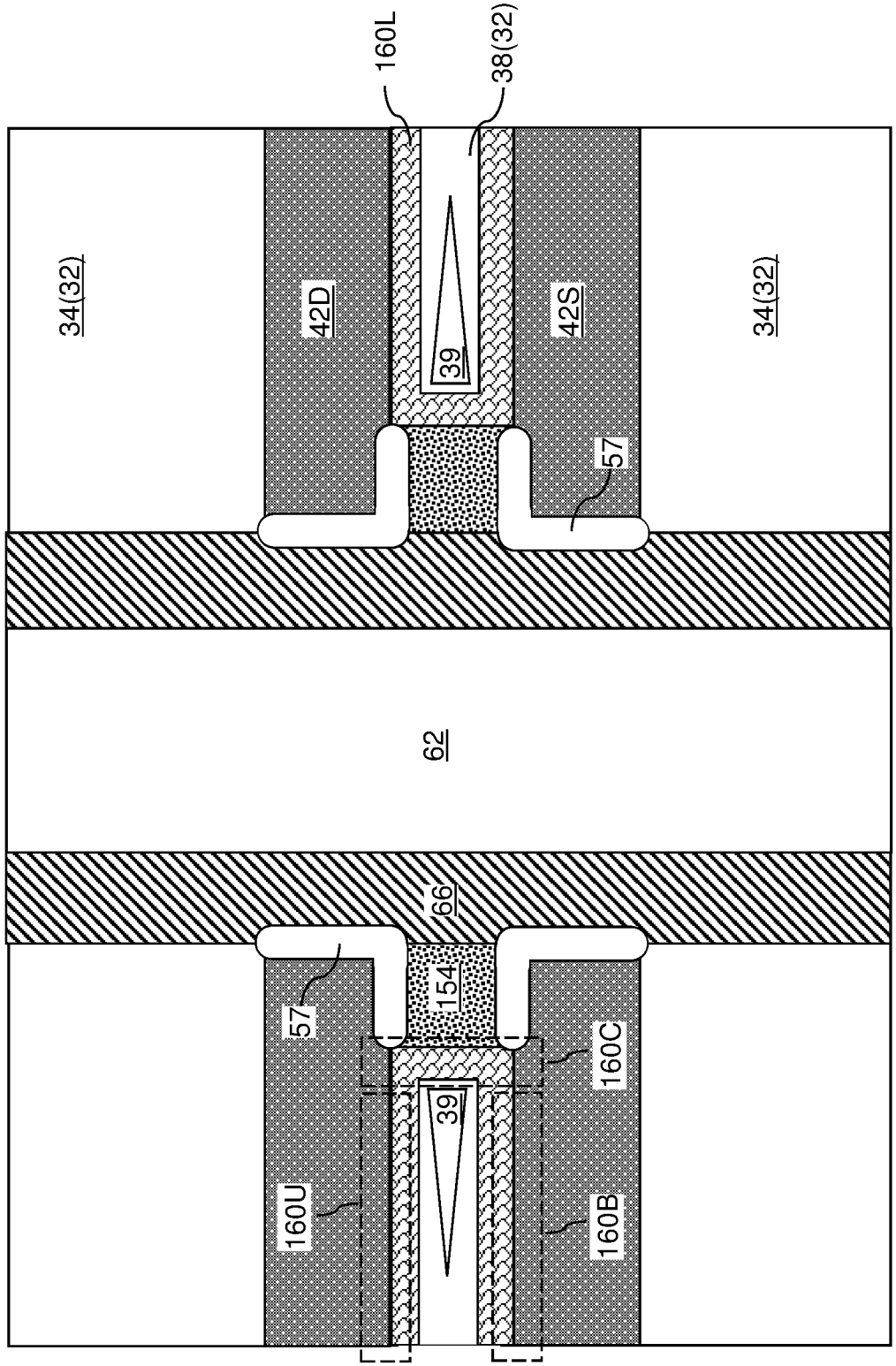

Referring to FIG. 20I, the processing steps of FIG. 19H can be performed to form channel-level insulating layers 38 in the channel-level cavities 33 with encapsulated cavities 39 (i.e., airgaps) therein. A sidewall recess along the backside trench 79 wall may be performed to remove the channel-level insulating layer 38 and the continuous semiconductor channel layer 160L from the backside trench 79 in order to separate the continuous semiconductor channel layer 160L into separate channels for the respective vertically separated transistors and to provide access to the source and drain level sacrificial layers for their removal in the subsequent step.

Figure 20J:
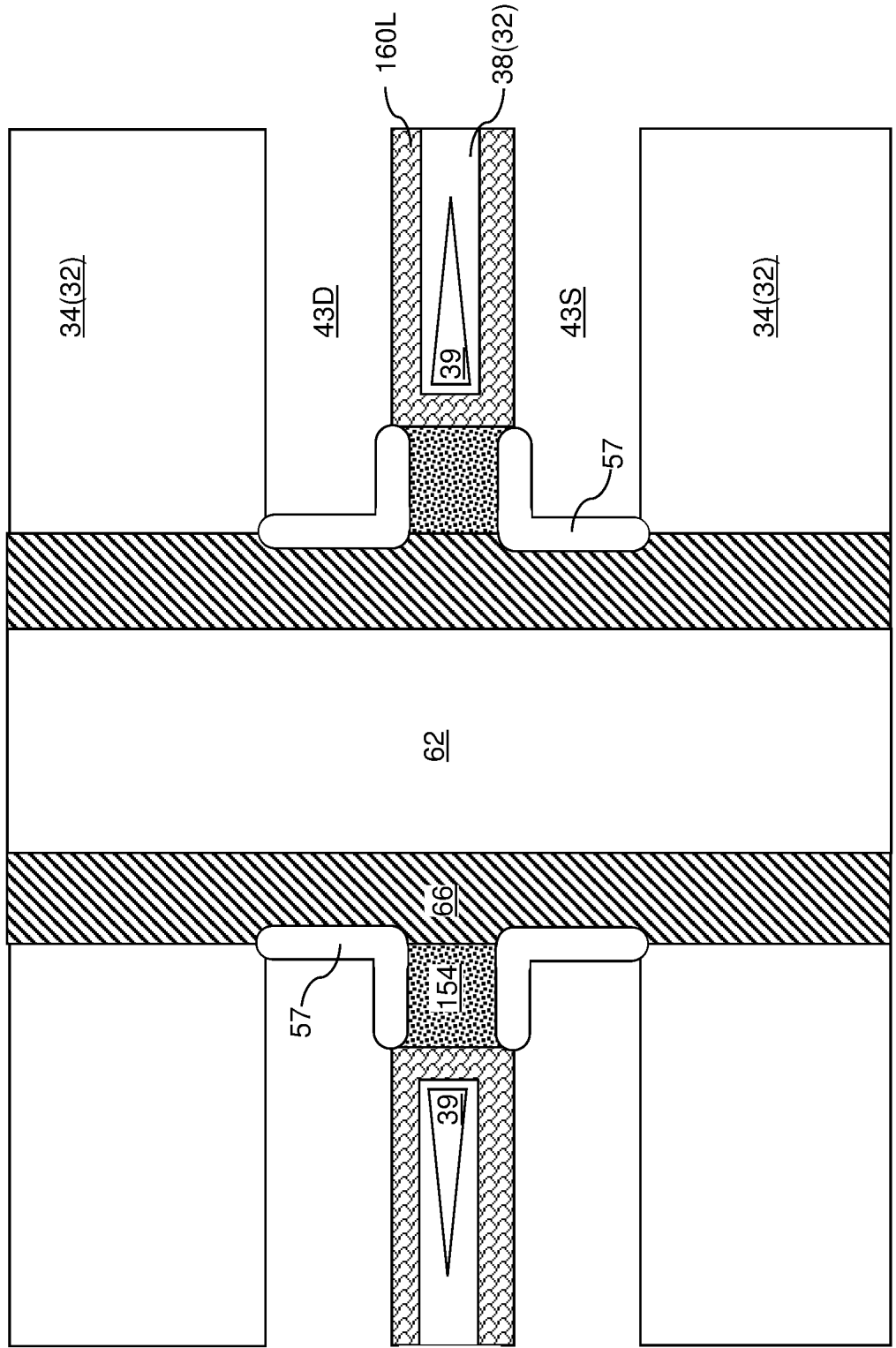

Referring to FIG. 20J, an etchant that selectively etches the materials of the source sacrificial material layers 42S and drain sacrificial material layers 42D with respect to the materials of the channel-level insulating layers 38, the inter-transistor-level insulating layers 34, the retro-stepped dielectric material portions 65, and the memory material portions 154 can be introduced into the backside trenches 79, for example, employing an etch process. Source-level backside recesses 43S and drain-level backside recesses 43D are formed in volumes from which the source sacrificial material layers 42S and drain sacrificial material layers 42D are removed, respectively. In one embodiment, the source sacrificial material layers 42S and drain sacrificial material layers 42D can include silicon nitride, and the materials of the insulating layers 32 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials.

Each backside recess (43S, 43D) can be a laterally extending cavity having a lateral dimension that is greater than the vertical extent of the cavity. In other words, the lateral dimension of each backside recess (43S, 43D) can be greater than the height of the backside recess (43S, 43D). A plurality of source-level backside recesses 43S and the drain-level backside recesses 43D can be formed in the volumes from which the materials of the source sacrificial material layers 42S and drain sacrificial material layers 42D are removed. Each of the plurality of source-level backside recesses 43S and the drain-level backside recesses 43D can extend substantially parallel to the top surface of the substrate 9. In one embodiment, each backside recess (43S, 43D) can have a uniform height throughout. Horizontally surfaces of the semiconductor channel layer 160L can be physically exposed.

Figure 20K:
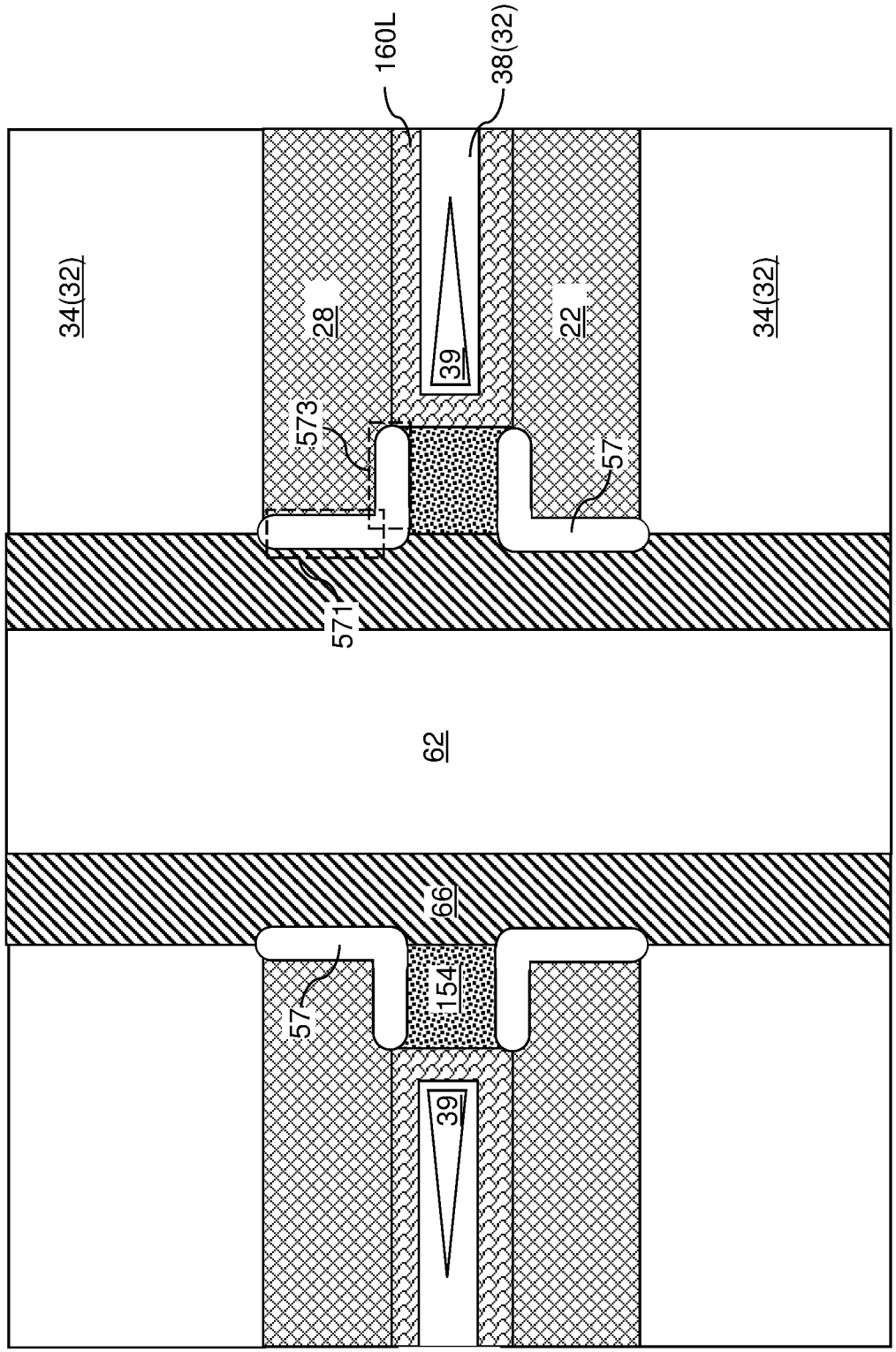

Referring to FIG. 20K, the processing steps of FIG. 10 can be performed. Referring collectively to FIGS. 20K and 10, at least one metallic material can be deposited in the source-level backside recesses 43S and the drain-level backside recesses 43D through the backside trenches 79. The at least one metallic material may be the same as described above. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers 22, which function as portions of electrically conductive source layers. Remaining portions of the at least one metallic material that fills the drain-level backside recesses 43D constitute metallic drain layers 28, which function as portions of electrically conductive bit layers.

Each metallic source layer 22 constitutes a source layer that functions as a combination of a source region and a source line for a respective two-dimensional array of vertical field effect transistors. Each metallic drain layer 28 constitutes a drain layer that functions as a combination of a drain region and a bit line for a respective two-dimensional array of vertical field effect transistors.

Generally, the source sacrificial material layer 42S and the drain-level sacrificial material layers 42D are replaced with the metallic source layers 22 and the metallic drain layers 28 (i.e., source lines and bit lines), respectively. An alternating stack of source layers and drain layers is formed over the substrate 9.

Insulating layers (38, 34) are located between each vertically neighboring pair of a source layer (embodied as a metallic source layer 22) and drain layer (embodied as a metallic drain layer 28). The channel-level spacer layers 38 may, or may not, have a different material composition than the inter-transistor-level insulating layers 34. In one embodiment, each memory material portion 154 contacts, and embeds, a respective channel-level spacer layer 38 located between a respective vertically neighboring pair of a source layer (comprising the metallic source layer 22) and a drain layer (comprising the metallic drain layer 28). The insulating layers 32 are interlaced with the source layers and the drain layers of the alternating stack of source layers and drain layers. The insulating layers 32 comprise channel-level insulating layers (comprising channel-level spacer layers 38) in contact with a respective one of the semiconductor channel layers 160L, and inter-transistor-level insulating layers 34 located between vertically neighboring pairs of the channel-level insulating layers (comprising channel-level spacer layers 38) and not contacting any of the semiconductor channel layers 160L.

Semiconductor oxide spacers 57 laterally contact a respective one of the source layers (22, 24) and the drain layers (26, 28). The semiconductor oxide spacers 57 contact a respective one of the semiconductor channel layers 160L and a respective one of the memory material portions 154. As such, the first vertically extending segments 571 and the laterally extending portions 573 of the semiconductor oxide spacers 57 can be substantially free of electrical dopants, i.e., may contain electrical dopants of any conductivity type at an atomic concentration less than $1.0 \times 10^{16}/cm^3$, such as less than $1.0 \times 10^{13}/cm^3$.

A composite channel-level layer (38, 160L) can be formed at each level of the memory material portions 154. Each composite channel-level layer (38, 160L) comprises a semiconductor channel layer 160L including a cylindrical channel portion 160C, an upper horizontally-extending portion 160U adjoined to a top end of the cylindrical channel portion 160C, and a lower horizontally-extending portion 160B adjoined to a bottom end of the cylindrical channel portion 160C. Further, each composite channel-level layer (38, 160L) includes a channel-level insulating layer 38 laterally surrounding the cylindrical channel portion 160C and located between the upper horizontally-extending portion 160U and the lower horizontally extending portion 160B of the semiconductor channel layer 160L.

Any residual portion of the metallic source layers 22 and the metallic drain layers 28, if present at this processing step, can be removed by performing an etch back process, which may employ an anisotropic etch process and/or an isotropic etch process. Subsequently, the processing steps of FIGS. 11 and 12A-12C can be performed to complete manufacture of the fifth exemplary structure.

Figure 21A:
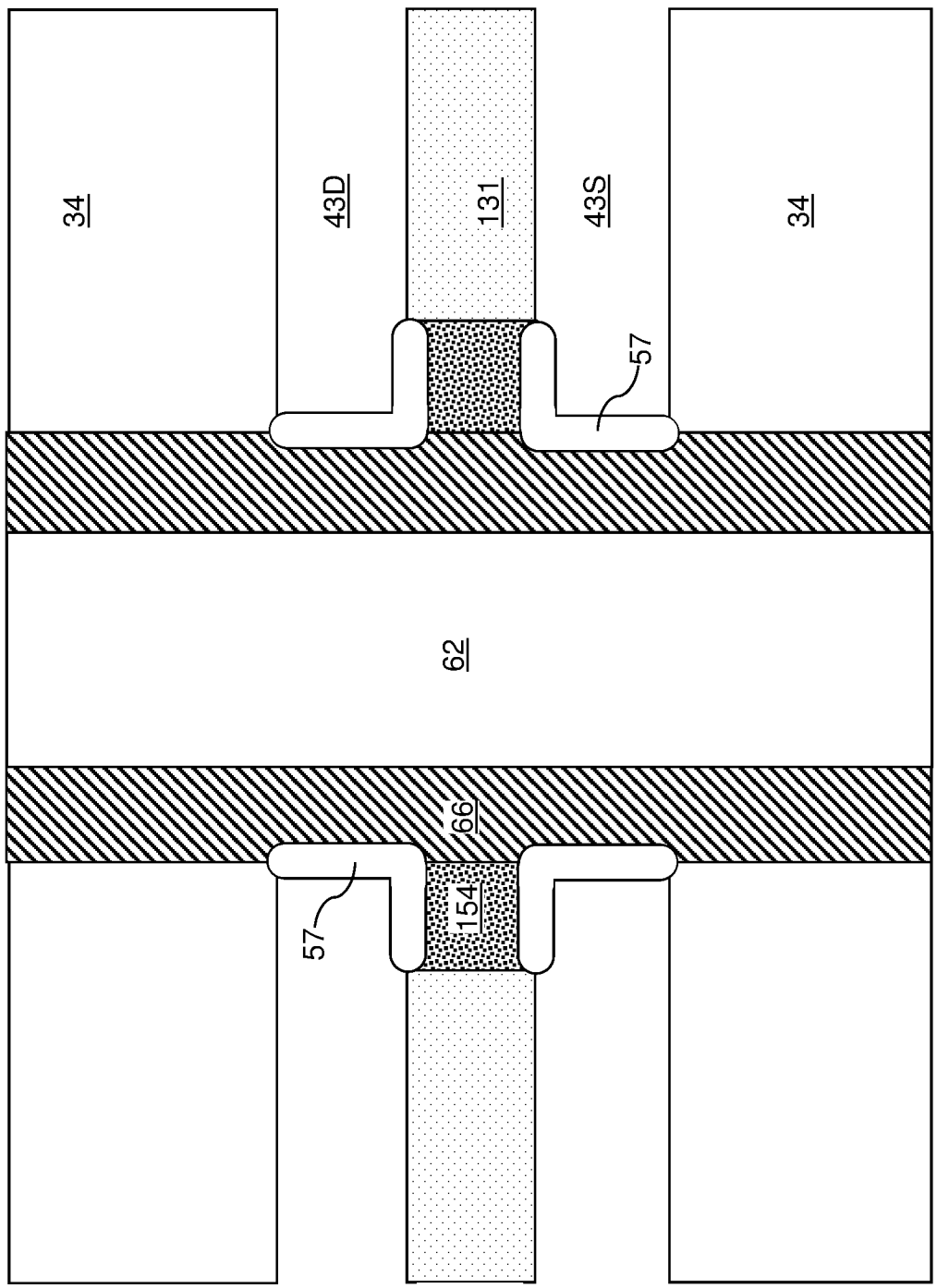
FIGS. 21A-21C are sequential vertical cross-sectional view of a region in a memory opening in a sixth exemplary structure during formation of a memory opening fill structure according to a sixth embodiment of the present disclosure.

Referring to FIG. 21A, a sixth exemplary structure according to a sixth embodiment of the present disclosure can be derived from the fifth exemplary structure of FIG. 20F by performing the processing steps of FIGS. 7 and 8 to form contact pad structures 68 and backside trenches 79, and by removing the source sacrificial material layers 42S and drain sacrificial material layers 42D selective to the sacrificial channel-level spacer layers 131 and the inter-transistor-level insulating layers 34.

Specifically, an etchant that selectively etches the materials of the source sacrificial material layers 42S and drain sacrificial material layers 42D with respect to the materials of the sacrificial channel-level spacer layers 131, the inter-transistor-level insulating layers 34, the retro-stepped dielectric material portions 65, and the semiconducting oxide spacers 57 can be introduced into the backside trenches 79, for example, employing an etch process. Source-level backside recesses 43S and drain-level backside recesses 43D are formed in volumes from which the source sacrificial material layers 42S and drain sacrificial material layers 42D are removed, respectively. In one embodiment, the source sacrificial material layers 42S and drain sacrificial material layers 42D can include silicon nitride, and the materials of the insulating layers 32 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials.

Each backside recess (43S, 43D) can be a laterally extending cavity having a lateral dimension that is greater than the vertical extent of the cavity. In other words, the lateral dimension of each backside recess (43S, 43D) can be greater than the height of the backside recess (43S, 43D). A plurality of source-level backside recesses 43S and the drain-level backside recesses 43D can be formed in the volumes from which the materials of the source sacrificial material layers 42S and drain sacrificial material layers 42D are removed. Each of the plurality of source-level backside recesses 43S and the drain-level backside recesses 43D can extend substantially parallel to the top surface of the substrate 9. In one embodiment, each backside recess (43S, 43D) can have a uniform height throughout. Horizontally surfaces of the semiconductor channel layer 160L can be physically exposed.

Figure 21B:
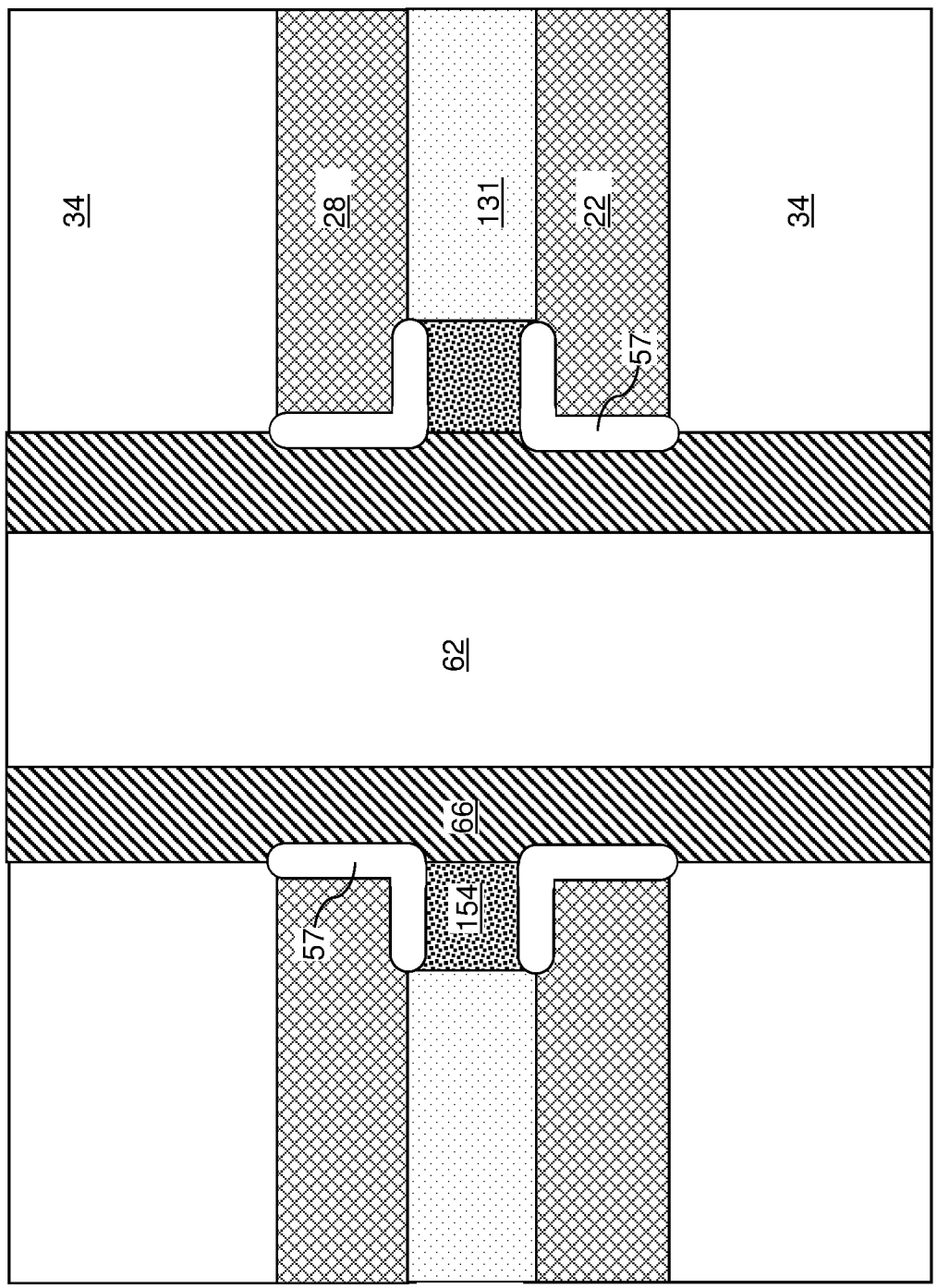

Referring to FIG. 21B, the processing steps of FIG. 10 can be performed. Referring collectively to FIGS. 21B and 10, at least one metallic material can be deposited in the source-level backside recesses 43S and the drain-level backside recesses 43D through the backside trenches 79. The at least one metallic material may be the same as described above. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers 22, which function as portions of electrically conductive source layers. Remaining portions of the at least one metallic material that fills the drain-level backside recesses 43D constitute metallic drain layers 28, which function as portions of electrically conductive bit layers.

Each metallic source layer 22 constitutes a source layer that functions as a combination of a source region and a source line for a respective two-dimensional array of vertical field effect transistors. Each metallic drain layer 28 constitutes a drain layer that functions as a combination of a drain region and a bit line for a respective two-dimensional array of vertical field effect transistors.

Generally, the source sacrificial material layer 42S and the drain-level sacrificial material layers 42D are replaced with the metallic source layers 22 and the metallic drain layers 28 (i.e., source lines and bit lines), respectively. An alternating stack of source layers and drain layers is formed over the substrate 9.

Figure 21C:
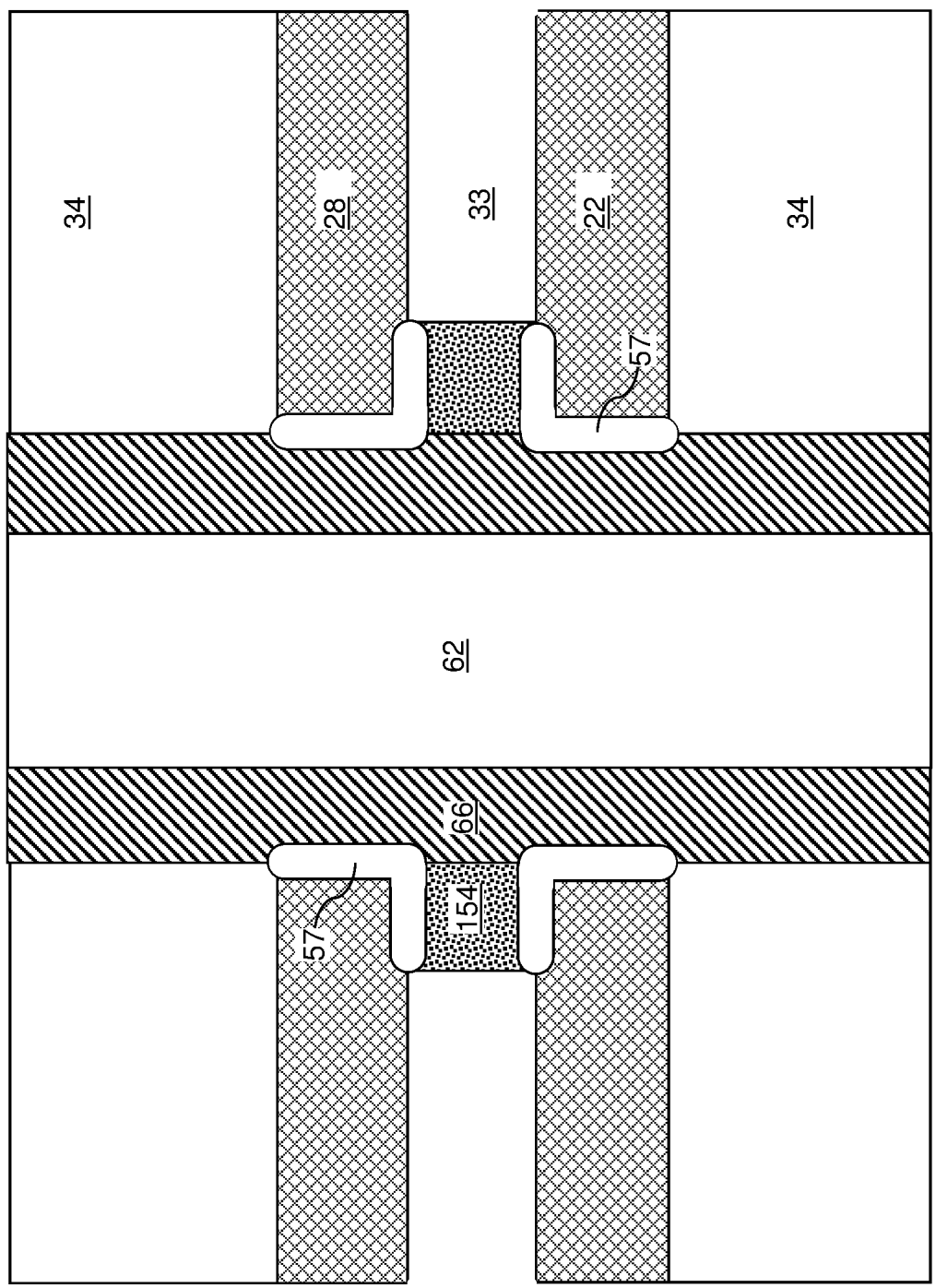

Referring to FIG. 21C, an isotropic etchant is introduced into the backside trenches 79 in an isotropic etch process. The isotropic etchant has an etch chemistry that etches the material of the sacrificial channel-level spacer layers 131 selective to the materials of the metallic source layers 22, the metallic drain layers 28, and the inter-transistor-level insulating layers 34. In one embodiment, the etch rate of the material of the sacrificial channel-level spacer layers 131 in the isotropic etchant may be at least 10 times, such as at least 100 times, the collateral etch rates of the metallic source layers 22, the metallic drain layers 28, and the inter-transistor-level insulating layers 34. In an illustrative example, if the sacrificial channel-level spacer layers 131 include a silicon-germanium alloy, a wet etch process employing a mixture of hydrogen peroxide and dilute hydrofluoric acid may be employed. If the sacrificial channel-level spacer layers 131 include organosilicate glass or borosilicate glass, a wet etch process employing dilute hydrofluoric acid may be employed. Alternatively, if the sacrificial channel-level spacer layers 131 include a carbon-based material or a thermally-decomposable silicon-based polymer, an ashing process may be performed to remove the sacrificial channel-level spacer layers 131 selective to the metallic source layers 22, the metallic drain layers 28, and the inter-transistor-level insulating layers 34. Generally, sacrificial channel-level spacer layers 131 are removed selective to the metallic source layers 22, the metallic drain layers 28, and the inter-transistor-level insulating layers 34, i.e., without removing, or with minimal collateral removal of, the metallic source layers 22, the metallic drain layers 28, and the inter-transistor-level insulating layers 34. Channel-level cavities 33 are formed in volumes from which the material of the sacrificial channel-level spacer layers 131 is removed.

Figure 21D:
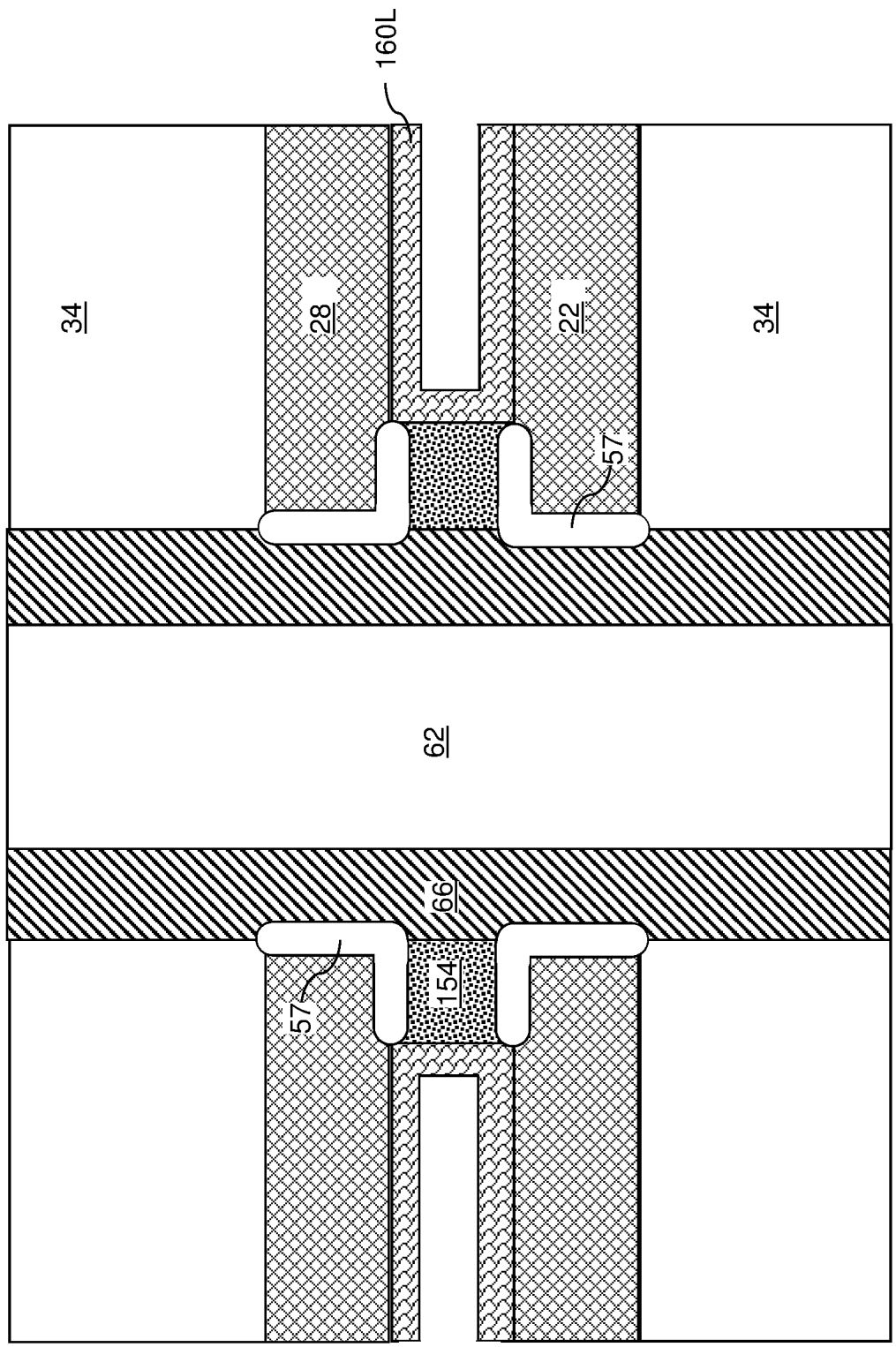
FIGS. 21D and 21E are sequential vertical cross-sectional view of a region in a memory opening in the sixth exemplary structure during formation of semiconductor channel layers according to the sixth embodiment of the present disclosure.

Referring to FIG. 21D, the processing steps of FIG. 19G can be performed to deposit a semiconductor channel layer 160L in the peripheral regions of the channel-level cavities 33 and over the physically exposed cylindrical surfaces of the memory material portions 154. The thickness of the continuous semiconductor channel layer 160L can be selected such that a gap remains between an upper horizontally-extending portion and a lower horizontally-extending portion of the continuous semiconductor channel layer 160L within each of the channel-level cavities 33. In one embodiment, the thickness of the continuous semiconductor channel layer 160L may be the in a range from 1 nm to 15 nm, such as from 3 nm to 10 nm, although lesser and greater thicknesses can also be employed. The semiconductor channel layer 160L is formed directly on physically exposed horizontal surfaces of the metallic source layers 22 and the metallic drain layers 28, physically exposed outer cylindrical surfaces of the memory material portions 154, and any physically exposed surface segments of semiconducting oxide spacers 57.

In one embodiment, each of the source-level material layers comprises, and/or consists of, a metallic source layer 22, and each of the drain-level material layers comprises, and/or consists of, a metallic drain layer 28. Each of the semiconductor channel layers 160L can be formed directly on a respective metallic source layer 22 and a respective metallic drain layer 28.

Figure 21E:
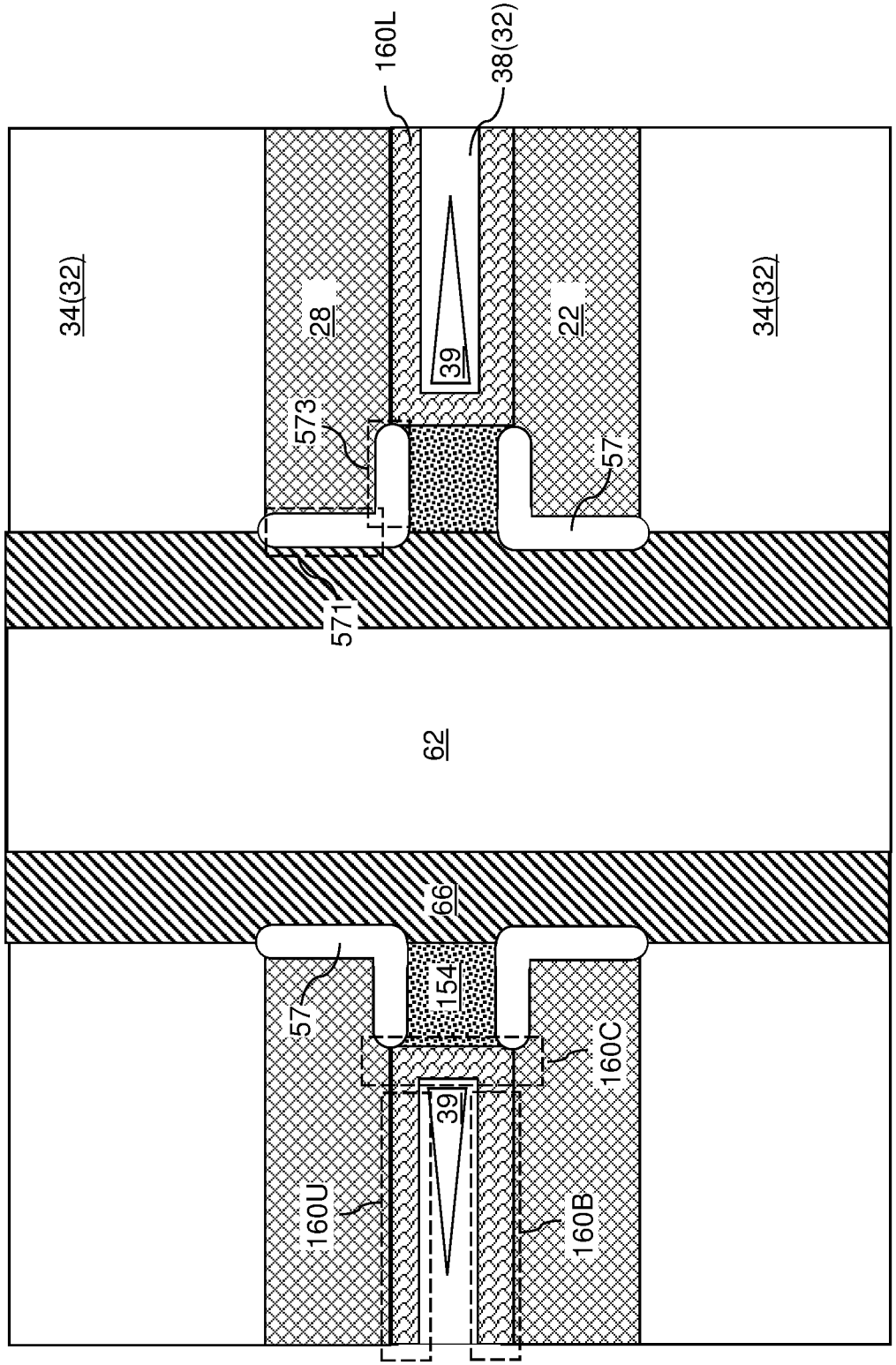

Referring to FIG. 21E, the processing steps of FIG. 19H can be performed to form channel-level insulating layers 38 in the channel-level cavities 33 with encapsulated cavities 39 (i.e., airgaps) therein.

Insulating layers (38, 34) are located between each vertically neighboring pair of a source layer (embodied as a metallic source layer 22) and drain layer (embodied as a metallic drain layer 28). The channel-level spacer layers 38 may, or may not, have a different material composition than the inter-transistor-level insulating layers 34. In one embodiment, each semiconductor channel layer 160L contacts, and embeds, a respective channel-level spacer layer 38 located between a respective vertically neighboring pair of a source layer (as embodied as a metallic source layer 22) and a drain layer (as embodied as a metallic drain layer 28). The insulating layers 32 are interlaced with the source layers and the drain layers of the alternating stack of source layers and drain layers. The insulating layers 32 comprise channel-level insulating layers (comprising channel-level spacer layers 38) in contact with a respective one of the semiconductor channel layers 160L, and inter-transistor-level insulating layers 34 located between vertically neighboring pairs of the channel-level insulating layers (comprising channel-level spacer layers 38) and not contacting any of the semiconductor channel layers 160L.

Semiconductor oxide spacers 57 laterally contact a respective one of the source layers (comprising the metallic source layers 22) and the drain layers (comprising the metallic drain layers 28). The semiconductor oxide spacers 57 contact a respective one of the semiconductor channel layers 160L. The first vertically extending segments 571 and the laterally extending portions 573 of the semiconductor oxide spacers 57 can be substantially free of electrical dopants, i.e., may contain electrical dopants of any conductivity type at an atomic concentration less than $1.0 \times 10^{16}/\text{cm}^3$, such as less than $1.0 \times 10^{13}/\text{cm}^3$. Each semiconductor channel layer 160L may comprise a plurality of cylindrical sidewalls that contact with outer cylindrical sidewalls of a plurality of memory material portions 154 located at a same level, i.e., at a same height from a top surface of the substrate 9.

A composite channel-level layer (38, 160L) can be formed at each level of the memory material portions 154. Each composite channel-level layer (38, 160L) comprises a semiconductor channel layer 160L including a cylindrical channel portion 160C, an upper horizontally-extending portion 160U adjoined to a top end of the cylindrical channel portion 160C, and a lower horizontally-extending portion 160B adjoined to a bottom end of the cylindrical channel portion 160C. Further, each composite channel-level layer (38, 160L) includes a channel-level insulating layer 38 laterally surrounding the cylindrical channel portion 160C and located between the upper horizontally-extending portion 160U and the lower horizontally extending portion 160B of the semiconductor channel layer 160L.

Any residual portion of the semiconductor channel layers 160L, if present at this processing step, can be removed by performing an etch back process, which may employ an anisotropic etch process and/or an isotropic etch process. Subsequently, the processing steps of FIGS. 11 and 12A-12C can be performed to complete manufacture of the sixth exemplary structure.

Figure 22A:
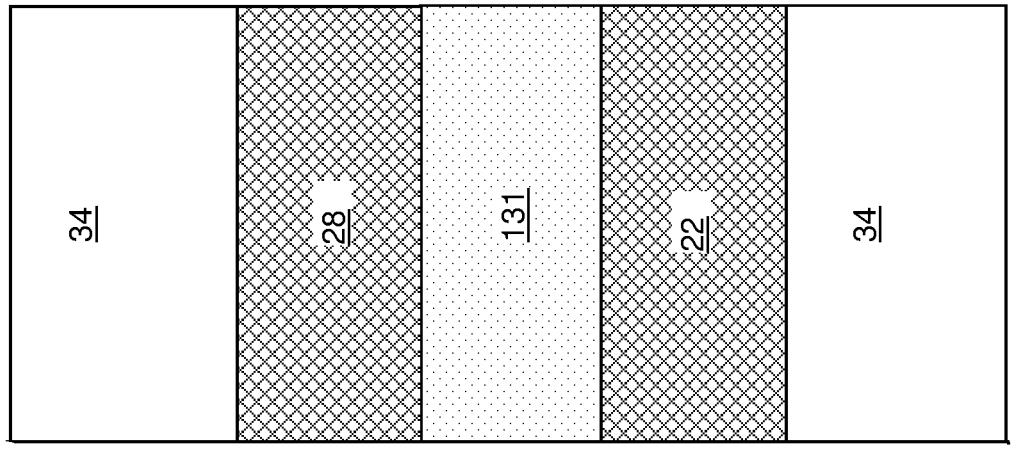
FIGS. 22A-22F are sequential vertical cross-sectional view of a region in a memory opening in a seventh exemplary structure during formation of a memory opening fill structure according to a seventh embodiment of the present disclosure.
Figure 22A:
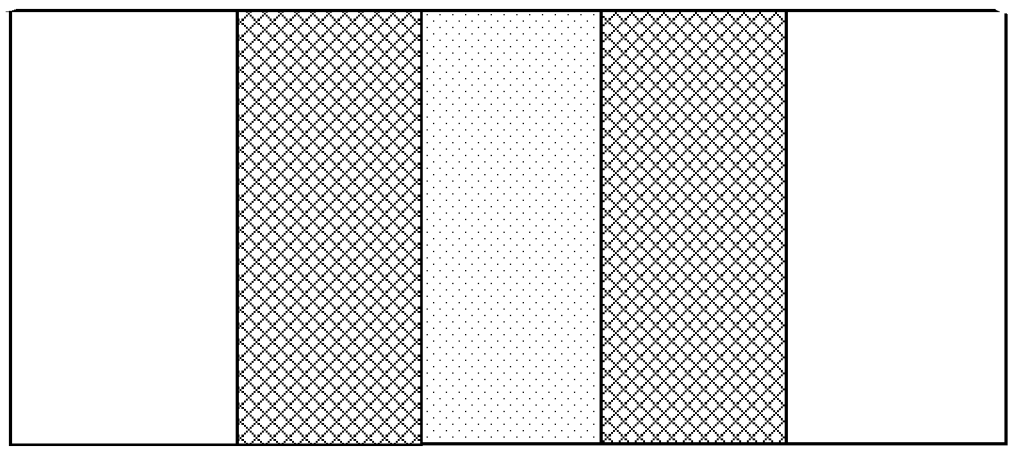

Referring to FIG. 22A, a memory opening 49 in a seventh exemplary structure is illustrated at a processing step corresponding to the processing steps FIGS. 3A and 3B. The seventh exemplary structure at the processing steps of FIG. 22A may be derived from the first exemplary structure at the processing steps of FIGS. 3A and 3B by employing a unit layer stack (22, 131, 28, 34) including, from bottom to top or from top to bottom, a metallic source layer 22 a sacrificial channel-level spacer layer 131, a metallic drain layer 28, and an inter-transistor-level insulating layer 34. Each layer within the unit layer stack (22, 131, 28, 34) of the seventh exemplary structure may have the same material composition and the same thickness range as in the previously described embodiments. Further, the metallic source layers 22 and the metallic drain layers 28 of the seventh exemplary structure may be deposited as blanket material layers, i.e., as a single continuous material layer located between a respective first horizontal plane including a bottom surface of the deposited material layer and a respective second horizontal plane including a top surface of the deposited material layer.

As such, the metallic source layers 22 and the metallic drain layers 28 may be free of any seam, and may be deposited by any conformal or non-conformal deposition processes. In an illustrative example, the metallic source layers 22 and the metallic drain layers 28 of the seventh exemplary structure may include one or more of TiN, TaN, WN, TiC, TaC, WC, Cu, Co, Mo, Ti, Ta, W, Ru, an intermetallic alloy, and a metal-semiconductor alloy (such as a metal silicide).

Generally, a vertical repetition of unit layer stacks (22, 131, 28, 34) can be formed over a substrate. Each of the unit layer stacks (22, 131, 28, 34) comprises a source-level material layer (which may include a metallic source layer 22), a sacrificial channel-level spacer layer 131, a drain-level material layer (which may include a metallic drain layer 28), and an inter-transistor-level insulating layer 34.

Each sacrificial channel-level spacer layer 131 includes a sacrificial material that is different from the materials of the source-level material layer (as embodied as the metallic source layer 22), the drain-level material layer (as embodied as the metallic drain layer 28), and the inter-transistor-level insulating layer 34. In an illustrative example, the sacrificial channel-level spacer layer 131 may include a germanium-containing material (such as a silicon-germanium alloy) including germanium at an atomic percentage in a range from 15% to 100%, amorphous carbon, diamond-like carbon, porous or non-porous organosilicate glass, a silicon-containing polymer material, or a carbon-based polymer material. The sacrificial channel-level spacer layers 131 may be deposited by chemical vapor deposition, physical vapor deposition, spin coating. The thickness of each sacrificial channel-level spacer layer 131 can be in a range from 20 nm to 80 nm, although lesser and greater thicknesses can also be employed.

Generally, the source-level material layers are formed as source layers comprising at least one source-side conductive material, and the drain-level material layers are formed as drain layers comprising at least one drain-side conductive material. In the case of the seventh exemplary structure, each source-level material layer can be formed as a metallic source layer 22 including a source-side conductive material (which is a source-side metallic material). Each drain-level material layer can be formed as a metallic drain layer 28 including a drain-side conductive material (which is a drain-side metallic material).

Figure 22B:
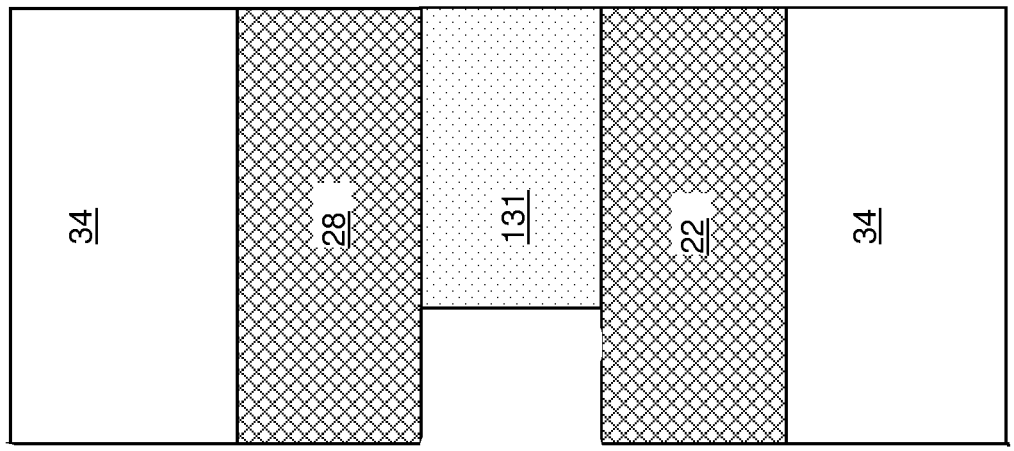
Figure 22B:
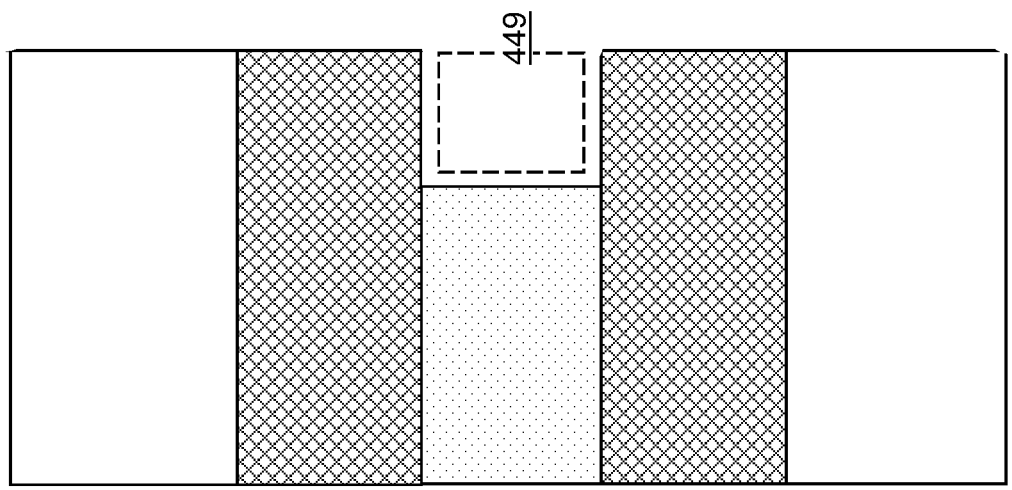

Referring to FIG. 22B, a vertical stack of annular recess cavities 449 can be formed around each of the memory openings 49 by laterally recessing the sacrificial channel-level spacer layers 131 relative to the source-level material layers (comprising the metallic source layers 22), the drain-level material layers (comprising the metallic drain layers 28), and the inter-transistor-level insulating layers 34. The lateral recess distance of each annular recess cavity 449 may be in a range from 10 nm to 100 nm, such as from 20 nm to 50 nm, although lesser and greater lateral recess distances may also be employed. Generally, memory openings 49 can vertically extend through the vertical repetition of multiple instances of the unit layer stack (22, 131, 28, 34).

Figure 22C:
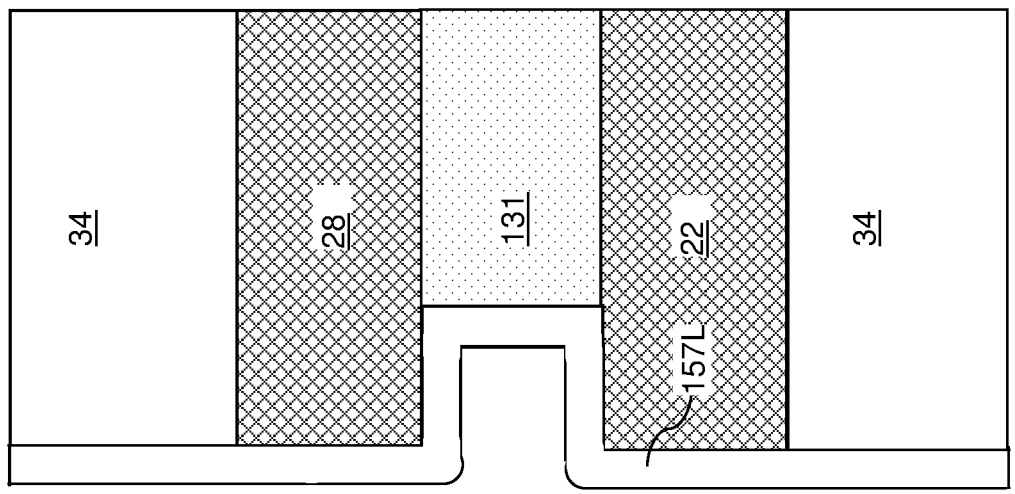
Figure 22C:
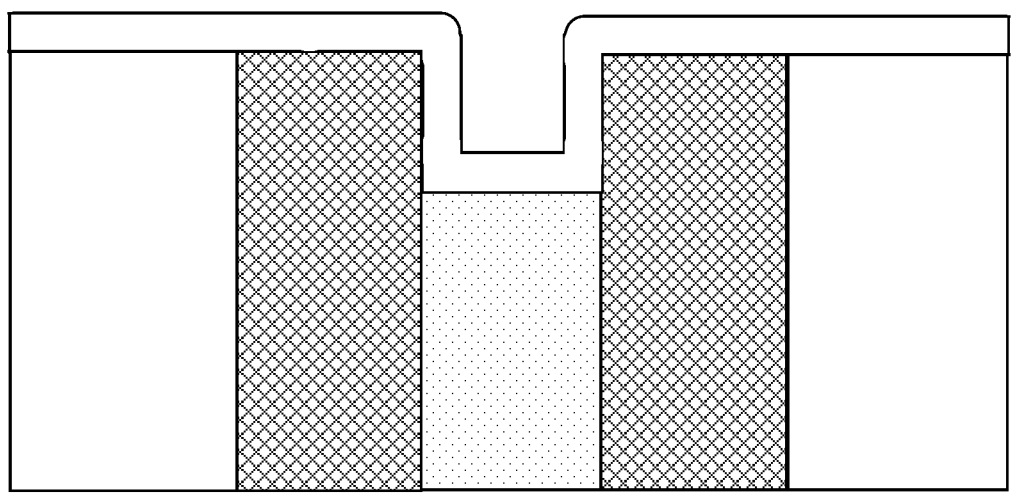

Referring to FIG. 22C, a continuous semiconductor oxide spacer 157L vertically extending through the vertical repetition of the unit layer stacks (22, 131, 28, 34) can be formed around the periphery of the memory opening 49 by a conformal deposition process such as a chemical vapor deposition process. The thickness of the continuous semiconductor oxide layer 157L may be in a range from 3 nm to 12 nm, such as from 4 nm to 8 nm, although lesser and greater thicknesses can also be employed.

Figure 22D:
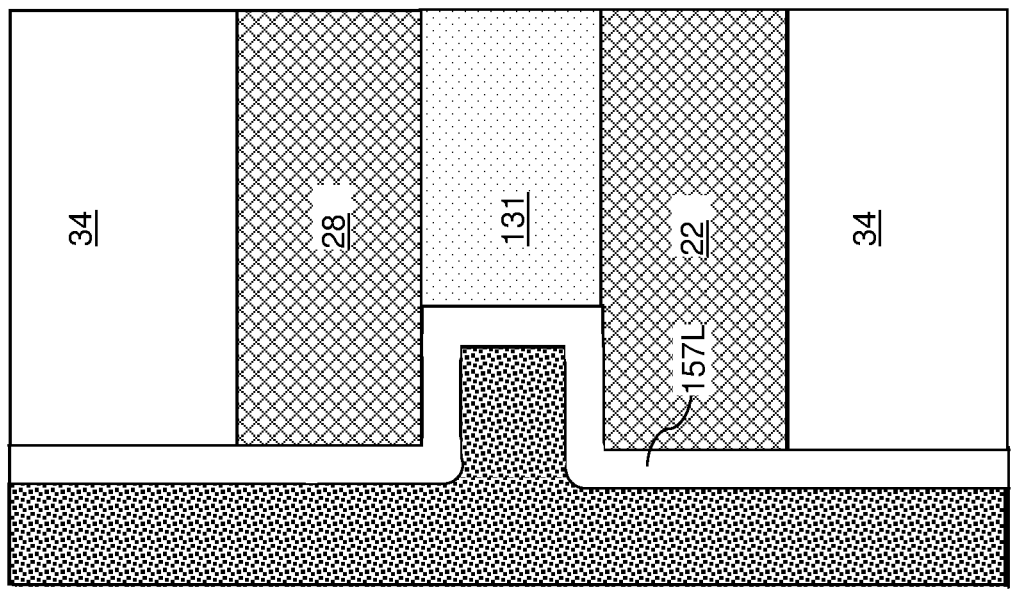
Figure 22D:
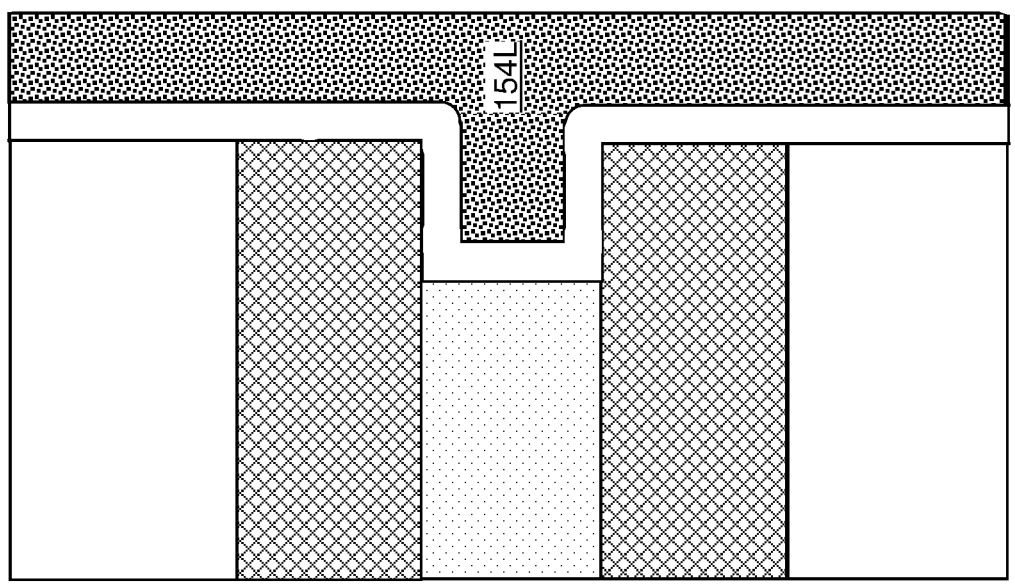

Referring to FIG. 22D, a memory material layer 154L can be deposited at a peripheral portion of each memory opening 49. The memory material layer 154L includes a material that can form a memory element when divided into discrete material portions. In one embodiment, the memory material layer 154L includes a ferroelectric material. In one embodiment, the memory material layer 154L may include the ferroelectric non-centrosymmetric orthorhombic phase of doped or undoped hafnium oxide layer. The doped hafnium oxide may include at least one dopant selected from Al, Zr, Si, Y, Gd, La, etc. Other suitable ferroelectric materials may also be used, as such as titanate ferroelectric materials (e.g., barium titanate, lead titanate, lead zirconate titanate, lead lanthanum zirconate titanate ("PLZT"), etc.). In one embodiment, the memory material layer 154L may consist essentially of $Hf_xZr_{1-x}O_2$, which is described above. In another embodiment, the memory material layer 154L may comprise a ferroelectric semiconductor material, such as a Wurtzite phase Group III-nitride semiconductor material doped with a rare earth element, such as scandium or yttrium doped aluminum nitride or gallium nitride (e.g., $Al_{1-x}Sc_xN$, where $0.27 \leq x \leq 0.43$), or magnesium and niobium doped aluminum nitride. Alternatively, the memory material layer 154L may include a charge trapping material such as silicon nitride. In another embodiment, the memory material layer 154L includes a conductive floating gate material such as a metallic material or a heavily doped semiconductor material. The thickness of the memory material layer 154L can be selected such that the entirety of each remaining volume of the annular recess cavities 449 can be filled with the continuous semiconductor oxide layer 157L and the memory material layer 54L. For example, the thickness of the memory material layer 154L, as measured laterally from a vertical sidewall of an inner sidewall of the continuous semiconductor oxide layer 157L may be in a range from 10 nm to 40 nm, such as from 15 nm to 30 nm, although lesser and greater thicknesses may also be employed.

Figure 22E:
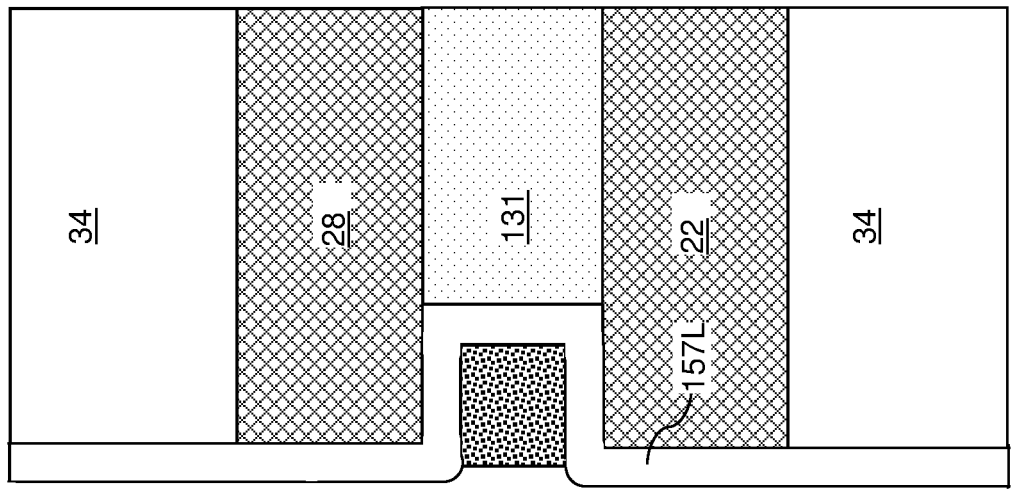
Figure 22E:
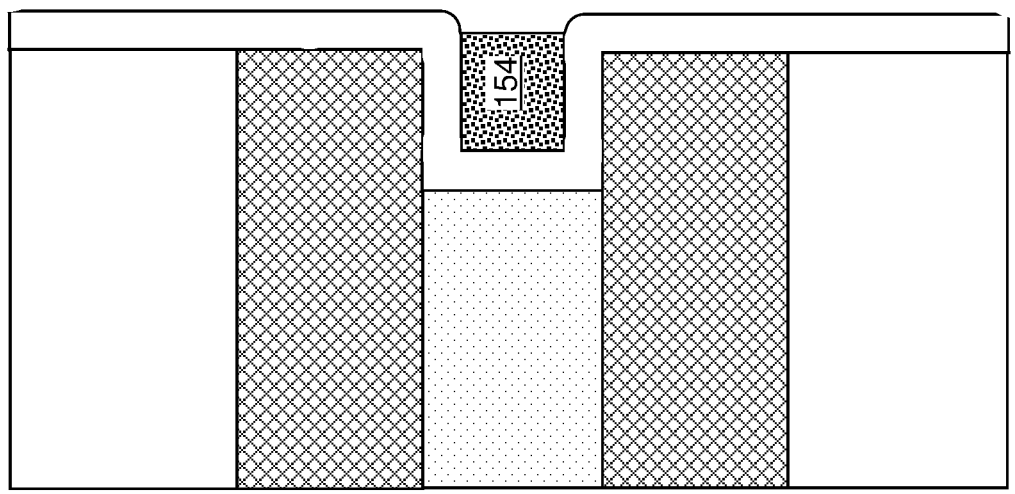

Referring to FIG. 22E, an etch process can be performed to remove portions of the memory material layer 154L that are located outside the annulare recess cavities 449. The etch process may include an isotropic etch process (such as a wet etch process or a chemical dry etch), and/or may include an anisotropic etch process. A wet etch process and/or a reactive ion etch process can be employed to remove portions of the memory material layer 154L that are located outside the annulare recess cavities 449. Generally, the etch chemistry of the etch process can be selected depending on the material of the memory material layer 154L. Each remaining portion of the memory material layer 154L that remains in the annulare recess cavities 449 comprises a memory material portion 154.

A vertical stack of discrete, vertically separated memory material portions 154 can be formed in each annulare recess cavity 449. Each memory material portion 154 can be located in a respective one of the annulare recess cavities 449. In one embodiment, the memory material portions 154 comprise ferroelectric material portions. In one embodiment, the memory material portions 154 comprise charge trapping material portions. In another embodiment, the memory material portions 154 comprise floating gate structures.

Figure 22F:
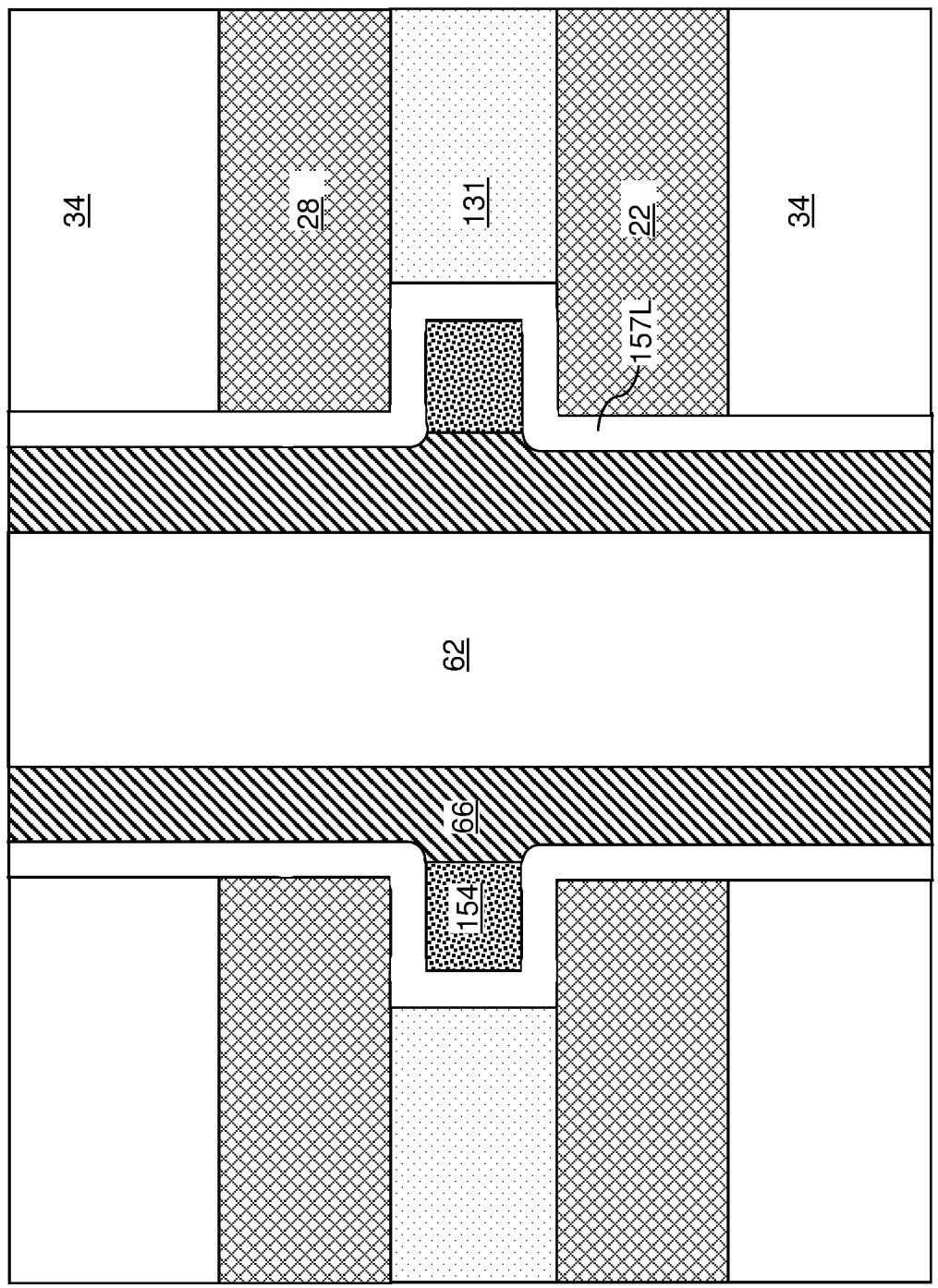

Referring to FIG. 22F, the processing steps of FIG. 19E can be performed to form a vertical word line 66 and a dielectric core 62 with a remaining volume of each memory opening 49.

Figure 22G:
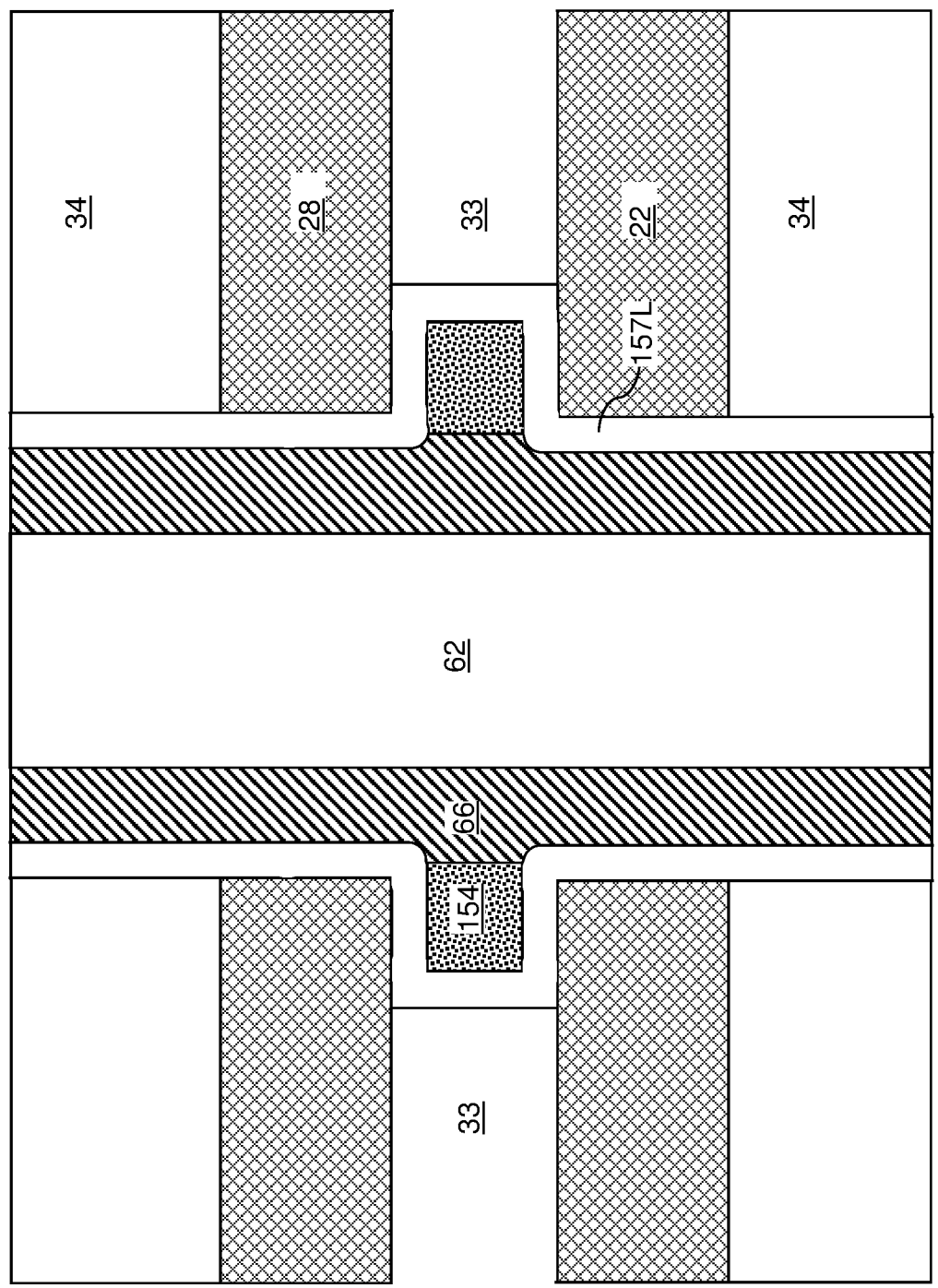
FIGS. 22G-22J are sequential vertical cross-sectional view of a region in a memory opening in the seventh exemplary structure during formation of semiconductor channel layers according to the seventh embodiment of the present disclosure.
Figure 22H:
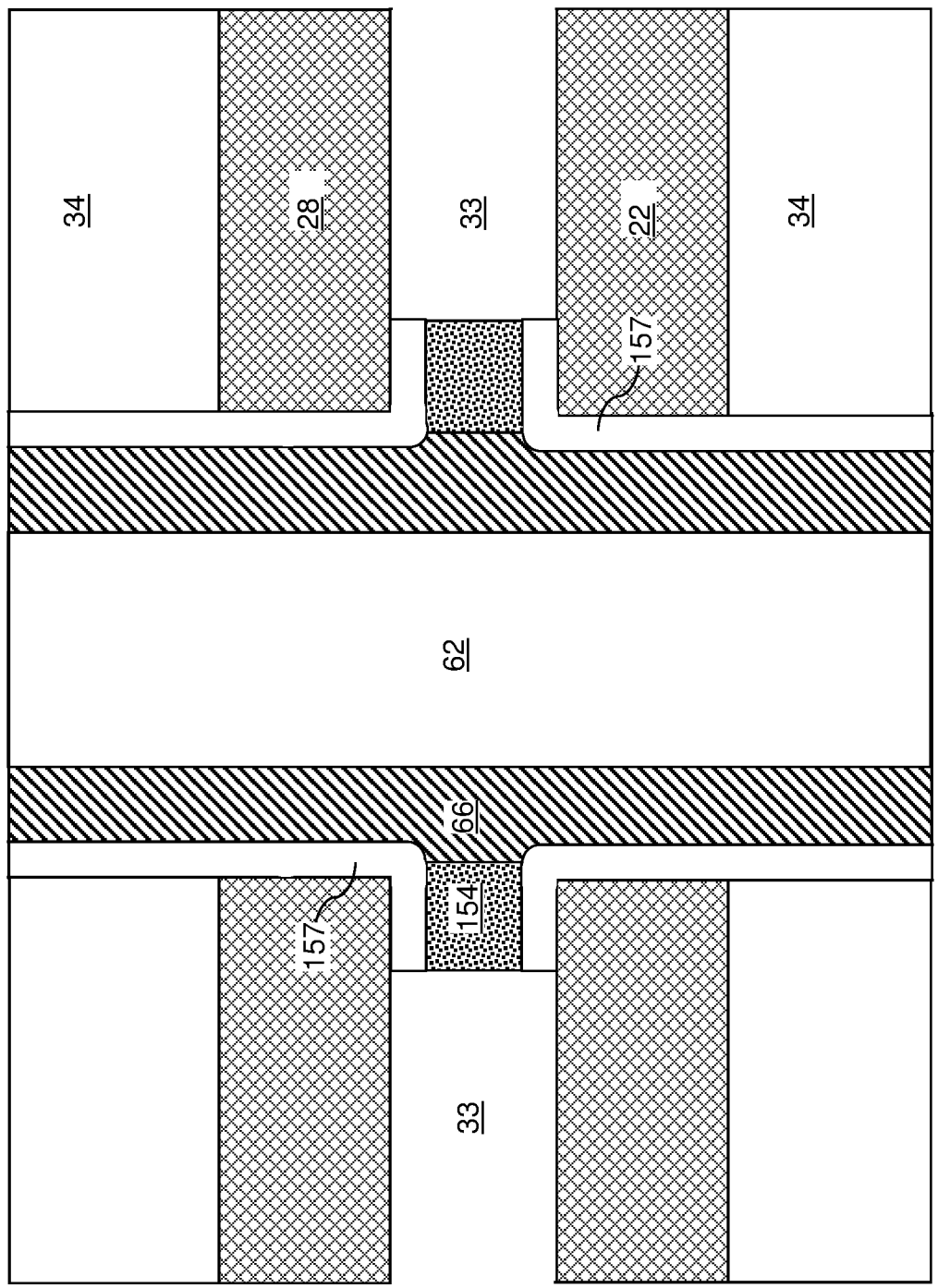

Referring to FIG. 22G, the processing steps of FIGS. 7 and 8 may be subsequently performed to form contact pad structures 68 and backside trenches 79. Subsequently, the processing steps of FIG. 21C can be performed to form channel-level cavities 33. Specifically, an isotropic etchant is introduced into the backside trenches 79 in an isotropic etch process. The isotropic etchant has an etch chemistry that etches the material of the sacrificial channel-level spacer layers 131 selective the materials of the metallic source layers 22, the metallic drain layers 28, and the inter-transistor-level insulating layers 34. In one embodiment, the etch rate of the material of the sacrificial channel-level spacer layers 131 in the isotropic etchant may be at least 10 times, such as at least 100 times, the collateral etch rates of the metallic source layers 22, the metallic drain layers 28, and the inter-transistor-level insulating layers 34. In an illustrative example, if the sacrificial channel-level spacer layers 131 include a silicon-germanium alloy, a wet etch process employing a mixture of hydrogen peroxide and dilute hydrofluoric acid may be employed. If the sacrificial channel-level spacer layers 131 include organosilicate glass or borosilicate glass, a wet etch process employing dilute hydrofluoric acid may be employed. Alternatively, if the sacrificial channel-level spacer layers 131 include a carbon-based material or a thermally-decomposable silicon-based polymer, an ashing process may be performed to remove the sacrificial channel-level spacer layers 131 selective to the metallic source layers 22, the metallic drain layers 28, and the inter-transistor-level insulating layers 34. Generally, sacrificial channel-level spacer layers 131 are removed selective to the metallic source layers 22, the metallic drain layers 28, and the inter-transistor-level insulating layers 34, i.e., without removing, or with minimal collateral removal of, the metallic source layers 22, the metallic drain layers 28, and the inter-transistor-level insulating layers 34. Channel-level cavities 33 are formed in volumes from which the material of the sacrificial channel-level spacer layers 131 is removed.

The isotropic etch process may, or may not, collaterally etch physically exposed outer cylindrical portions of the continuous semiconductor oxide layer 157L located outside the memory material portions 154. In case the physically exposed outer cylindrical portions of the continuous semiconductor oxide layer 157L are not fully etched by the isotropic etch process, an additional isotropic etch process may be employed to fully remove the physically exposed outer cylindrical portions of the continuous semiconductor oxide layer 157L. For example, a wet etch process employing dilute hydrofluoric acid may be employed to remove the physically exposed outer cylindrical portions of the continuous semiconductor oxide layer 157L. Outer cylindrical surfaces of the memory material portions 154 are physically exposed. Further, the continuous semiconductor oxide layer 157L is divided at each level of the memory material portions 154. Generally, portions of the continuous semiconductor oxide spacer 157L can be removed at each level of the memory material portions 154 after removal of the sacrificial channel-level spacers 131. Remaining portions of the continuous semiconductor oxide spacer 157L comprise a vertical stack of semiconductor oxide spacers 157 that are vertically spaced apart at the levels of the memory material portions 154.

Figure 22I:
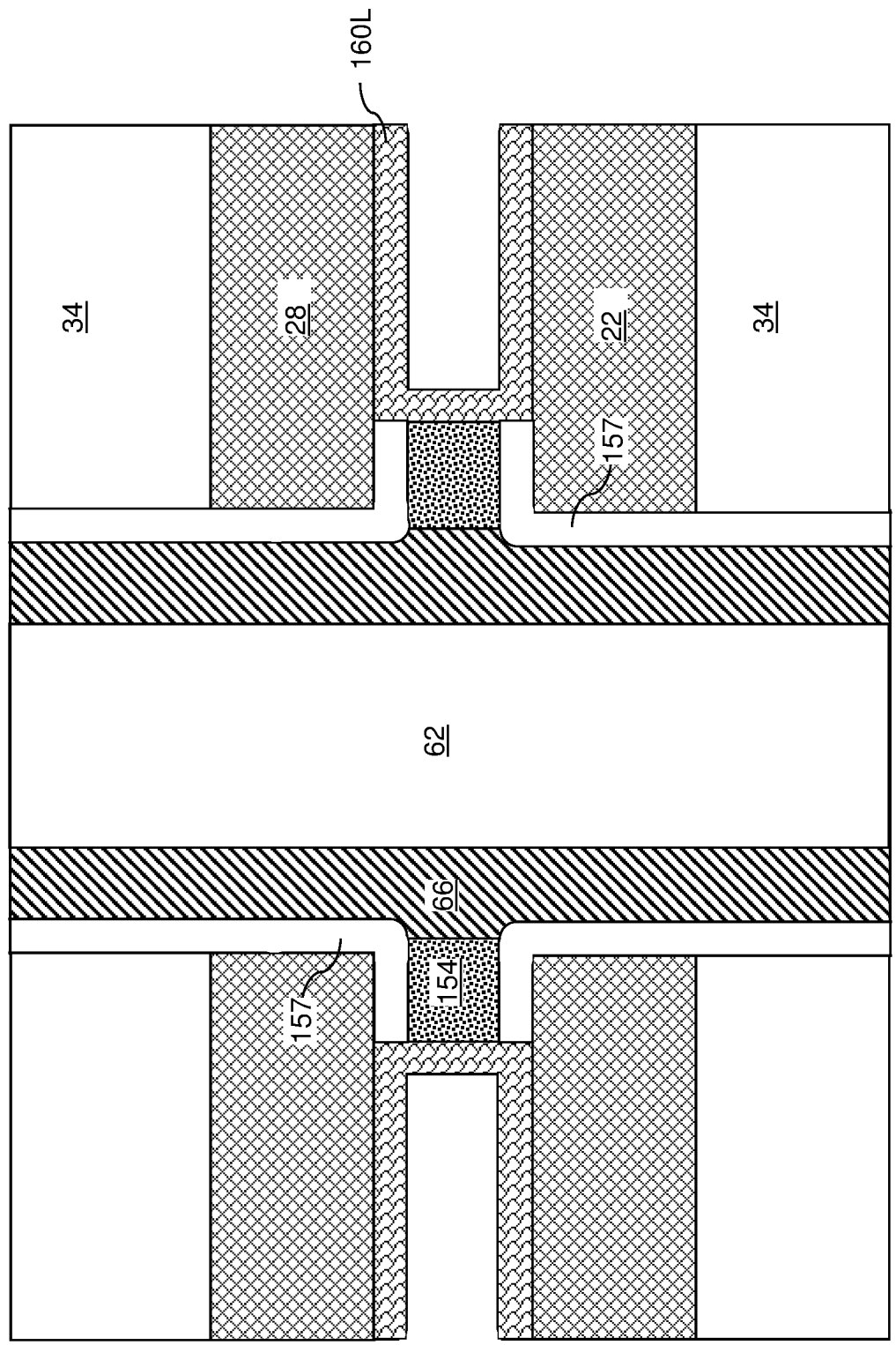

Referring to FIG. 22I, the processing steps of FIG. 19G can be performed to deposit a semiconductor channel layer 160L in the peripheral regions of the channel-level cavities 33 and over the physically exposed cylindrical surfaces of the memory material portions 154. The thickness of the continuous semiconductor channel layer 160L can be selected such that a gap remains between an upper horizontally-extending portion and a lower horizontally-extending portion of the continuous semiconductor channel layer 160L within each of the channel-level cavities 33. In one embodiment, the thickness of the continuous semiconductor channel layer 160L may be the in a range from 1 nm to 15 nm, such as from 3 nm to 10 nm, although lesser and greater thicknesses can also be employed. The semiconductor channel layer 160L is formed directly on physically exposed horizontal surfaces of the metallic source layers 22 and the metallic drain layers 28, physically exposed outer cylindrical surfaces of the memory material portions 154, and physically exposed surface segments of semiconducting oxide spacers 157.

In one embodiment, each of the source-level material layers comprises, and/or consists of, a metallic source layer 22, and each of the drain-level material layers comprises, and/or consists of, a metallic drain layer 28. Each of the semiconductor channel layers 160L can be formed directly on a respective metallic source layer 22 and a respective metallic drain layer 28.

Figure 22J:
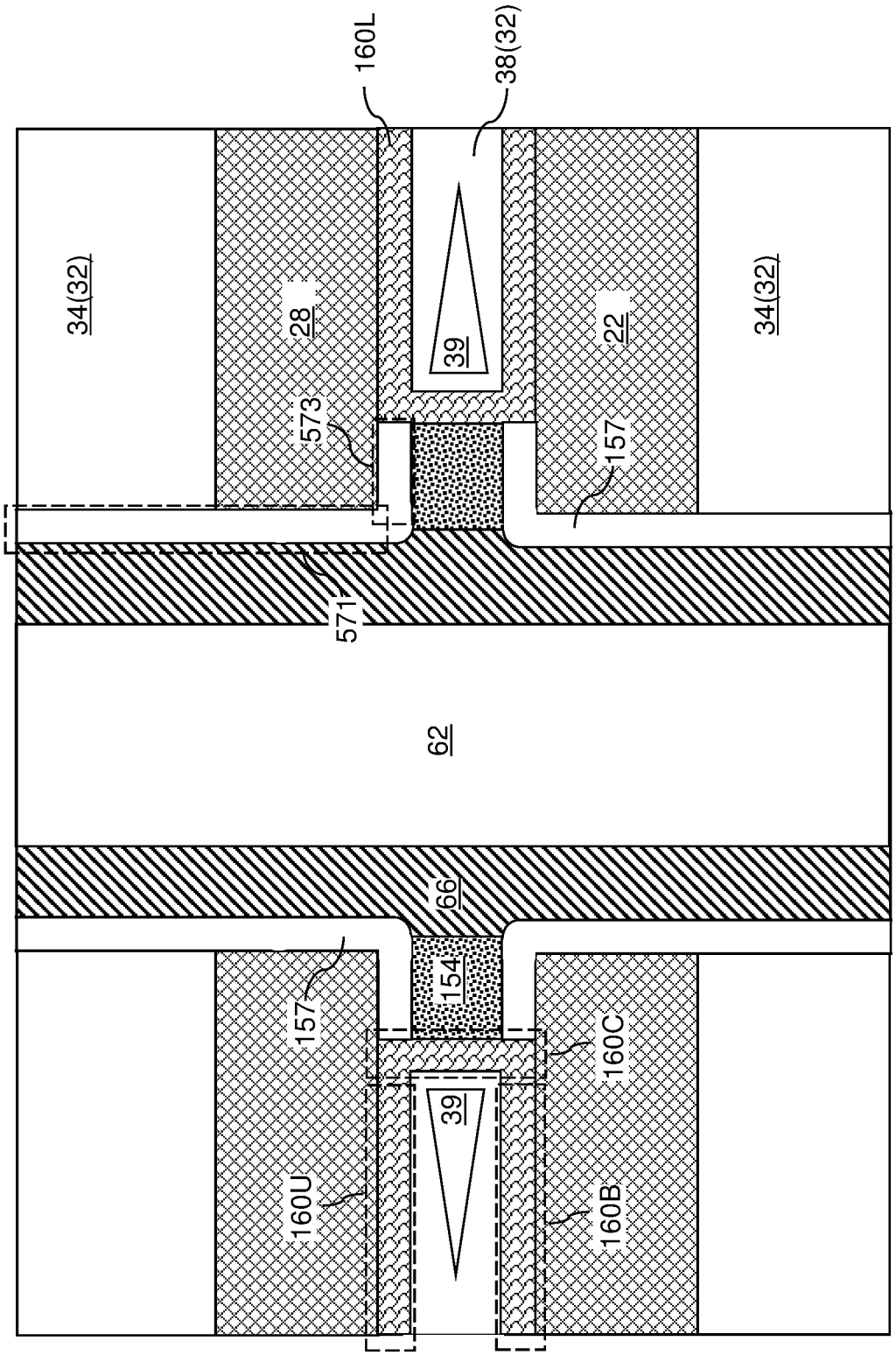

Referring to FIG. 22J, the processing steps of FIG. 19H can be performed to form channel-level insulating layers 38 in the channel-level cavities 33 with encapsulated cavities 39 (i.e., airgaps) therein.

Insulating layers (38, 34) are located between each vertically neighboring pair of a source layer (embodied as a metallic source layer 22) and drain layer (embodied as a metallic drain layer 28). The channel-level spacer layers 38 may, or may not, have a different material composition than the inter-transistor-level insulating layers 34. In one embodiment, each semiconductor channel layer 160L contacts and embeds a respective channel-level spacer layer 38 located between a respective vertically neighboring pair of a source layer (as embodied as a metallic source layer 22) and a drain layer (as embodied as a metallic drain layer 28). The insulating layers 32 are interlaced with the source layers and the drain layers of the alternating stack of source layers and drain layers. The insulating layers 32 comprise channel-level insulating layers (comprising channel-level spacer layers 38) in contact with a respective one of the semiconductor channel layers 160L, and inter-transistor-level insulating layers 34 located between vertically neighboring pairs of the channel-level insulating layers (comprising channel-level spacer layers 38) and not contacting any of the semiconductor channel layers 160L.

Semiconductor oxide spacers 157 laterally contact a respective one of the source layers (as embodied as metallic source layers 22) and the drain layers (as embodied as metallic drain layers 28). The semiconductor oxide spacers 157 contact a respective one of the semiconductor channel layers 160L. Each semiconductor channel layer 160L may comprise a plurality of cylindrical sidewalls that contact with outer cylindrical sidewalls of a plurality of memory material portions 154 located at a same level, i.e., at a same height from a top surface of the substrate 9.

A composite channel-level layer (38, 160L) can be formed at each level of the memory material portions 154. Each composite channel-level layer (38, 160L) comprises a semiconductor channel layer 160L including a cylindrical channel portion 160C, an upper horizontally-extending portion 160U adjoined to a top end of the cylindrical channel portion 160C, and a lower horizontally-extending portion 160B adjoined to a bottom end of the cylindrical channel portion 160C. Further, each composite channel-level layer (38, 160L) includes a channel-level insulating layer 38 laterally surrounding the cylindrical channel portion 160C and located between the upper horizontally-extending portion 160U and the lower horizontally extending portion 160B of the semiconductor channel layer 160L.

Any residual portion of the semiconductor channel layers 160L, the metallic source layers 22, and the metallic drain layers 28, if present at this processing step, can be removed by performing an etch back process, which may employ an anisotropic etch process and/or an isotropic etch process. Subsequently, the processing steps of FIGS. 11 and 12A-12C can be performed to complete manufacture of the seventh exemplary structure.

Referring collectively to FIGS. 19A-22J and all other related drawings and according to various aspects of the present disclosure, a three-dimensional memory device comprises an alternating stack of source layers (22 and optionally 24), and drain layers (28 and optionally 26), located over a substrate 9, a memory opening 49 vertically extending through the alternating stack, a vertical word line 66 located in the memory opening and vertically extending through each of the source layers and the drain layers of the alternating stack, discrete semiconductor channels (60, 160L) contacting horizontal surfaces of a respective vertically neighboring pair of a source layer of the source layers and a drain layer of the drain layers, and a vertical stack of discrete memory material portions (54, 154) laterally surrounding the vertical word line 66.

In one embodiment, the memory material portions 154 comprise ferroelectric material portions. In one embodiment, the memory material portions 154 contact an outer sidewall of the vertical word line 66. In an alternative embodiment, the memory material portions 154 comprise charge storage material portions or floating gates.

In one embodiment, each of the discrete semiconductor channels (60, 160L) comprises a semiconductor channel layer 160L including a cylindrical channel portion 160C, an upper horizontally-extending portion 160U adjoined to a top end of the cylindrical channel portion 160C, and a lower horizontally-extending portion 160B adjoined to a bottom end of the cylindrical channel portion 160C. In one embodiment, each cylindrical channel portion 160C of the semiconductor channel layers 160L contacts an outer sidewall of a respective one of the memory material portions 154.

In one embodiment, the memory device comprises semiconductor oxide spacers (57 or 157) laterally surrounding, and contacting, the vertical word line 66, wherein each of the semiconductor oxide spacers (57 or 157) contacts one the memory material portions 154, one of the insulating layers (such as the inter-transistor-level insulating layers 34), and at least one of the source layers (22 and optionally 24) and the drain layers (28 and optionally 26).

In one embodiment, each of the semiconductor oxide spacers (57 or 157) comprises: a vertically extending segment 571 (which is also referred to as a tubular portion) laterally surrounding the vertical word line 66; and a laterally-extending portion 573 (which is also referred to as a flange portion) adjoined a top end or a bottom end of the vertically-extending segment 571 and comprising an annular horizontal surface that contacts a respective one of the memory material portions 154.

In one embodiment, each of the memory material portions 154 comprises: an inner cylindrical sidewall contacting the vertical word line 66; an outer cylindrical sidewall contacting a respective cylindrical channel portion 160C of the semiconductor channel layers 160L; an upper annular surface contacting a bottom surface of an overlying one of the semiconductor oxide spacers (57 or 157); and a lower annular surface contacting a top surface of an underlying one of the semiconductor oxide spacers (57 or 157).

In one embodiment, memory device comprises a channel-level insulating layer 38 laterally surrounding the cylindrical channel portion 160C and located between the upper horizontally-extending portion 160U and the lower horizontally extending portion 160L of the semiconductor channel layer 160L, and encapsulating an airgap 39.

In one embodiment, the source layer comprises a vertical stack of a doped semiconductor source layer 24 and a metallic source layer 22; and the drain layer comprises a vertical stack of a doped semiconductor drain layer 26 and a metallic drain layer 28. In one embodiment, the semiconductor channel layers 160L comprise a semiconductor material having a doping of a first conductivity type; and the doped semiconductor source layers 24 and the doped semiconductor drain layers 26 comprise a respective semiconductor material having a doping of a second conductivity type that is an opposite of the first conductivity type, wherein: an entirety of a top surface of each semiconductor channel layer 160L contacts a bottom surface of a respective one of the doped semiconductor source layers 24 and the doped semiconductor drain layers 26; and an entirety of a bottom surface of each semiconductor channel layer 160L contacts a top surface of a respective one of the doped semiconductor source layers 24 and the doped semiconductor drain layers 26.

In one embodiment, each source layer consists of a metallic source layer 22; and each drain layer consists of a metallic drain layer 28. In one embodiment, an entirety of a top surface of each semiconductor channel layer 160L contacts a bottom surface of a respective one of the metallic source layers 22 and the metallic drain layers 28; and an entirety of a bottom surface of each semiconductor channel layer 160L contacts a top surface of a respective one of the metallic source layers 22 and the metallic drain layers 28.

In one embodiment, the discrete semiconductor channels comprise polysilicon, indium gallium zinc oxide, germanium, silicon germanium, or a two-dimensional semiconductor material layer. The two-dimensional semiconductor material layer has a band gap of at least 1.1 eV and at least one of a thickness of 1 to 5 monolayers of atoms of the semiconductor material or includes a two-dimensional charge carrier gas layer. The two-dimensional semiconductor material layer may comprise fluorinated graphene, hexagonal boron nitride, molybdenum disulfide, or germanane.

In one embodiment, the memory device further comprises: additional memory openings 49 vertically extending through the vertical repetition (22, optionally 24, 38, optionally 26, 28, 34), wherein each of the semiconductor channel layers 160L comprises additional cylindrical channel portions 160C that laterally surround a respective one of the additional memory openings 49; additional vertical word lines 66 located in the additional memory openings 49 and vertically extending through each of the unit layers stacks within the vertical repetition (22, optionally 24, 38, optionally 26, 28, 34); and additional vertical stacks of memory material portions 154 laterally surrounding a respective one of the vertical word line 66, wherein the memory device comprises a three-dimensional array of memory elements comprising the vertical stack of memory material portions 154 and the additional vertical stacks of memory material portions 154.

The various embodiments of the present disclosure can be employed to provide a three-dimensional memory device in which the vertical dimension of the semiconductor channels are scaled with the vertical dimension of the memory material portions 154 to provide a high-density three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of source layers and drain layers located over a substrate;
   a memory opening vertically extending through the alternating stack;
   a vertical word line located in the memory opening and vertically extending through each of the source layers and the drain layers of the alternating stack;
   discrete semiconductor channels contacting horizontal surfaces of a respective vertically neighboring pair of a source layer of the source layers and a drain layer of the drain layers; and
   a vertical stack of discrete memory material portions laterally surrounding the vertical word line;
   wherein each of the discrete semiconductor channels comprises a semiconductor channel layer including a cylindrical channel portion, an upper horizontally-extending portion adjoined to a top end of the cylindrical channel portion, and a lower horizontally-extending portion adjoined to a bottom end of the cylindrical channel portion.

2. The three-dimensional memory device of claim 1, wherein each cylindrical channel portion of the semiconductor channel layers contacts an outer sidewall of a respective one of the memory material portions.

3. The three-dimensional memory device of claim 1, further comprising semiconductor oxide spacers laterally surrounding and contacting the vertical word line, wherein each of the semiconductor oxide spacers contacts one the memory material portions, one of the insulating layers, and at least one of the source layers and the drain layers.

4. The three-dimensional memory device of claim 3, wherein each of the semiconductor oxide spacers comprises:
   a vertically-extending segment laterally surrounding the vertical word line; and
   a laterally-extending portion adjoined a top end or a bottom end of the vertically-extending segment and comprising an annular horizontal surface that contacts a respective one of the memory material portions.

5. The three-dimensional memory device of claim 3, wherein each of the memory material portions comprises:
   an inner cylindrical sidewall contacting the vertical word line;
   an outer cylindrical sidewall contacting a respective cylindrical channel portion of the semiconductor channel layers;
   an upper annular surface contacting a bottom surface of an overlying one of the semiconductor oxide spacers; and
   a lower annular surface contacting a top surface of an underlying one of the semiconductor oxide spacers.

6. The three-dimensional memory device of claim 1, further comprising a channel-level insulating layer laterally surrounding the cylindrical channel portion and located between the upper horizontally-extending portion and the lower horizontally extending portion of the semiconductor channel layer, and encapsulating an airgap.

* * * * *